(12) United States Patent
Koyama et al.

(10) Patent No.: US 8,730,730 B2
(45) Date of Patent: May 20, 2014

(54) TEMPORARY STORAGE CIRCUIT, STORAGE DEVICE, AND SIGNAL PROCESSING CIRCUIT

(75) Inventors: Jun Koyama, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 101 days.

(21) Appl. No.: 13/356,726

(22) Filed: Jan. 24, 2012

(65) Prior Publication Data

US 2012/0188815 A1    Jul. 26, 2012

(30) Foreign Application Priority Data

Jan. 26, 2011 (JP) ................. 2011-014026

(51) Int. Cl.
*G11C 16/04* (2006.01)
(52) U.S. Cl.
USPC .............. 365/185.12; 365/189.05; 365/154; 365/185.03
(58) Field of Classification Search
USPC .......... 365/189.05, 194, 154, 185.12, 185.03
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,127,702 A | 10/2000 | Yamazaki et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,009,878 B2 * | 3/2006 | Hosono et al. ........... | 365/185.03 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Toshio Kamiya et al.; "Carrier Transport Properties and Electronic Structures of Amorphous Oxide Semiconductors: The Present Status"; Solid State Physics; Sep. 1, 2009; pp. 621-633, Agne Gijutsu Center; vol. 44, No. 9 (with English translation).

(Continued)

*Primary Examiner* — David Lam
(74) *Attorney, Agent, or Firm* — Fish & Richardson P.C.

(57) ABSTRACT

A temporary storage circuit including a reduced number of transistors is provided. The temporary storage circuit includes storage elements, each of which includes a first transistor and a second transistor. A channel of the first transistor is formed in an oxide semiconductor layer. A signal potential corresponding to data is input to a gate of the second transistor through the first transistor which is turned on by a control signal input to a gate of the first transistor. Then, the first transistor is turned off by a control signal input to the gate of the first transistor, so that the signal potential is held in the gate of the second transistor. When one of a source and a drain of the second transistor is set to a first potential, the state between the source and the drain of the second transistor is detected, whereby the data is read out.

21 Claims, 18 Drawing Sheets

(56) References Cited

U.S. PATENT DOCUMENTS

| | | | |
|---|---|---|---|
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,081,522 B2* | 12/2011 | Murakami | 365/189.05 |
| 8,384,429 B2* | 2/2013 | Gammel et al. | 326/51 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0148171 A1 | 6/2010 | Hayashi et al. | |
| 2010/0195402 A1 | 8/2010 | Park | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2010-176831 A | 8/2010 |
| WO | 2004/114391 A1 | 12/2004 |

OTHER PUBLICATIONS

Sanghun Jeon et al.; "180nm Gate Length Amorphous InGaZnO Thin Film Transistor for High Density Image Sensor Applications"; IEDM 10: Technical Digest of International Electron Devices Meeting; Dec. 6, 2010; pp. 504-507.

Ihun Song et al.; "Short Channel Characteristics of Gallium—Indium—Zinc—Oxide Thin Film Transistors for Three-Dimensional Stacking Memory"; IEEE Electron Device Letters; Jun. 2008; pp. 549-552; vol. 29, No. 6.

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; pp. 1805-1810; vol. 51, No. 11.

Wonchan Kim et al.; "An Experimental High-Density DRAM Cell with a Built-in Gain Stage"; IEEE Journal of Solid-State Circuits; Aug. 1, 1994; pp. 978-981; vol. 29, No. 8.

Shoji Shukuri et al.; "A Complementary Gain Cell Technology for sub-1 V Supply DRAMs"; IEDM 92: Technical Digest of International Electron Devices Meeting; Dec. 13, 1992; pp. 1006-1008.

Shoji Shukuri et al.; "A Semi-Static Complementary Gain Cell Technology for Sub-1 V Supply DRAM's"; IEEE Transactions on Electron Devices; Jun. 1, 1994; vol. 41, No. 6; pp. 926-931.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26. pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

(56) References Cited

OTHER PUBLICATIONS

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MoO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel,YBFE2O4, and YB2FE3O7 Types of Structures for Compounds in the IN2O3 and Sc2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IgZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al. "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors." Jpn. J. Appl. Phys. (Japanese Journal of Applied Physics) , 2006, vol. 45, No. 5B, pp. 4303-4308.

(56) References Cited

OTHER PUBLICATIONS

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In–Ga—Zn—Oxide TFTS with a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park. J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

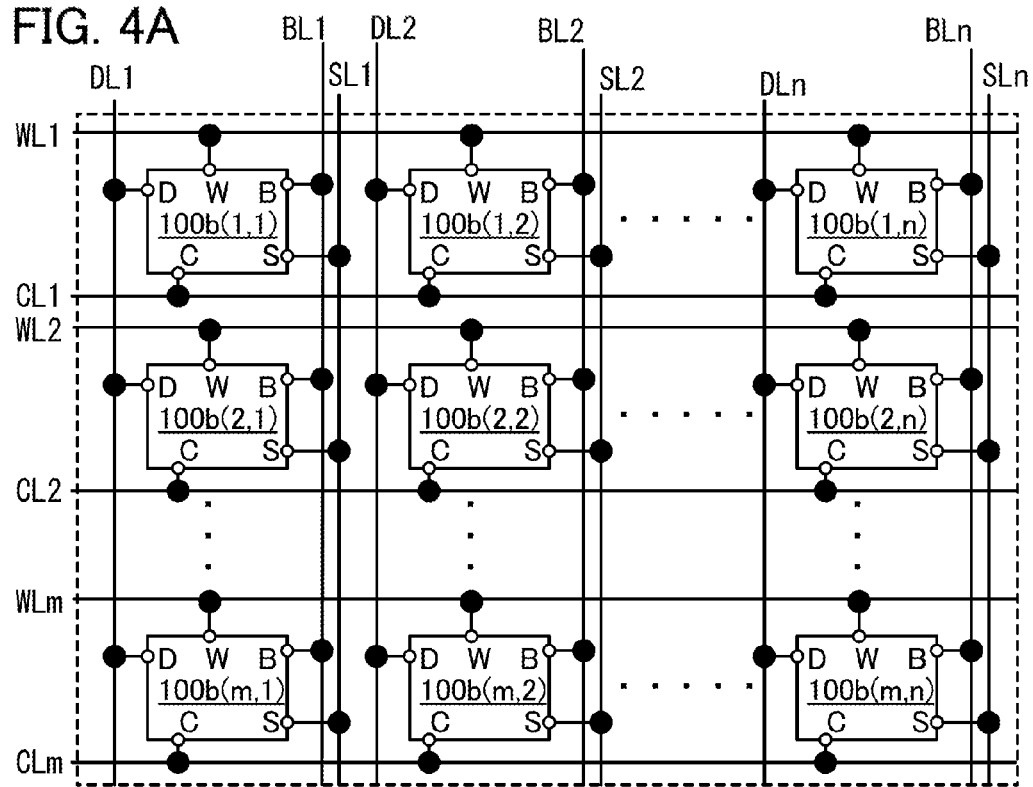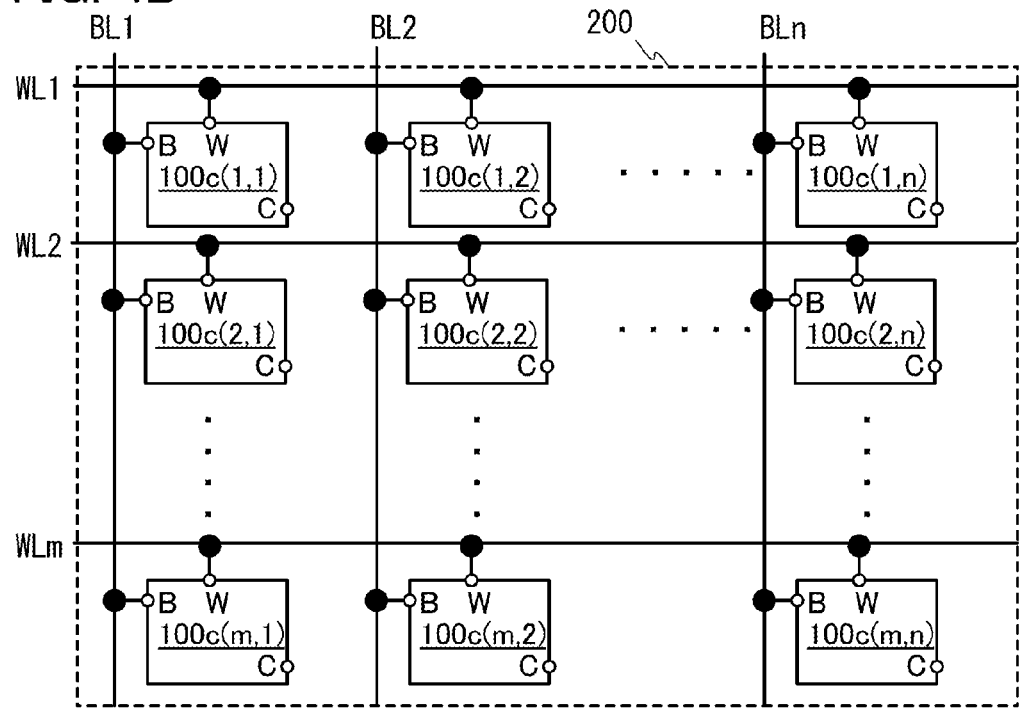

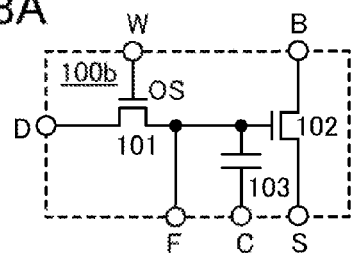
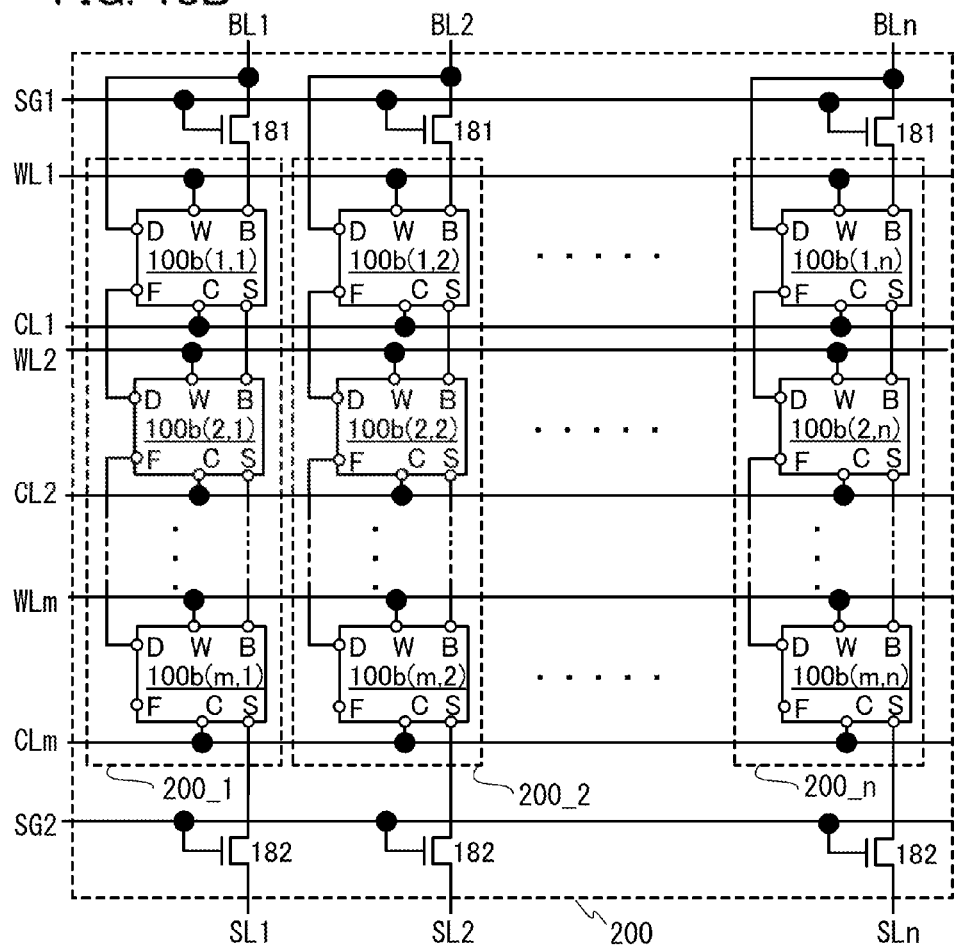

TEMPORARY STORAGE CIRCUIT, STORAGE DEVICE, AND SIGNAL PROCESSING CIRCUIT

BACKGROUND OF THE INVENTION

1. Field of the Invention

The present invention relates to a semiconductor device including a nonvolatile storage element in which a stored logic state (data) is not erased even when supply of power supply voltage is stopped. In particular, the present invention relates to a temporary storage circuit, such as a page buffer, including a nonvolatile storage element; a storage device including the temporary storage circuit; and a signal processing circuit including the storage device. Furthermore, the present invention relates to an electronic device including the storage device or the signal processing circuit.

2. Description of the Related Art

In a memory (storage device) including a page buffer, the page buffer has a function of temporarily holding data for at least one block (for example, a plurality of memory cells electrically connected to one word line) of a memory cell array included in the memory. After data input to the memory is held in the page buffer, the data held in the page buffer is written to one block of the memory cell array. In addition, after data held in one block of the memory cell array is read out and held in the page buffer, the data held in the page buffer is read out. Alternatively, the data held in the page buffer is written again to the one block of the memory cell array. Further alternatively, the data held in the page buffer can be written to another one block of the memory cell array.

A page buffer disclosed in Patent Document 1 includes a plurality of sets. Each set includes a latch circuit, a transistor functioning as a switch that selects the input of data to the latch circuit, and a transistor functioning as a switch that selects the output of data from the latch circuit. The latch circuit includes a flip-flop including two inverters (see FIG. 1 and the like in Patent Document 1).

REFERENCE

Patent Document

[Patent Document 1] Japanese Published Patent Application No. 2010-176831

SUMMARY OF THE INVENTION

In a page buffer as disclosed in Patent Document 1, a large number of transistors are included in a circuit. For example, assuming that an inverter includes two transistors, a latch circuit includes at least four transistors. Further, at least two transistors are needed as a switch that selects the input of data to the latch circuit and a switch that selects the output of data from the latch circuit. Accordingly, each of a plurality of storage elements included in the page buffer needs at least six transistors. Therefore, the area of a circuit in the page buffer is large and integration of the circuits is thus difficult.

Moreover, each of a plurality of storage elements included in a page buffer as disclosed in Patent Document 1 is a volatile storage element which holds data only when power supply voltage is supplied. Therefore, power supply voltage is needed even while no data is input to or output from the page buffer.

In view of the above, an object is to provide a temporary storage circuit (e.g., a page buffer) which includes a storage element including a reduced number of transistors.

Another object is to provide a temporary storage circuit (e.g., a page buffer), which includes a storage element including a reduced number of transistors and in which stored data is not erased even when supply of power supply voltage is stopped.

Further, another object is to provide a storage device, which includes the above temporary storage circuit (e.g., a page buffer) and a memory cell array including a storage element in which stored data is not erased even when supply of power supply voltage is stopped.

(Embodiments of Structure of Temporary Storage Circuit)

The followings are embodiments of a structure of a temporary storage circuit of the present invention.

Note that a temporary storage circuit refers to a circuit which is provided separately from a memory cell array in a storage device and has a function of temporarily holding data for at least one block (for example, a plurality of memory cells electrically connected to one word line) of the memory cell array. As an example of a temporary storage circuit, a page buffer can be given. Further, a temporary storage circuit includes a data latch circuit in its category.

(Structure 1 of Temporary Storage Circuit)

A temporary storage circuit includes a plurality of storage elements, and each of the plurality of storage elements has the following (Structure 1 of Storage Element).

(Structure 1 of Storage Element)

A storage element includes a first transistor and a second transistor. A channel of the first transistor is formed in an oxide semiconductor layer. A gate of the first transistor is electrically connected to a first wiring, one of a source and a drain of the first transistor is electrically connected to a second wiring, and the other of the source and the drain of the first transistor is electrically connected to a gate of the second transistor. One of a source and a drain of the second transistor is electrically connected to a third wiring, and the other of the source and the drain of the second transistor is electrically connected to a fourth wiring.

The above (Structure 1 of Storage Element) may further include a capacitor. One of a pair of electrodes of the capacitor can be electrically connected to the gate of the second transistor. The other of the pair of electrodes of the capacitor can be electrically connected to a fifth wiring.

The above (Structure 1 of Storage Element) can also be expressed as follows.

The storage element includes the first transistor and the second transistor. The channel of the first transistor is formed in the oxide semiconductor layer. A signal potential corresponding to data (a signal potential input to the second wiring) is input to the gate of the second transistor through the first transistor which has been selected to be turned on by a control signal input to the gate of the first transistor (a control signal input to the first wiring). Then, the first transistor is turned off by a control signal input to the gate of the first transistor (a control signal input to the first wiring), so that the signal potential is held in the gate of the second transistor. When the one of the source and the drain of the second transistor (the third wiring) is set to a predetermined potential (a first potential, e.g., a low power supply potential), the state between the source and the drain of the second transistor varies depending on the signal potential. Here, the state between a source and a drain of a transistor refers to whether the source and the drain are in a conduction state or a non-conduction state. Note that the conduction state may include a plurality of states with different resistance values of on resistance. The data held in the storage element can be read out by detection of the state between the source and the drain of the second transistor.

In the case where the (Structure 1 of Storage Element) further includes the capacitor, the second transistor can be turned on, that is, the source and the drain of the second transistor can be placed in a conduction state by control of the potential of the fifth wiring, regardless of the data held in the storage element. Further, the second transistor can be turned off, that is, the source and the drain of the second transistor can be placed in a non-conduction state by control of the potential of the fifth wiring, regardless of the data held in the storage element.

A temporary storage circuit having a structure different from the above (Structure 1 of Temporary Storage Circuit) will be described below as (Structure 2 of Temporary Storage Circuit).

(Structure 2 of Temporary Storage Circuit)

A temporary storage circuit includes a plurality of storage elements, and each of the plurality of storage elements has the following (Structure 2 of Storage Element).

(Structure 2 of Storage Element)

A storage element includes a transistor and a capacitor. A channel of the transistor is formed in an oxide semiconductor layer. A gate of the transistor is electrically connected to a first wiring, one of a source and a drain of the transistor is electrically connected to a second wiring, and the other of the source and the drain of the transistor is electrically connected to one of a pair of electrodes of the capacitor.

In the above (Structure 2 of Storage Element), the other of the pair of electrodes of the capacitor can be electrically connected to a third wiring. A fixed potential (e.g., a low power supply potential such as a ground potential) can be input to the third wiring.

The above (Structure 2 of Storage Element) can also be expressed as follows.

The storage element includes the transistor and the capacitor. The channel of the transistor is formed in the oxide semiconductor layer. A signal potential corresponding to data (a signal potential input to the second wiring) is input to the one of the pair of electrodes of the capacitor through the transistor which has been selected to be turned on by a control signal input to the gate (a control signal input to the first wiring). After that, the transistor is turned off by a control signal input to the gate (a control signal input to the first wiring), so that the signal potential is held in the capacitor. Then, the transistor is turned on by a control signal input to the gate (a control signal input to the first wiring) and the potential held in the one of the pair of electrodes of the capacitor is detected through the second wiring, whereby the data held in the storage element is read out.

The above are the embodiments of the structure of the temporary storage circuit.

(Storage Device)

Note that one embodiment of a storage device of the present invention can have a structure including the above temporary storage circuit and a reading circuit.

In the case where the above (Structure 1 of Storage Element) is applied to the storage element included in the temporary storage circuit, one embodiment of the reading circuit can be the following (Structure 1 of Reading Circuit).

(Structure 1 of Reading Circuit)

A reading circuit includes a plurality of reading elements, and each of the plurality of reading elements can have a structure including a sixth wiring, a load, a switch, and a sense amplifier. Note that the sixth wiring can be shared by the plurality of reading elements.

In the operation of the reading element, a fixed potential (e.g., a second potential which is different from the first potential, such as a high power supply potential) is input to the sixth wiring. The fourth wiring is electrically connected to the sixth wiring through the switch which has been turned on and the load in this order. Thus, the potential of a connection portion (hereinafter referred to as a node M) between the load and the switch is determined by the state between the source and the drain of the second transistor. In other words, in the case where the source and the drain of the second transistor are in a non-conduction state, electrical connection between the node M and the third wiring is cut, so that the potential of the node M becomes (or becomes close to) the potential of the sixth wiring (the second potential). On the other hand, in the case where the source and the drain of the second transistor are in a conduction state, when the resistance value of the on resistance between the source and the drain of the second transistor is denoted by Rt and the resistance value of the load is denoted by R0, the potential of the node M becomes a value which is determined by resistance division of the potential difference between the potential of the third wiring (the first potential) and the potential of the sixth wiring (the second potential) by Rt and R0.

The potential of the node M is input to the sense amplifier to be amplified; thus, the data held in the storage element is read out. The sense amplifier can be formed using an operational amplifier, for example. In that case, a structure can be employed in which the potential of the node M is input to a non-inverting input terminal of the operational amplifier, and a reference potential is input to an inverting input terminal of the operational amplifier. The operational amplifier compares the potential of the node M with the reference potential, and outputs a high-level potential or a low-level potential, i.e., a signal "1" or a signal "0". Since the output signal is a signal corresponding to the data held in the storage element, the data held in the storage element can be read out on the basis of this signal. Note that the output signal of the sense amplifier may be input to an arithmetic circuit such as an inverter, so that an inverted signal of the output signal of the sense amplifier is output from the reading element.

In the case where the above (Structure 2 of Storage Element) is applied to the storage element included in the temporary storage circuit, one embodiment of the reading circuit can be the following (Structure 2 of Reading Circuit).

(Structure 2 of Reading Circuit)

A reading circuit includes a plurality of reading elements, and each of the plurality of reading elements can have a structure including a sense amplifier.

When the transistor is turned on by the control signal input to the gate (the control signal input to the first wiring), the potential of the one of the pair of electrodes of the capacitor is output to the second wiring. Then, the potential of the second wiring is input to the sense amplifier to be amplified; thus, the data held in the storage element is read out. The sense amplifier can be formed using an operational amplifier, for example. In that case, a structure can be employed in which the potential of the second wiring is input to a non-inverting input terminal of the operational amplifier, and a reference potential is input to an inverting input terminal of the operational amplifier. The operational amplifier compares the potential of the second wiring with the reference potential, and outputs a high-level potential or a low-level potential, i.e., a signal "1" or a signal "0". Since the output signal is a signal corresponding to the data held in the storage element, the data held in the storage element can be read out on the basis of this signal. Note that the output signal of the sense amplifier may be input to an arithmetic circuit such as an inverter, so that an inverted signal of the output signal of the sense amplifier is output from the reading element.

(One Embodiment of Storage Device Including Memory Cell Array and Driving Circuit Thereof)

One embodiment of a storage device of the present invention can have a structure including a memory cell array including a plurality of storage elements, a second reading circuit that reads data from the memory cell array, an x decoder, and a y decoder, in addition to the above temporary storage circuit (which includes a plurality of storage elements having the (Structure 1 of Temporary Storage Circuit) or the (Structure 2 of Temporary Storage Circuit)) and the above reading circuit (hereinafter referred to as a first reading circuit) that reads data from the temporary storage circuit. Note that the temporary storage circuit, the first reading circuit, the second reading circuit, the x decoder, and the y decoder can also be referred to as driver circuits of the memory cell array.

Data input to the storage device is held in the temporary storage circuit. The data read from the temporary storage circuit by the first reading circuit can be written to a memory cell which is specified by the x decoder and the y decoder among memory cells included in the memory cell array. Here, the x decoder and the y decoder can specify a plurality of memory cells at the same time. Hereinafter, a plurality of memory cells which are specified at the same time are referred to as a block.

The data stored in the memory cell (or block) which is specified by the x decoder and the y decoder among the memory cells included in the memory cell array is read out by the second reading circuit, and the read data is held in the temporary storage circuit. The data held in the temporary storage circuit can be read out by the first reading circuit and output from the storage device.

The data stored in the memory cell (or block) which is specified by the x decoder and the y decoder among the memory cells included in the memory cell array is read out by the second reading circuit, and the read data is held in the temporary storage circuit. The data held in the temporary storage circuit can be read out by the first reading circuit and written to another memory cell (or another block) which is specified by the x decoder and the y decoder. In this manner, data can be copied in the memory cell array.

The data stored in the memory cell (or block) which is specified by the x decoder and the y decoder among the memory cells included in the memory cell array is read out by the second reading circuit, and the read data is held in the temporary storage circuit. The data held in the temporary storage circuit can be read out by the first reading circuit and written to the same memory cell (or the same block) that is specified by the x decoder and the y decoder. In this manner, data can be rewritten (refreshed) in the memory cell array.

Here, the plurality of storage elements included in the memory cell array can employ the above (Structure 1 of Storage Element) or (Structure 2 of Storage Element). In the case where the plurality of storage elements included in the memory cell array each have the (Structure 1 of Storage Element), the (Structure 1 of Reading Circuit) can be applied to the second reading circuit. In the case where the plurality of storage elements included in the memory cell array each have the (Structure 2 of Storage Element), the (Structure 2 of Reading Circuit) can be applied to the second reading circuit.

In the case where the plurality of storage elements included in the memory cell array each have the (Structure 1 of Storage Element) and the plurality of storage elements included in the temporary storage circuit each have the (Structure 1 of Storage Element), a reading circuit serving as both the first reading circuit and the second reading circuit can be used and the (Structure 1 of Reading Circuit) can be applied thereto. In the case where the plurality of storage elements included in the memory cell array each have the (Structure 2 of Storage Element) and the plurality of storage elements included in the temporary storage circuit each have the (Structure 2 of Storage Element), a reading circuit serving as both the first reading circuit and the second reading circuit can be used and the (Structure 2 of Reading Circuit) can be applied thereto.

(Structure of Signal Processing Circuit)

One embodiment of a signal processing circuit of the present invention can be a signal processing circuit including the storage device.

Further, the signal processing circuit may include some kinds of logic circuits such as an arithmetic circuit which performs data exchange (input and output) with the storage device in addition to the storage device. Not only the supply of power supply voltage to the storage device but also the supply of power supply voltage to the arithmetic circuit which performs data exchange with the storage device may be stopped.

Note that the signal processing circuit of the present invention includes a large scale integrated circuit (LSI) such as a CPU, a microprocessor, an image processing circuit, a digital signal processor (DSP), or a field programmable gate array (FPGA) in its category.

It is possible to provide a temporary storage circuit (e.g., a page buffer) including a storage element which can be constituted by two transistors, two transistors and a capacitor (Structure 1 of Storage Element), or one transistor and a capacitor (Structure 2 of Storage Element). Thus, the area of a circuit in the temporary storage circuit can be reduced.

A transistor whose channel is formed in an oxide semiconductor layer (the first transistor in the (Structure 1 of Storage Element) and the transistor in the (Structure 2 of Storage Element)) has extremely low off-state current. Therefore, in the (Structure 1 of Storage Element), the potential of the gate of the second transistor can be held for a long period even while power supply voltage is not supplied to the storage element. Thus, the storage element can hold data even after supply of power supply voltage is stopped. Further, in the (Structure 2 of Storage Element), the potential of the one of the pair of electrodes of the capacitor can be held for a long period even while power supply voltage is not supplied to the storage element. Thus, the storage element can hold data even after supply of power supply voltage is stopped.

Consequently, it is possible to provide a temporary storage circuit (e.g., a page buffer) having a small circuit area and including a storage element in which stored data is not erased even when supply of power supply voltage is stopped.

Further, it is possible to provide a storage device, which includes the above temporary storage circuit (e.g., a page buffer) and a memory cell array including a storage element in which stored data is not erased even when supply of power supply voltage is stopped.

When a reading circuit serving as both a reading circuit that reads data from the temporary storage circuit and a reading circuit that reads data from the memory cell array is used, the storage device can be further downsized. On the other hand, when the reading circuit that reads data from the temporary storage circuit and the reading circuit that reads data from the memory cell array are provided separately, the reading of data from the temporary storage circuit and the reading of data from the memory cell array can be performed concurrently.

By applying such a storage device to a signal processing circuit, data can be prevented from being lost because of the stop of the supply of power supply voltage. In addition, after the supply of power supply voltage is restarted, the storage element can return to the state before the supply of power supply voltage is stopped in a short time.

BRIEF DESCRIPTION OF THE DRAWINGS

FIGS. 4A and 4B each illustrate a structure of a memory cell array.

FIGS. 18A and 18B illustrate structures of a storage element and a memory cell array.

DETAILED DESCRIPTION OF THE INVENTION

Figure 1A:
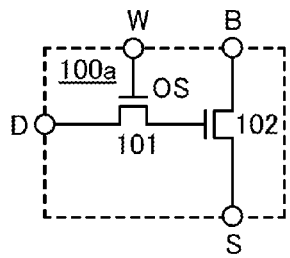
FIGS. 1A to 1F illustrate structures of storage elements and temporary storage circuits.

Hereinafter, embodiments and an example of the present invention will be described in detail with reference to the accompanying drawings. However, the present invention is not limited to the following description and it is easily understood by those skilled in the art that the mode and details can be variously changed without departing from the scope and spirit of the present invention. Accordingly, the present invention should not be construed as being limited to the description of the embodiments and example below.

Note that functions of the "source" and "drain" may be switched in the case where transistors of different polarities are employed or in the case where the direction of a current flow changes in a circuit operation, for example. Therefore, the terms "source" and "drain" can be used to denote the drain and the source, respectively, in this specification.

Note that in this specification and the like, the term "electrically connected" includes the case where components are connected through an "object having any electric function". There is no particular limitation on the object having any electric function as long as electric signals can be transmitted and received between the components connected through the object. Examples of an "object having any electric function" are a switching element such as a transistor, a resistor, an inductor, a capacitor, and an element with a variety of functions as well as an electrode and a wiring.

In addition, even when a circuit diagram shows independent components as if they are electrically connected to each other, there is actually a case where one conductive film has functions of a plurality of components such as a case where part of a wiring also functions as an electrode. The "electrical connection" in this specification includes in its category such a case where one conductive film has functions of a plurality of components.

In this specification and the like, the terms "over" and "below" do not necessarily mean "directly on" and "directly below", respectively, in the description of a physical relationship between components. For example, the expression "a gate electrode over a gate insulating layer" can mean the case where there is an additional component between the gate insulating layer and the gate electrode.

The position, size, range, or the like of each component illustrated in drawings and the like is not accurately represented in some cases for easy understanding. Therefore, the disclosed invention is not necessarily limited to the position, size, range, or the like as disclosed in the drawings and the like.

The ordinal number such as "first", "second", and "third" are used in order to avoid confusion among components.

Embodiment 1

Embodiments of a temporary storage circuit of the present invention will be described.

(Structure of Temporary Storage Circuit 100A)

Figure 1B:
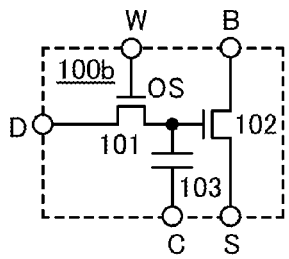
Figure 1C:
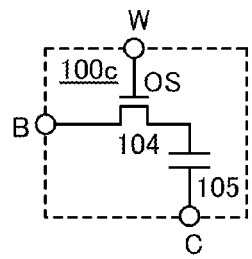
Figure 1D:
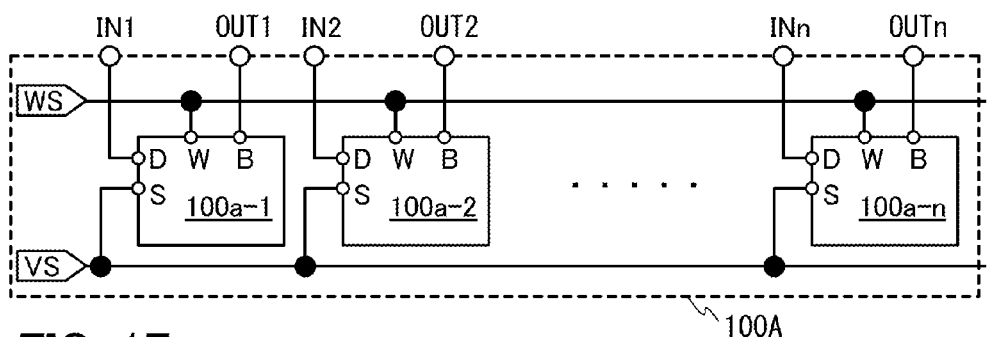

FIG. 1D illustrates one embodiment of the temporary storage circuit of the present invention. In FIG. 1D, the temporary storage circuit 100A includes n (n is a natural number greater than or equal to 2) storage elements (100a-1 to 100a-n). A storage element 100a illustrated in FIG. 1A can be used as each of the n storage elements (100a-1 to 100a-n). In the temporary storage circuit 100A, terminals D of the n storage elements (100a-1 to 100a-n) can serve as input terminals (IN1 to INn), and terminals B of the n storage elements (100a-1 to 100a-n) can serve as output terminals (OUT1 to OUTn).

Note that the terminal B and the terminal D can be electrically connected to each other in each of the n storage elements (100a-1 to 100a-n), so that the terminals D and the terminals B can serve as both input terminals (IN1 to INn) and output terminals (OUT1 to OUTn).

Note that in the temporary storage circuit 100A illustrated in FIG. 1D, terminals W of the n storage elements (100a-1 to 100a-n) are electrically connected to each other, and the same control signal WS is input thereto; however, one embodiment of the present invention is not limited to this structure. A control signal input to the terminals W of some of the n storage elements (100a-1 to 100a-n) may be different from that input to the terminals W of the others.

Note that in the temporary storage circuit 100A illustrated in FIG. 1D, terminals S of then storage elements (100a-1 to 100a-n) are electrically connected to each other, and the same potential (or control signal) VS is input thereto; however, one embodiment of the present invention is not limited to this structure. A potential (or control signal) input to the terminals S of some of the n storage elements (100a-1 to 100a-n) may be different from that input to the terminals S of the others.

Furthermore, the temporary storage circuit may include a plurality of temporary storage circuits 100A illustrated in FIG. 1D.

In the temporary storage circuit 100A, signal potentials corresponding to data input to the input terminals (IN1 to INn) can respectively be held in the n storage elements (100a-1 to 100a-n), and the held data can be read from the output terminals (OUT1 to OUTn).

Embodiments of a structure and driving method of the storage element 100a included in the temporary storage circuit 100A will be described below.

(Structure of Storage Element 100a)

The storage element 100a illustrated in FIG. 1A includes a transistor 101 and a transistor 102. A channel of the transistor 101 is formed in an oxide semiconductor layer. A gate of the transistor 101 is electrically connected to the terminal W. One of a source and a drain of the transistor 101 is electrically connected to the terminal D. The other of the source and the drain of the transistor 101 is electrically connected to a gate of the transistor 102. One of a source and a drain of the transistor 102 is electrically connected to the terminal S. The other of the source and the drain of the transistor 102 is electrically connected to the terminal B. Each terminal (the terminal W, the terminal B, the terminal S, and the terminal D) is electrically connected to a wiring or an electrode. Note that in FIG. 1A, "OS" is written beside a transistor in order to indicate that the transistor 101 has a structure in which a channel is formed in an oxide semiconductor layer.

(Driving Method of Storage Element 100a)

A driving method of the storage element 100a illustrated in FIG. 1A will be described.

First, operation of writing data to the storage element 100a will be described. A signal potential corresponding to data (a signal potential input to the terminal D) is input to the gate of the transistor 102 through the transistor 101 which is selected to be turned on by a control signal input to the gate of the transistor 101 (a control signal input to the terminal W). Then, the transistor 101 is turned off by a control signal input to the gate of the transistor 101 (a control signal input to the terminal W), so that the signal potential is held in the gate of the transistor 102. In this manner, data can be written to the storage element 100a.

Here, the off-state current of the transistor 101 whose channel is formed in the oxide semiconductor layer is extremely low. Therefore, in the storage element 100a, the potential of the gate of the transistor 102 can be held for a long period even while power supply voltage is not supplied to the storage element 100a. Thus, the storage element 100a can hold data even after supply of power supply voltage is stopped.

Next, operation of reading data from the storage element 100a will be described. When the one of the source and the drain of the transistor 102 (the terminal S) is set to a predetermined potential (a first potential, e.g., a low power supply potential), the state between the source and the drain of the transistor 102 varies depending on the signal potential held in the gate of the transistor 102. Here, the state between the source and the drain of the transistor 102 refers to whether the source and the drain are in a conduction state or a non-conduction state. Note that the conduction state may include a plurality of states with different resistance values of on resistance. The data held in the storage element 100a can be read out by detection of the state between the source and the drain of the transistor 102.

The above is the description of the driving method of the storage element 100a. Writing and reading of data are performed as described above in each of the plurality of storage elements 100a included in the temporary storage circuit 100A; thus, a plurality of data can be written to and read out from the temporary storage circuit 100A.

(Structure of Temporary Storage Circuit 100B)

Figure 1E:
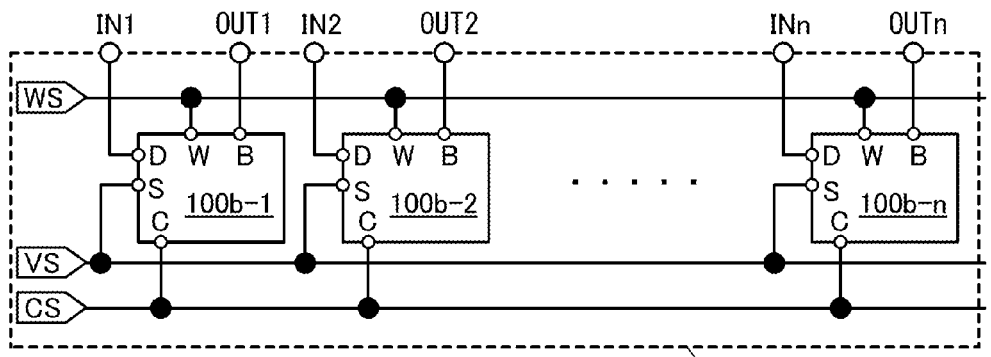

FIG. 1E illustrates one embodiment of the temporary storage circuit of the present invention, which is different from that in FIG. 1D. In FIG. 1E, the temporary storage circuit 100B includes 11 storage elements (100b-1 to 100b-n). A storage element 100b illustrated in FIG. 1B can be used as each of the n storage elements (100b-1 to 100b-n). In the temporary storage circuit 100B, terminals D of the n storage elements (100b-1 to 100b-n) can serve as input terminals (IN1 to INn), and terminals B of the n storage elements (100b-1 to 100b-n) can serve as output terminals (OUT1 to OUTn).

Note that the terminal B and the terminal D can be electrically connected to each other in each of the n storage elements (100b-1 to 100b-n), so that the terminals D and the terminals B can serve as both input terminals (IN1 to INn) and output terminals (OUT1 to OUTn).

Note that in the temporary storage circuit 100B illustrated in FIG. 1E, terminals W of the n storage elements (100b-1 to 100b-n) are electrically connected to each other, and the same control signal WS is input thereto; however, one embodiment of the present invention is not limited to this structure. A control signal input to the terminals W of some of the n storage elements (100b-1 to 100b-n) may be different from that input to the terminals W of the others.

Note that in the temporary storage circuit 100B illustrated in FIG. 1E, terminals S of the n storage elements (100b-1 to 100b-n) are electrically connected to each other, and the same potential (or control signal) VS is input thereto; however, one embodiment of the present invention is not limited to this structure. A potential (or control signal) input to the terminals S of some of the n storage elements (100b-1 to 100b-n) may be different from that input to the terminals S of the others.

Note that in the temporary storage circuit 100B illustrated in FIG. 1E, terminals C of the n storage elements (100b-1 to 100b-n) are electrically connected to each other, and the same potential (or control signal) CS is input thereto; however, one embodiment of the present invention is not limited to this structure. A potential (or control signal) input to the terminals C of some of the n storage elements (100b-1 to 100b-n) may be different from that input to the terminals C of the others.

Furthermore, the temporary storage circuit may include a plurality of temporary storage circuits 100E illustrated in FIG. 1E.

In the temporary storage circuit 100B, signal potentials corresponding to data input to the input terminals (IN1 to INn) can respectively be held in the n storage elements (100b-1 to 100b-n), and the held data can be read from the output terminals (OUT1 to OUTn).

Embodiments of a structure and driving method of the storage element 100b included in the temporary storage circuit 100B will be described below.

(Structure of Storage Element 100b)

The storage element 100b illustrated in FIG. 1B includes a capacitor 103 in addition to the components of the storage element 100a illustrated in FIG. 1A. One of a pair of electrodes of the capacitor 103 is electrically connected to the gate of the transistor 101. The other of the pair of electrodes of the capacitor 103 is electrically connected to the terminal C. The terminal C is electrically connected to a wiring or an electrode.

(Driving Method of Storage Element 100b)

A driving method of the storage element 100b illustrated in FIG. 1B is similar to that of the storage element 100a illustrated in FIG. 1A. In the storage element 100b illustrated in FIG. 1B, the transistor 102 can be turned on, that is, the source and the drain of the transistor 102 can be placed in a conduction state by control of the potential (or control signal) input to the terminal C, regardless of the data held in the storage element 100b. Further, the transistor 102 can be turned off, that is, the source and the drain of the transistor 102 can be placed in a non-conduction state by control of the potential (or control signal) input to the terminal C, regardless of the data held in the storage element 100b.

The above is the description of the driving method of the storage element 100b. Writing and reading of data are performed as described above in each of the plurality of storage elements 100b included in the temporary storage circuit 100B; thus, a plurality of data can be written to and read out from the temporary storage circuit 100B.

(Structure of Temporary Storage Circuit 100C)

Figure 1F:
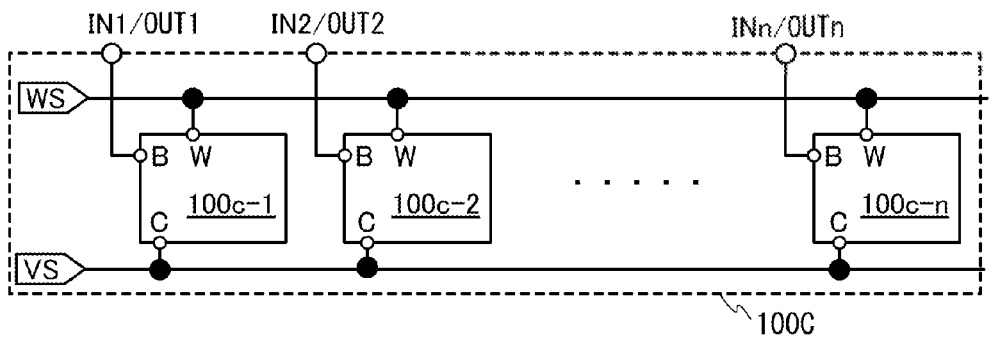

FIG. 1F illustrates one embodiment of the temporary storage circuit of the present invention, which is different from those in FIGS. 1D and 1E. In FIG. 1F, the temporary storage circuit 100C includes n storage elements (100c-1 to 100c-n). A storage element 100c illustrated in FIG. 1C can be used us each of the n storage elements (100c-1 to 100c-n). In the temporary storage circuit 100C, terminals B of the n storage elements (100c-1 to 100c-n) can serve as both input terminals (IN1 to INn) and output terminals (OUT1 to OUTn).

Note that in the temporary storage circuit 100C illustrated in FIG. 1F, terminals W of the n storage elements (100c-1 to 100c-n) are electrically connected to each other, and the same control signal WS is input thereto; however, one embodiment of the present invention is not limited to this structure. A control signal input to the terminals W of some of the n storage elements (100c-1 to 100c-n) may be different from that input to the terminals W of the others.

Note that in the temporary storage circuit 100C illustrated in FIG. 1F, terminals C of the n storage elements (100c-1 to 100c-n) are electrically connected to each other, and the same potential VS is input thereto; however, one embodiment of the present invention is not limited to this structure. A potential input to the terminals C of some of the n storage elements (100c-1 to 100c-n) may be different from that input to the terminals C of the others.

Furthermore, the temporary storage circuit may include a plurality of temporary storage circuits 100C illustrated in FIG. 1F.

In the temporary storage circuit 100C, signal potentials corresponding to data input to the input terminals (IN1 to INn) can respectively be held in the n storage elements (100c-1 to 100c-n), and the held data can be read from the output terminals (OUT1 to OUTn).

Embodiments of a structure and driving method of the storage element 100c included in the temporary storage circuit 100C will be described below.

(Structure of Storage Element 100c)

The storage element 100c illustrated in FIG. 1C includes a transistor 104 and a capacitor 105. A channel of the transistor 104 is formed in an oxide semiconductor layer. A gate of the transistor 104 is electrically connected to the terminal W. One of a source and a drain of the transistor 104 is electrically connected to the terminal B. The other of the source and the drain of, the transistor 104 is electrically connected to one of a pair of electrodes of the capacitor 105. The other of the pair of electrodes of the capacitor 105 can be electrically connected to the terminal C. Each terminal (the terminal W, the terminal B, and the terminal C) is electrically connected to a wiring or an electrode. A fixed potential (e.g., a low power supply potential such as a ground potential) can be input to the terminal C. Note that in FIG. 1C, "OS" is written beside a transistor in order to indicate that the transistor 104 has a structure in which a channel is formed in an oxide semiconductor layer.

(Driving Method of Storage Element 100c)

First, operation of writing data to the storage element 100c will be described. A signal potential corresponding to data (a signal potential input to the terminal B) is input to the one of the pair of electrodes of the capacitor 105 through the transistor 104 which is selected to be turned on by a control signal input to the gate (a control signal input to the terminal W). Then, the transistor 104 is turned oil by a control signal input to the gate (a control signal input to the terminal W), so that the signal potential is held in the gate of the capacitor 105. In this manner, data can be written to the storage element 100c.

Here, the off-state current of the transistor 104 whose channel is formed in the oxide semiconductor layer is extremely low. Therefore, in the storage element 100c, the potential of the one of the pair of electrodes of the capacitor 105 can be held for a long period even while power supply voltage is not supplied to the storage element 100c. Thus, the storage element 100c can hold data even after supply of power supply voltage is stopped.

Next, operation of reading data from the storage element 100c will be described. The transistor 104 is turned on by a control signal input to the gate (a control signal input to the terminal W) and the potential held in the one of the pair of electrodes of the capacitor 105 is detected through the terminal B, whereby the data held in the storage element 100c is read out.

The above is the description of the driving method of the storage element 100c. Writing and reading of data are performed as described above in each of the plurality of storage elements 100c included in the temporary storage circuit 100C; thus, a plurality of data can be written to and read out from the temporary storage circuit 100C.

(Variations of Structure of Temporary Storage Circuit)

Variations of the structure of the temporary storage circuit will be described below.

The temporary storage circuit 100A, the temporary storage circuit 1008, the temporary storage circuit 100C, and the storage elements included in these temporary storage circuits may each further include a diode, a resistor, an inductor, an arithmetic circuit (arithmetic element), or a switch. As the arithmetic circuit (arithmetic element), a buffer, an inverter, a NAND circuit, a NOR circuit, a three-state buffer, a clocked inverter, or the like can be used. As the switch, an analog switch, a transistor, or the like can be used, for example. Alternatively, an arithmetic circuit (arithmetic element) to which either or both of a clock signal and an inverted signal of the clock signal are input can be used as the switch.

Figure 5A:
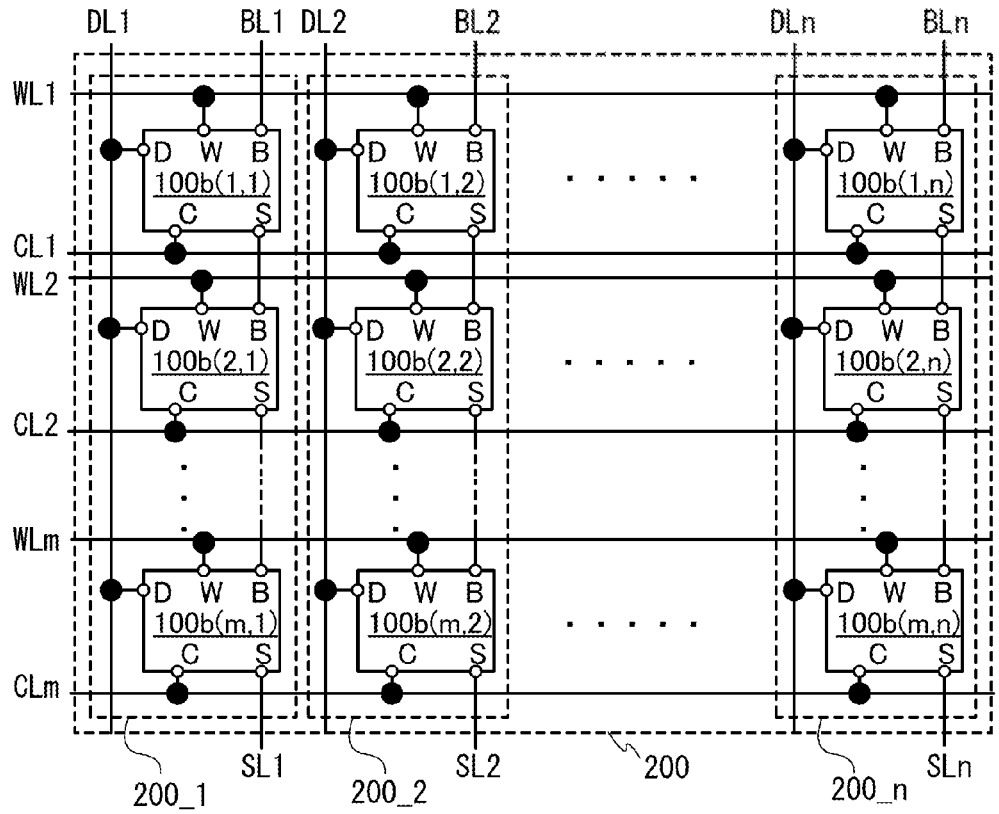
FIGS. 5A to 5D illustrate structures of a memory cell array and storage elements.
Figure 5B:
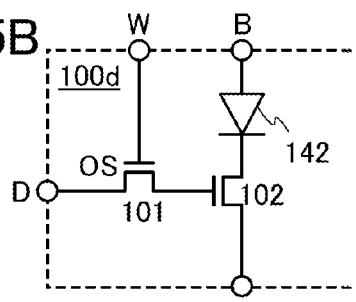

For example, a storage element 100d as illustrated in FIG. 5B may be used instead of the storage element 100a, the storage element 100b, or the storage element 100c. The storage element 100d includes a diode 142 in addition to the structure of the storage element 100a illustrated in FIG. 1A. The other of the source and the drain of the transistor 102 is electrically connected to the terminal B through the diode 142.

Figure 5C:
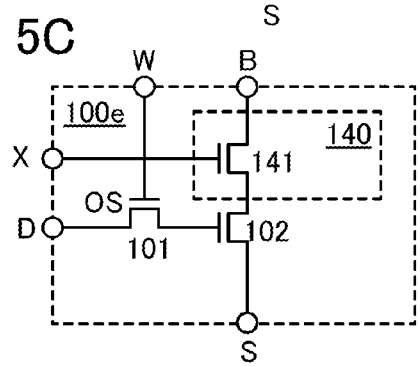

For example, a storage element 100e as illustrated in FIG. 5C may be used instead of the storage element 100a, the storage element 100b, or the storage element 100c. The storage element 100e includes a switch 140 in addition to the structure of the storage element 100a illustrated in FIG. 1A. The switch 140 can be formed using a transistor 141, for example. A gate of the transistor 141 is electrically connected to a terminal X. The other of the source and the drain of the transistor 102 is electrically connected to the terminal B through the transistor 141.

The transistor 101 in the storage element 100a and the storage element 100b and the transistor 104 in the storage element 100c each can be a transistor including two gates, one of which is provided over an oxide semiconductor layer, and the other of which is provided below the oxide semiconductor layer. A control signal (WS) can be input to one gate, and a different control signal can be input to the other gate. The different control signal may be a fixed potential. The fixed potential may be either a low power supply potential or a high power supply potential. Note that the two gates may be electrically connected to each other and the control signal (WS)

may be input to the gates. The threshold voltage or the like of the transistor 101 or the transistor 104 can be controlled by a signal input to the other gate. Further, the off-state current of the transistor 101 or the transistor 104 can be further reduced. In addition, the on-state current of the transistor 101 or the transistor 104 can be increased.

Figure 5D:
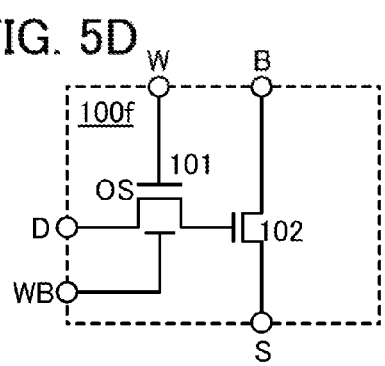

For example, a storage element 100f as illustrated in FIG. 5D may be used instead of the storage element 100a, the storage element 100b, or the storage element 100c. The storage element 100f is an example in which a transistor including two gates, one of which is provided over an oxide semiconductor layer, and the other of which is provided below the oxide semiconductor layer, is used as the transistor 101 in the structure of the storage element 100a illustrated in FIG. 1A. FIG. 5D schematically illustrates a structure in which one of the gates of the transistor 101 is electrically connected to the terminal W, and the other of the gates is electrically connected to a terminal WB which is different from the terminal W.

The transistor 102 can be a transistor which has a channel in a layer or a substrate including a semiconductor other than an oxide semiconductor. For example, the transistor 102 can be a transistor which has a channel in a silicon layer or a silicon substrate. Alternatively, the transistor 102 can be a transistor which has a channel in an oxide semiconductor layer.

Here, the transistor which has a channel in the silicon layer or the silicon substrate has higher switching speed and higher on-state current than the transistor which has a channel in the oxide semiconductor layer. Thus, in a circuit that includes the transistor which has a channel in the silicon layer or the silicon substrate and the transistor which has a channel in the oxide semiconductor layer in combination, the operating speed of the circuit is improved and leakage current can be reduced. For example, with the use of the combination of the transistor 101 which has a channel in the oxide semiconductor layer and the transistor 102 which has a channel in the silicon layer or the silicon substrate in the storage element 100a or the storage element 100b, the operating speed of the storage element 100a or the storage element 100b is improved and power consumption can be reduced.

The above are the variations of the structure of the temporary storage circuit.

As described above, it is possible to provide a temporary storage circuit including a storage element which can be constituted by two transistors, two transistors and a capacitor, or one transistor and a capacitor. Thus, the area of a circuit in the temporary storage circuit can be reduced. Each of the plurality of storage elements included in the temporary storage circuit can hold data even after supply of power supply voltage is stopped. Consequently, it is possible to provide a temporary storage circuit having a small circuit area and including a storage element in which stored data is not erased even when supply of power supply voltage is stopped.

This embodiment can be implemented in appropriate combination with any of the other embodiments.

Embodiment 2

In this embodiment, embodiments of a reading circuit for reading data held in the temporary storage circuit described in Embodiment 1 (the temporary storage circuit 100A, the temporary storage circuit 100B, or the temporary storage circuit 100C) will be described.

One embodiment of a storage device of the present invention can have a structure including a temporary storage circuit and a reading circuit.

(Structure of Reading Circuit 110A)

Figure 2A:
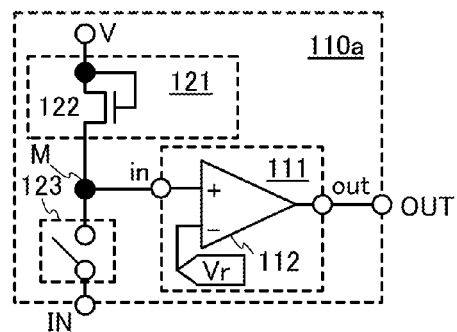
FIGS. 2A to 2D illustrate structures of reading elements and reading circuits.
Figure 2B:
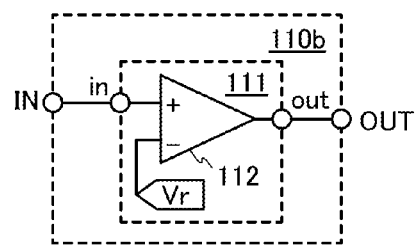
Figure 2C:
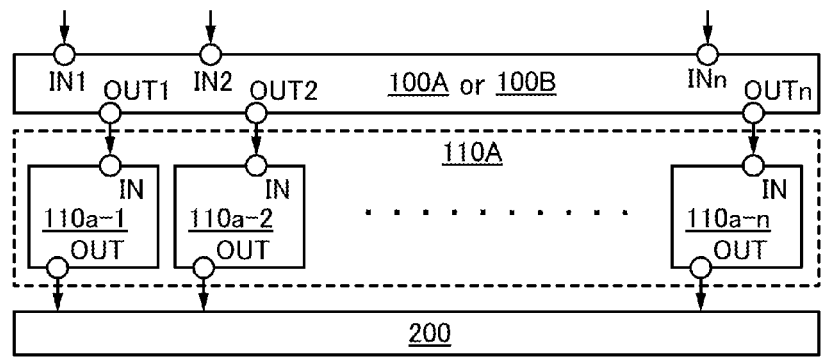

The data held in the temporary storage circuit 100A or the temporary storage circuit 100B can be read out by a reading circuit 110A illustrated in FIG. 2C. The reading circuit 110A includes n reading elements (110a-1 to 110a-n). A reading element 110a illustrated in FIG. 2A can be used as each of the n reading elements (110a-1 to 110a-n).

Furthermore, the reading circuit may include a plurality of reading circuits 110A illustrated in FIG. 2C.

The output terminals (OUT1 to OUTn) of the temporary storage circuit 100A or the temporary storage circuit 100B are electrically connected to input terminals (IN1 to INn) of the reading circuit 110A, respectively. The reading circuit 110A reads out data held in the temporary storage circuit 100A or the temporary storage circuit 100B and outputs the data from output terminals (OUT1 to OUTn) of the reading circuit 110A. The data output from the output terminals (OUT1 to OUTn) of the reading circuit 110A are input to a memory cell array 200 including a plurality of storage elements.

Embodiments of a structure and driving method of the reading element 110a included in the reading circuit 110A will be described below.

(Structure of Reading Element 110a)

The reading element 110a illustrated in FIG. 2A can have a structure including a terminal V, a load 121, a switch 123, and a sense amplifier 111. As the load 121, a transistor 122 can be used, for example. A gate of the transistor 122 is electrically connected to one of a source and a drain of the transistor 122. As the sense amplifier 111, an operational amplifier 112 can be used. Note that a transistor can be used as the switch 123. The terminal V is electrically connected to a wiring or an electrode.

Note that a switch may be used instead of the load 121. A transistor may be used as the switch.

In the reading element 110a, the load 121 and the switch 123 are electrically connected in series in this order between the terminal V and the input terminal IN. The connection portion between the load 121 and the switch 123 (node M: denoted by M in FIG. 2A) is electrically connected to an input terminal "in" of the sense amplifier 111. The potential input to the input terminal "in" of the sense amplifier 111 is input to a non-inverting input terminal (+) of the operational amplifier 112. A reference potential Vr is input to an inverting input terminal (−) of the operational amplifier 112. A signal output from an output terminal "out" of the sense amplifier 111 is output from the output terminal OUT of the reading element 110a.

(Driving Method of Reading Element 110a)

A driving method of the reading element 110a illustrated in FIG. 2A will be described.

In the operation of the reading element 110a, a predetermined potential (a second potential which is different from the first potential supplied to the one of the source and the drain of the transistor 102 (the terminal S) in the storage element 100a or the storage element 100b, e.g., a high power supply potential) is supplied to the terminal V. The input terminal IN of the reading element 110a is electrically connected to the terminal V through the switch 123 which is on and the load 121 in this order. Here, the input terminal IN of the reading element 110a is electrically connected to one of the output terminals (OUT1 to OUTn) of the temporary storage circuit (the temporary storage circuit 100A or the temporary storage circuit 100B), and the output terminals (OUT1 to OUTn) of the temporary storage circuit (the temporary storage circuit 100A or the temporary storage circuit 100B) are electrically connected to the terminals B of the plurality of storage elements (the storage elements 100a or the storage elements 100b) included in the temporary storage circuit. Therefore, the potential of the node M is determined by the state between the source and the drain of the transistor 102 of the storage element (the storage element 100a or the storage element 100b) whose terminal B is electrically connected to the input terminal IN of the reading element 110a. In other words, in the case where the source and the drain of the transistor 102 are in a non-conduction state, electrical connection between the node M and the terminal S to which the first potential is supplied is cut, so that the potential of the node M becomes (or becomes close to) the potential of the terminal V (the second potential which is different from the first potential). On the other hand, in the case where the source and the drain of the transistor 102 are in a conduction state, when the resistance value of the on resistance between the source and the drain of the transistor 102 is denoted by Rt and the resistance value of the load 121 is denoted by R0, the potential of the node M becomes a value which is determined by resistance division of the potential difference between the potential of the terminal S (the first potential) and the potential of the terminal V (the second potential) by Rt and R0.

Then, the potential of the node M is input to the input terminal "in" of the sense amplifier 111. The potential input to the input terminal "in" of the sense amplifier 111 is input to the non-inverting input terminal (+) of the operational amplifier 112. The operational amplifier 112 compares the potential of the node M with the reference potential Vr, and outputs a high-level potential or a low-level potential, i.e., a signal "1" or a signal "0". Since the output signal is a signal corresponding to the data held in the storage element (the storage element 100a or the storage element 100b) whose terminal B is electrically connected to the input terminal IN of the reading element 110a, the data held in the storage element can be read out on the basis of this signal. Note that the output signal of the sense amplifier 111 may be input to an arithmetic circuit such as an inverter, so that an inverted signal of the output signal of the sense amplifier 111 is output from the reading element 110a.

As for a driving method of the reading element 110a, specifically, an example of the case where the transistor 102 included in the storage element (the storage element 100a or the storage element 100b) is an n-channel transistor, the potential input to the storage element is a high-level potential (VH) when data input to the storage element is "1", the potential input to the storage element is a low-level potential (VL) when data input to the storage element is "0", and the resistance value R0 of the load 121 is set to be sufficiently larger than the resistance value Rt of the on resistance between the source and the drain of the transistor 102, will be described. When data is read from this storage element, for example, the first potential supplied to the terminal S of the storage element is set to a ground potential (GND), the second potential supplied to the terminal V of the reading element 110a is set to a high power supply potential (VDD), and the reference potential (Vr) input to the inverting input terminal (−) of the operational amplifier 112 is set to a potential between GND and VDD. The reference potential Vr can be an intermediate potential between GND and VDD. Here, when data "1" is input to and held in the storage element, the transistor 102 is in the on state. That is, the source and the drain of the transistor 102 are in a conduction state. In this case, when the switch 123 is turned on, the potential of the node M becomes a potential close to the ground potential (GND) which is the first potential. When this potential is input to the sense amplifier 111, the output signal of the sense amplifier 111 is "0" because the potential is smaller than the reference potential Vr. On the other hand, when data "0" is input to and held in the storage element, the transistor 102 is in the off state. That is, the source and the drain of the transistor 102 are in a non-conduction state. Therefore, when the switch 123 is turned on, the potential of the node M becomes the high power supply potential (VDD) which is the second potential. When this potential is input to the sense amplifier 111, the output signal of the sense amplifier 111 is "1" because the potential is larger than the reference potential Vr. In such a manner, data held in the storage element can be read out as an inverted signal thereof. Note that the output signal of the sense amplifier 111 may be input to an arithmetic circuit such as an inverter, so that an inverted signal of the output signal of the sense amplifier 111 is output from the reading element.

The above is the description of the driving method of the reading element 110a. Data reading is performed as described above in each of the plurality of reading elements 110a included in the reading circuit 110A. Thus, the reading circuit 110A can read out a plurality of data held in the temporary storage circuit 100A or the temporary storage circuit 1008.

(Structure of Reading Circuit 110B)

Figure 2D:
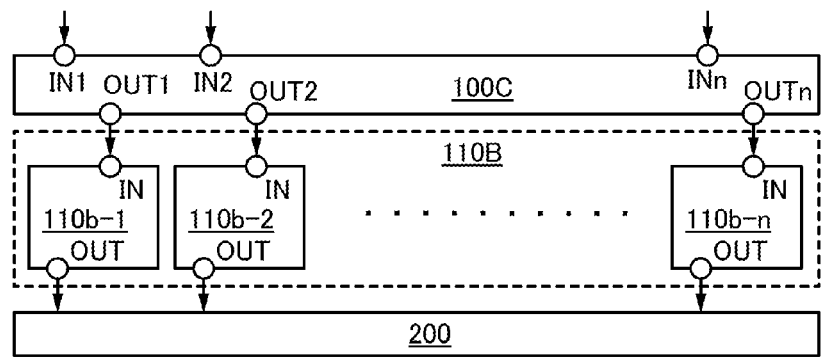

The data held in the temporary storage circuit 100C can be read out by a reading circuit 110B illustrated in FIG. 2D. The reading circuit 110B includes n reading elements (110b-1 to 110b-n). A reading element 110b illustrated in FIG. 2B can be used as each of the n reading elements (110b-1 to 110b-n).

Furthermore, the reading circuit may include a plurality of reading circuits 110B illustrated in FIG. 2D.

The output terminals (OUT1 to OUTn) of the temporary storage circuit 100C are electrically connected to input terminals (IN1 to INn) of the reading circuit 110B, respectively. The reading circuit 110B reads out data held in the temporary storage circuit 100C and outputs the data from output terminals (OUT1 to OUTn) of the reading circuit 110B. The data output from the output terminals (OUT1 to OUTn) of the reading circuit 110E are input to a memory cell array 200 including a plurality of storage elements.

Embodiments of a structure and driving method of the reading element 110b included in the reading circuit 110B will be described below.

(Structure of Reading Element 110b)

The reading element 110b illustrated in FIG. 28 can have a structure including the sense amplifier 111. As the sense amplifier 111, the operational amplifier 112 can be used.

The input terminal IN of the reading element 110b is electrically connected to the input terminal "in" of the sense amplifier 111. The potential input to the input terminal "in" of the sense amplifier 111 is input to the non-inverting input terminal (+) of the operational amplifier 112. A reference potential Vr is input to the inverting input terminal (−) of the operational amplifier 112. A signal output from the output terminal "out" of the sense amplifier 111 is output from the output terminal OUT of the reading element 110b.

(Driving Method of Reading Element 110b)

A driving method of the reading element 110b illustrated in FIG. 2B will be described.

The signal input to the input terminal IN of the reading element 110b is input to the input terminal "in" of the sense amplifier 111 to be input to the non-inverting input terminal (+) of the operational amplifier 112. The operational amplifier 112 compares the potential input to the input terminal "in" with the reference potential Vr, and outputs a high-level potential or a low-level potential, i.e., a signal "1" or a signal "0". Since the output signal is a signal corresponding to the data held in the storage element (the storage element 100c) whose terminal B is electrically connected to the input terminal IN of the reading element 110b, the data held in the storage element can be read out on the basis of this signal. Note that the output signal of the sense amplifier 111 may be input to an arithmetic circuit such as an inverter, so that an inverted signal of the output signal of the sense amplifier 111 is output from the reading element 110b.

The above is the description of the driving method of the reading element 110b. Data reading is performed as described above in each of the plurality of reading elements 110b included in the reading circuit 110B. Thus, the reading circuit 110B can read out a plurality of data held in the temporary storage circuit 100C.

(Variations of Structure of Reading Circuit)

Variations of the structure of the reading circuit will be described below.

The reading circuit 110A, the reading circuit 110B, and the storage elements included in these reading circuits may each further include a diode, a resistor, an inductor, an arithmetic circuit (arithmetic element), or a switch. As the arithmetic circuit (arithmetic element), a buffer, an inverter, a NAND circuit, a NOR circuit, a three-state buffer, a clocked inverter, or the like can be used. As the switch, an analog switch, a transistor, or the like can be used, for example. Alternatively, an arithmetic circuit (arithmetic element) to which either or both of a clock signal and an inverted signal of the clock signal are input can be used as the switch.

This embodiment can be implemented in appropriate combination with any of the other embodiments.

Embodiment 3

In this embodiment, embodiments of a structure of a memory cell array included in a storage device will be described.

(Structure 1 of Memory Cell Array)

FIG. 4A illustrates one embodiment of a memory cell array. In FIG. 4A, the memory cell array 200 includes m×n (m is a natural number greater than or equal to 2, and n is a natural number greater than or equal to 2) storage elements (a storage element 100b (i, j): i is a natural number less than or equal to in, and j is a natural number less than or equal to n). The storage element 100b illustrated in FIG. 1B can be used as each of the m×n storage elements (the storage element 100b (i, j)). The plurality of storage elements included in the memory cell array 200 are also referred to as memory cells.

In FIG. 4A, storage elements arranged in the same column share a wiring (BLj) electrically connected to a terminal B. For example, the storage elements arranged in the first column (the storage elements 100b (1, 1) to 100b (m, 1)) share a wiring (BL1) electrically connected to a terminal B. The wiring (BLj) can also be referred to as a bit line.

In FIG. 4A, storage elements arranged in the same column share a wiring (DLj) electrically connected to a terminal D. For example, the storage elements arranged in the first column (the storage elements 100b (1, 1) to 100b (m, 1)) share a wiring (DL1) electrically connected to a terminal D.

In FIG. 4A, storage elements arranged in the same column share a wiring (SLj) electrically connected to a terminal S. For example, the storage elements arranged in the first column (the storage elements 100b (1, 1) to 100b (m, 1)) share a wiring (SL1) electrically connected to a terminal S. Note that the wiring (SLj) electrically connected to the terminal S can be shared by all the storage elements included in the memory cell array.

In FIG. 4A, storage elements arranged in the same row share a wiring (WLi) electrically connected to a terminal W. For example, the storage elements arranged in the first row (the storage elements 100b (1, 1) to 100b (1, n)) share a wiring (WL1) electrically connected to a terminal W. The wiring (WLi) can also be referred to as a first word line.

In FIG. 4A, storage elements arranged in the same row share a wiring (CLi) electrically connected to a terminal C. For example, the storage elements arranged in the first row (the storage elements 100b (1, 1) to 100b (1, n)) share a wiring (CL1) electrically connected to a terminal C. The wiring (CLi) can also be referred to as a second word line.

However, without limitation to the above, a plurality of wirings (BLj), a plurality of wirings (DLj), and a plurality of wirings (SLj) may be provided in the storage elements arranged in the same column, and a plurality of wirings (WLi) and a plurality of wirings (CLi) may be provided in the storage elements arranged in the same row.

Figure 17:
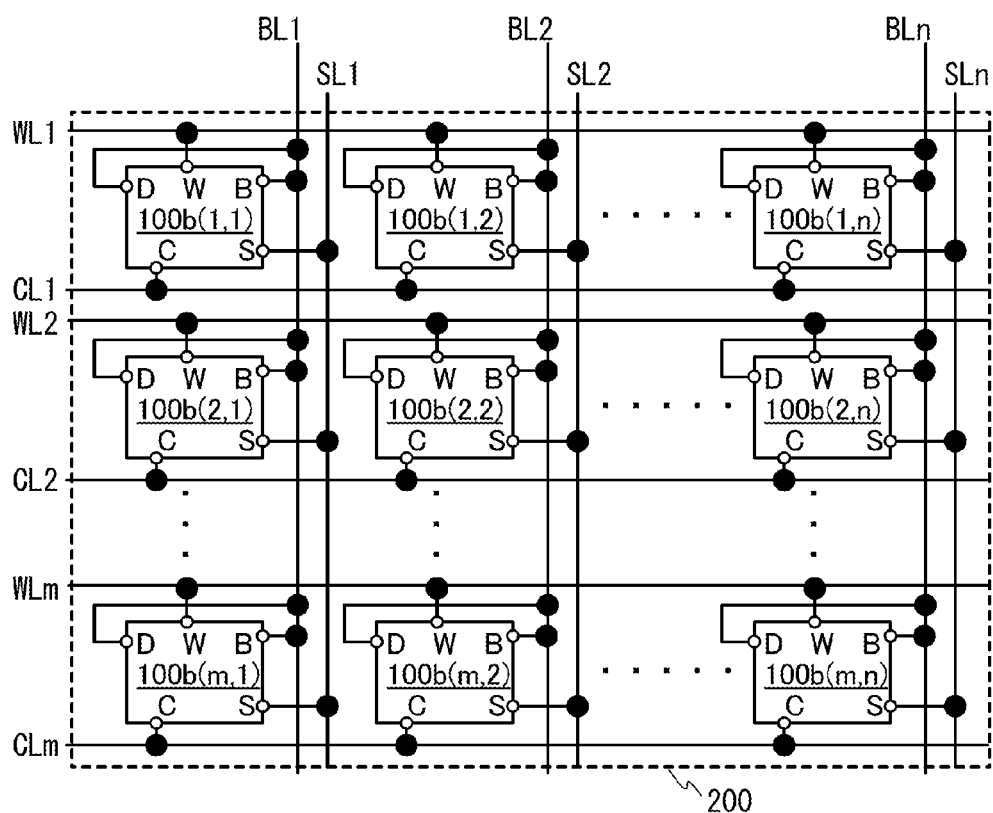
FIG. 17 illustrates a structure of a memory cell array.

It is also possible to share a wiring. Sharing of a wiring realizes miniaturization and higher integration of the memory cell array 200. For example, a wiring serving as both the wiring (BLj) and the wiring (DLj) can be used. Such a structure is illustrated in FIG. 17. In the memory cell array 200 illustrated in FIG. 17, the terminal D and the terminal B of the storage element 100b (i, j) are electrically connected to one wiring (BLj). The wiring (BLj) can also be referred to as a bit line.

In the memory cell array 200 illustrated in FIG. 4A or FIG. 17, data writing is selectively performed in the storage element (the storage element 100b (i, j)) of a row which is specified by a signal input to the wiring (WLi). Further, data reading is selectively performed in the storage element (the storage element 100b (i, j)) of a row which is specified by a signal input to the wiring (CLi). Specifically, among the storage elements electrically connected to the same wiring (BLj), the transistors 102 of storage elements other than the storage element from which data is to be read are turned off (regardless of the held data) by a signal input to the wiring (CLi). The method for data writing and data reading in a specified storage element is similar to that for the data writing and data reading in the temporary storage circuit 100B described in the above embodiment; thus, description thereof is omitted.

In the case of using the storage element 100b illustrated in FIG. 1B as the storage element 100b (i, j) included in the memory cell array 200, a reading circuit having the same structure as the reading circuit 110A illustrated in FIG. 2C can be used as a reading circuit for reading data from the memory cell array 200. Here, the wiring (BLj) of the memory cell array 200 is electrically connected to the input terminal (IN) of the reading circuit for reading data from the memory cell array 200.

(Structure 2 of Memory Cell Array)

FIG. 4B illustrates another embodiment of a memory cell array. In FIG. 4B, the memory cell array 200 includes m×n storage elements (a storage element 100c (i, j)). The storage element 100c illustrated in FIG. 1C can be used as each of the m×n storage elements (the storage element 100c (i, j)).

In FIG. 4B, storage elements arranged in the same column share a wiring (BLj) electrically connected to a terminal B. For example, the storage elements arranged in the first column (the storage elements 100c (1, 1) to 100c (m, 1)) share a wiring (BL1) electrically connected to a terminal B. The wiring (BLj) can also be referred to as a bit line.

In FIG. 4B, storage elements arranged in the same row share a wiring (WLi) electrically connected to a terminal W. For example, the storage elements arranged in the first row (the storage elements 100c (1, 1) to 100c (1, n)) share a wiring (WL1) electrically connected to a terminal W. The wiring (WLi) can also be referred to as a word line.

However, without limitation to the above, a plurality of wirings (BLj) may be provided in the storage elements arranged in the same column, and a plurality of wirings (WLi) may be provided in the storage elements arranged in the same row. In the m×n storage elements (the storage element 100c (i, j)), the terminals C may be electrically connected to the same electrode or wiring, or may be electrically connected to different electrodes or wirings.

In the memory cell array 200 illustrated in FIG. 4B, data writing and data reading are selectively performed in the storage element (the storage element 100c (i, j)) of a row which is specified by a signal input to the wiring (WLi). The method for data writing and data reading in a specified storage element is similar to that for the data writing and data reading in the temporary storage circuit 100C described in the above embodiment; thus, description thereof is omitted.

In the case of using the storage element 100c illustrated in FIG. 1C as the storage element 100c (i, j) included in the memory cell array 200, a reading circuit having the same structure as the reading circuit 110B illustrated in FIG. 2D can be used as a reading circuit for reading data from the memory cell array 200. Here, the wiring (BLj) of the memory cell array 200 is electrically connected to the input terminal (IN) of the reading circuit for reading data from the memory cell array 200.

(Structure 3 of Memory Cell Array)

FIG. 5A illustrates another embodiment of a memory cell array. In FIG. 5A, the memory cell array 200 includes m×n storage elements (a storage element 100b (i, j)). The storage element 100b illustrated in FIG. 1B can be used as each of the m×n storage elements (the storage element 100b (i, j)). Note that the memory cell array may include a plurality of memory cell arrays 200 illustrated in FIG. 5A.

In the structure illustrated in FIG. 5A, in a plurality of storage elements arranged in the same column in the memory cell array 200, the terminal S of one of adjacent storage elements is electrically connected to the terminal B of the other of the adjacent storage elements. In other words, in the plurality of storage elements arranged in the same column in the memory cell array 200, the transistors 102 are electrically connected in series. In this case, the wiring (SLj) can be electrically connected to one of the source and the drain of the transistor 102 at one end, among the transistors 102 connected in series, and the wiring (BLj) can be electrically connected to the other of the source and the drain of the transistor 102 at the other end. Here, among the transistors 102 connected in series, either sources or drains of the transistors 102 except the transistors 102 at the ends are electrically connected to the wiring (SLj) through the transistors 102 of other storage elements arranged in the same column. Further, among the transistors 102 connected in series, the rest of the sources and drains of the transistors 102 except the transistors 102 at the ends are electrically connected to the wiring (BLj) through the transistors 102 of other storage elements arranged in the same column.

In FIG. 5A, the plurality of storage elements whose transistors 102 are electrically connected in series are illustrated as a storage element group 200_j. Note that FIG. 5A illustrates, as an example, a structure of the memory cell array 200 in which the storage element group 200_j of a row is provided. Storage element groups 200_j may be provided in a matrix in the memory cell array 200.

In FIG. 5A, storage elements arranged in the same column share a wiring (BLj). For example, the storage elements arranged in the first column (the storage elements 100b (1, 1) to 100b (m, 1)) share a wiring (BL1). The wiring (BLj) can also be referred to as a bit line.

In FIG. 5A, storage elements arranged in the same column share a wiring (DLj) electrically connected to a terminal D. For example, the storage elements arranged in the first column (the storage elements 100b (1, 1) to 100b (m, 1)) share a wiring (DL1) electrically connected to a terminal D.

In FIG. 5A, storage elements arranged in the same column share a wiring (SLj). For example, the storage elements arranged in the first column (the storage elements 100b (1, 1) to 100b (m, 1)) share a wiring (SL1).

In FIG. 5A, storage elements arranged in the same row share a wiring (WLi) electrically connected to a terminal W. For example, the storage elements arranged in the first row (the storage elements 100b (1, 1) to 100b (1, n) share a wiring (WL1) electrically connected to a terminal W. The wiring (WLi) can also be referred to as a first word line.

In FIG. 5A, storage elements arranged in the same row share a wiring (CLi) electrically connected to a terminal C. For example, the storage elements arranged in the first row (the storage elements 100b (1, 1) to 100b (1, n)) share a wiring (CL1) electrically connected to a terminal C. The wiring (CLi) can also be referred to as a second word line.

However, without limitation to the above, a plurality of wirings (BLj), a plurality of wirings (DLj), and a plurality of wirings (SLj) may be provided in the storage elements arranged in the same column, and a plurality of wirings (WLi) and a plurality of wirings (CLi) may be provided in the storage elements arranged in the same row.

It is also possible to share a wiring. Sharing of a wiring realizes miniaturization and higher integration of the memory cell array 200. For example, a wiring serving as both the wiring (BLj) and the wiring (DLj) can be used. Such a structure is illustrated in FIG. 18B. In the memory cell array 200 illustrated in FIG. 18B, in the storage element (the storage element 100b (1, j)) positioned at one of both ends of the storage element group 200_j, the terminal D is electrically connected to the wiring (BLj), and the terminal B is electrically connected to the wiring (BLj) through a transistor 181 functioning as a switch. In the storage element (the storage element 100b (m, j)) positioned at the other of the both ends of the storage element group 200j, the terminal S is electrically connected to the wiring (SLj) through a transistor 182 functioning as a switch. Note that the transistor 182 may be omitted, so that the terminal S is electrically connected to the wiring (SLj) directly in the storage element (the storage element 100b (m, j)) positioned at the other of the both ends of the storage element group 200_j. In the storage elements except those at the both ends of the storage element group 200_j, a terminal F of one of adjacent storage elements is electrically connected to the terminal D of the other of the adjacent storage elements. Here, the terminal F is a terminal provided at a node which is electrically connected to the gate of the transistor 102, as illustrated in FIG. 18A. Therefore, the structure illustrated in FIG. 18B can be regarded as a structure in which the transistors 101 included in the storage element group 200_j are electrically connected in series. Here, the wiring (BLj) can also be referred to as a bit line.

In the memory cell array 200 illustrated in FIG. 5A, data writing is selectively performed in the storage element (the storage element 100b (i, j)) of a row which is specified by a signal input to the wiring (WLi). Further, data reading is selectively performed in the storage element (the storage element 100b (i, j)) of a row which is specified by a signal input to the wiring (CLi). Specifically, among the storage elements electrically connected to the same wiring (BLj), the transistors 102 of storage elements other than the storage element from which data is to be read are turned on (regardless of the held data) by a signal input to the wiring (CLi). The method for data writing and data reading in a specified storage element is similar to that for the data writing and data reading in the temporary storage circuit 100B described in the above embodiment; thus, description thereof is omitted.

In the memory cell array 200 illustrated in FIG. 18B, data writing is selectively performed in the storage element (the storage element 100b (i, j)) of a row which is specified by a signal input to the wiring (WLi). Specifically, data is sequentially written to the storage elements from the storage element on the side closer to the wiring (SLj). The transistors 101 of the storage element to which data is to be written and of all the storage elements provided on the side closer to the wiring (BLj) than the storage element are turned on by a signal input to the wiring (WLi). Further, the transistors 101 of all the storage elements provided on the side closer to the wiring (SLj) than the storage element to which data is to be written are turned off by a signal input to the wiring (WLi). In this manner, a signal potential corresponding to data is input from the wiring (BLj) to the storage element to which data is to be written. Note that the transistors 181 and 182 are in the off state while data is written. Further, data reading is selectively performed in the storage element (the storage element 100b (i, j)) of a row which is specified by a signal input to the wiring (CLi). Specifically, among the storage elements electrically connected to the same wiring (BLj), the transistors 102 of storage elements other than the storage element from which data is to be read are turned on (regardless of the held data) by a signal input to the wiring (CLi). Note that the transistors 181 and 182 are in the on state while data is read. The method for data writing and data reading in a specified storage element is similar to that for the data writing and data reading in the temporary storage circuit 100B described in the above embodiment; thus, description thereof is omitted.

In the case of using the storage element 100b illustrated in FIG. 1B or FIG. 18A as the storage element 100b (i, j) included in the memory cell array 200, a reading circuit having the same structure as the reading circuit 110A illustrated in FIG. 2C can be used as a reading circuit for reading data from the memory cell array 200. Here, the wiring (BLj) of the memory cell array 200 is electrically connected to the input terminal (IN) of the reading circuit for reading data from the memory cell array 200.

(Variations of Structure of Memory Cell Array)

Variations of the structure of the memory cell array will be described below.

The memory cell array 200 and the storage elements included in the memory cell array 200 may each further include a diode, a resistor, an inductor, an arithmetic circuit (arithmetic element), or a switch. As the arithmetic circuit (arithmetic element), a buffer, an inverter, a NAND circuit, a NOR circuit, a three-state buffer, a clocked inverter, or the like can be used. As the switch, an analog switch, a transistor, or the like can be used, for example. Alternatively, an arithmetic circuit (arithmetic element) to which either or both of a clock signal and an inverted signal of the clock signal are input can be used as the switch.

For example, the storage element 100d as illustrated in FIG. 5B may be used as each of the plurality of storage elements included in the memory cell array 200. The storage element 100d includes a diode 142 in addition to the structure of the storage element 100a illustrated in FIG. 1A. The other of the source and the drain of the transistor 102 is electrically connected to the terminal B through the diode 142.

For example, the storage element 100e as illustrated in FIG. 5C may be used as each of the plurality of storage elements included in the memory cell array 200. The storage element 100e includes a switch 140 in addition to the structure of the storage element 100a illustrated in FIG. 1A. The switch 140 can be formed using a transistor 141, for example.

A gate of the transistor 141 is electrically connected to a terminal X. The other of the source and the drain of the transistor 102 is electrically connected to the terminal B through the transistor 141. In the memory cell array 200 including the storage element 100e, even in the case of a structure in which the transistors 102 are electrically connected in series as illustrated in FIG. 5A, data can be selectively read from a storage element in a predetermined row by input of a control signal to the terminal X.

For example, the storage element 100f as illustrated in FIG. 5D may be used as each of the plurality of storage elements included in the memory cell array 200. The storage element 100f is an example in which a transistor including two gates, one of which is provided over an oxide semiconductor layer, and the other of which is provided below the oxide semiconductor layer, is used as the transistor 101 in the structure of the storage element 100a illustrated in FIG. 1A. FIG. 5D schematically illustrates a structure in which one of the gates of the transistor 101 is electrically connected to the terminal W, and the other of the gates is electrically connected to a terminal WB which is different from the terminal W.

This embodiment can be implemented in appropriate combination with any of the other embodiments.

Embodiment 4

In this embodiment, a storage device which includes a second reading circuit that reads data from the memory cell array 200, an x decoder, and a y decoder, in addition to the temporary storage circuit described in Embodiment 1, the reading circuit (hereinafter referred to as a first reading circuit) that reads data from the temporary storage circuit, which is described in Embodiment 2, and the memory cell array 200 including a plurality of storage elements, which is described in Embodiment 3, will be described.

Figure 3A:
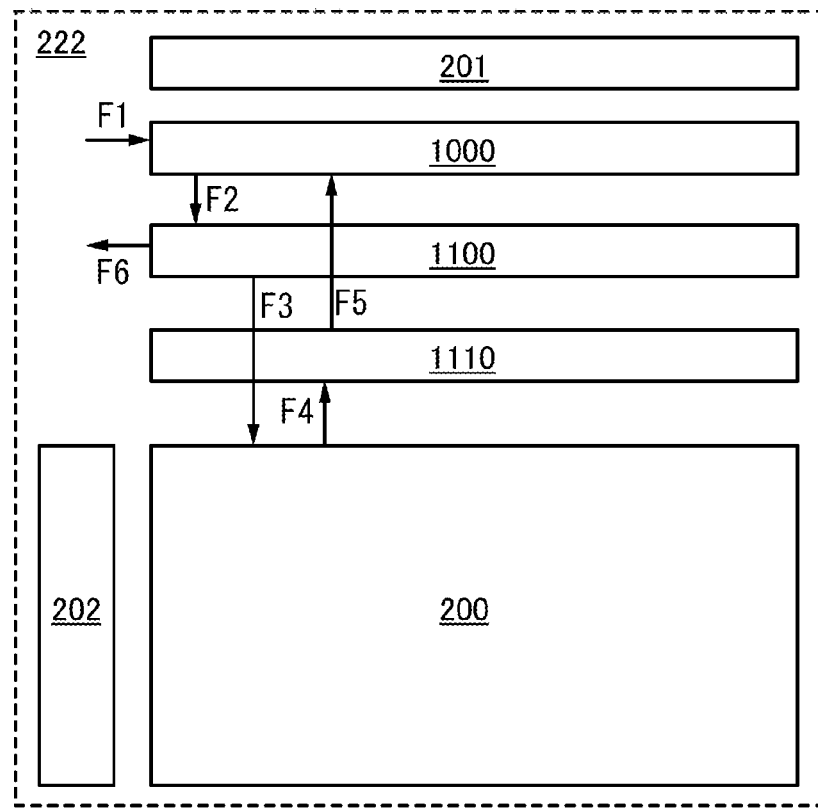
FIGS. 3A and 3B each illustrate a structure of a storage device.

FIG. 3A illustrates one embodiment of a storage device. In FIG. 3A, a storage device 222 includes a temporary storage circuit 1000, a first reading circuit 1100, a memory cell array 200, a second reading circuit 1110, an x decoder 202, and a y decoder 201.

As the temporary storage circuit 1000, any of the temporary storage circuits described in Embodiment 1 can be used. As the first reading circuit 1100, any of the reading circuits described in Embodiment 2 can be used. As the memory cell array 200, any of the memory cell arrays described in Embodiment 3 can be used. As the second reading circuit 1110, a reading circuit similar to any of the reading circuits described in Embodiment 2 can be used. As each of the x decoder 202 and the y decoder 201, a decoder having a known structure can be used. Note that the x decoder 202 and the y decoder 201 can also be referred to as a column decoder and a row decoder, respectively.

In the case where the temporary storage circuit 100A or the temporary storage circuit 100B is used as the temporary storage circuit 1000, the reading circuit 110A can be used as the first reading circuit 1100. In the case where the temporary storage circuit 100C is used as the temporary storage circuit 1000, the reading circuit 110B can be used as the first reading circuit 1100. In the case where the storage element 100b is used as each of the plurality of storage elements included in the memory cell array 200, the reading circuit 110A can be used as the second reading circuit 1110. In the case where the storage element 100c is used as each of the plurality of storage elements included in the memory cell array 200, the reading circuit 110B can be used as the second reading circuit 1110.

Figure 3B:
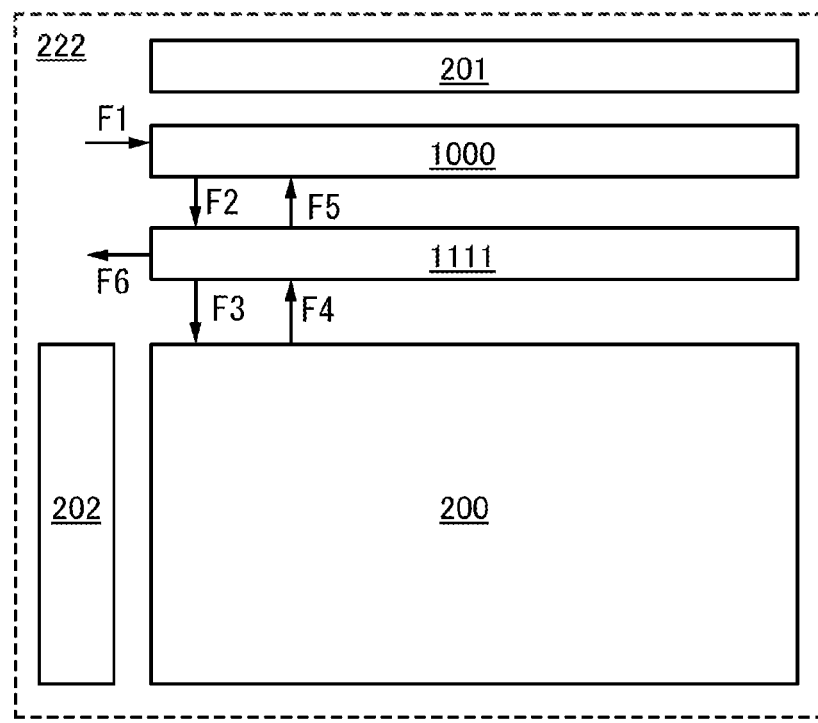

Note that in the case where the storage element included in the memory cell array 200 and the storage element included in the temporary storage circuit 1000 have the same structure, a reading circuit serving as both the first reading circuit 1100 and the second reading circuit 1110 can be used. FIG. 3B illustrates an example in which a single reading circuit serves as both the first reading circuit 1100 and the second reading circuit 1110 and is referred to as a reading circuit 1111.

(Driving Method of Storage Device)

Next, embodiments of a driving method of a storage device will be described.

(Driving Method of Storage Device 222 Shown in FIG. 3A)

When data is input to the storage device 222, the data is input to the temporary storage circuit 1000 (see arrow F1 in FIG. 3A), and held in the temporary storage circuit 1000. Then, data is read from the temporary storage circuit 1000 by the first reading circuit 1100 (see arrow F2 in FIG. 3A), and written to a memory cell specified by the x decoder 202 and the y decoder 201 among the plurality of storage elements (memory cells) included in the memory cell array 200 (see arrow F3 in FIG. 3A). Here, the x decoder 202 and the y decoder 201 can specify a plurality of memory cells at the same time. Hereinafter, a plurality of memory cells which are specified at the same time are referred to as a block.

The data stored in the memory cell (or block) which is specified by the x decoder 202 and the y decoder 201 among the memory cells included in the memory cell array 200 is read out by the second reading circuit 1110 (see arrow F4 in FIG. 3A), and the read data is input to the temporary storage circuit 1000 (see arrow F5 in FIG. 3A) to be held. The data held in the temporary storage circuit 1000 is read out by the first reading circuit 1100 (see arrow F2 in FIG. 3A) and output from the storage device (see arrow F6 in FIG. 3A).

The data stored in the memory cell (or block) which is specified by the x decoder 202 and the y decoder 201 among the memory cells included in the memory cell array 200 is read out by the second reading circuit 1110 (see arrow F4 in FIG. 3A), and the read data is input to the temporary storage circuit 1000 (see arrow F5 in FIG. 3A) to be held. The data held in the temporary storage circuit 1000 is read out by the first reading circuit 1100 (see arrow F2 in FIG. 3A) and written to another memory cell 25r (or another block) which is specified by the x decoder 202 and the y decoder 201 (see arrow F3 in FIG. 3A). In this manner, data can be copied in the memory cell array 200.

The data stored in the memory cell (or block) which is specified by the x decoder 202 and the y decoder 201 among the memory cells included in the memory cell array 200 is read out by the second reading circuit 1110 (see arrow F4 in FIG. 3A), and the read data is input to the temporary storage circuit 1000 (see arrow F5 in FIG. 3A) to be held. The data held in the temporary storage circuit 1000 is read out by the first reading circuit 1100 (see arrow F2 in FIG. 3A) and written to the same memory cell (or the same block) which is specified by the x decoder 202 and the y decoder 201 (see arrow F3 in FIG. 3A). In this manner, data can be rewritten (refreshed) in the memory cell array 200.

The above is the driving method of the storage device 222 in FIG. 3A. Note that the data read from the memory cell array 200 by the second reading circuit 1110 may be output to the outside without being input to the temporary storage circuit 1000.

(Driving Method of Storage Device 222 Shown in FIG. 3B)

When data is input to the storage device 222, the data is input to the temporary storage circuit 1000 (see arrow F1 in FIG. 3B), and held in the temporary storage circuit 1000. Then, data is read from the temporary storage circuit 1000 by the reading circuit 1111 (see arrow F2 in FIG. 3B), and written to a memory cell specified by the x decoder 202 and the y decoder 201 among the plurality of storage elements (memory cells) included in the memory cell array 200 (see arrow F3 in FIG. 3B). Here, the x decoder 202 and the y decoder 201 can specify a plurality of memory cells at the same time. Hereinafter, a plurality of memory cells which are specified at the same time are referred to as a block.

The data stored in the memory cell (or block) which is specified by the x decoder 202 and the y decoder 201 among the memory cells included in the memory cell array 200 is read out by the reading circuit 1111 (see arrow F4 in FIG. 3B), and the read data is input to the temporary storage circuit 1000 (see arrow F5 in FIG. 3B) to be held. The data held in the temporary storage circuit 1000 is read out by the reading circuit 1111 (see arrow F2 in FIG. 3B) and output from the storage device (see arrow F6 in FIG. 3B).

The data stored in the memory cell (or block) which is specified by the x decoder 202 and the y decoder 201 among the memory cells included in the memory cell array 200 is read out by the reading circuit 1111 (see arrow F4 in FIG. 3B), and the read data is input to the temporary storage circuit 1000 (see arrow F5 in FIG. 3B) to be held. The data held in the temporary storage circuit 1000 is read out by the reading circuit 1111 (see arrow F2 in FIG. 3B) and written to another memory cell (or another block) which is specified by the x decoder 202 and the y decoder 201 (see arrow F3 in FIG. 3B). In this manner, data can be copied in the memory cell array 200.

The data stored in the memory cell (or block) which is specified by the x decoder 202 and the y decoder 201 among the memory cells included in the memory cell array 200 is read out by the reading circuit 1111 (see arrow F4 in FIG. 3B), and the read data is input to the temporary storage circuit 1000 (see arrow F5 in FIG. 3B) to be held. The data held in the temporary storage circuit 1000 is read out by the reading circuit 1111 (see arrow F2 in FIG. 3B) and written to the same memory cell (or the same block) which is specified by the x decoder 202 and the y decoder 201 (see arrow F3 in FIG. 3B). In this manner, data can be rewritten (refreshed) in the memory cell array 200.

The above is the driving method of the storage device 222 in FIG. 3B. Note that the data read from the memory cell array 200 by the reading circuit 1111 may be output to the outside without being input to the temporary storage circuit 1000.

This embodiment can be implemented in appropriate combination with any of the other embodiments.

Embodiment 5

In this embodiment, a structure of a signal processing circuit including the storage device described in Embodiment 4 will be described.

Figure 16:
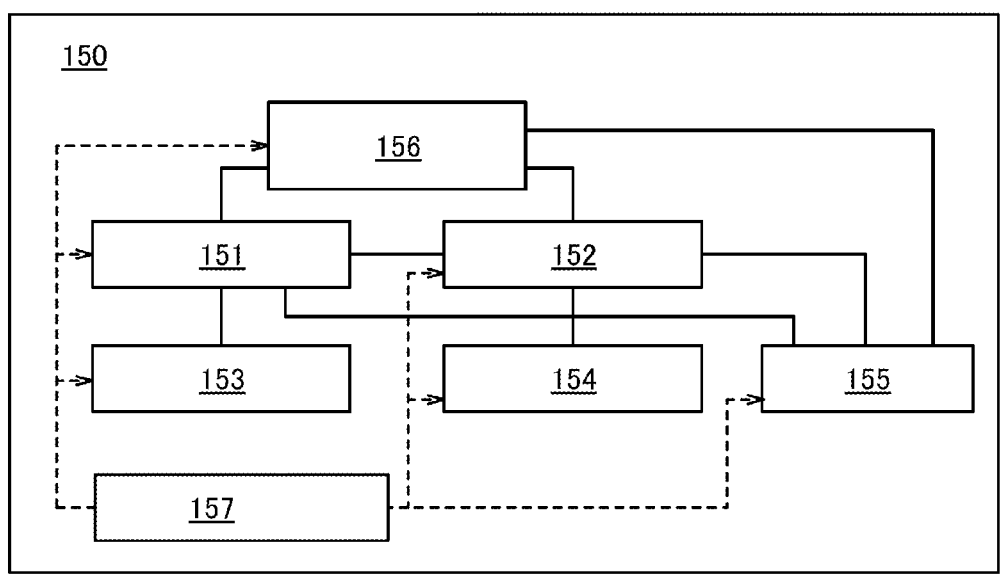
FIG. 16 is a block diagram of a signal processing circuit.

FIG. 16 illustrates an example of a signal processing circuit according to one embodiment of the present invention. The signal processing circuit includes at least one or more arithmetic circuits and one or more storage devices (e.g., registers or main memories). Specifically, a signal processing circuit 150 in FIG. 16 includes an arithmetic circuit 151, an arithmetic circuit 152, a register 153, a register 154, a main memory 155, a control device 156, and a power supply control circuit 157.

The arithmetic circuits 151 and 152 each include, as well as a logic circuit which carries out simple logic arithmetic processing, an adder, a multiplier, and various arithmetic circuits. The register 153 is a storage device for temporarily holding data when the logical operation is performed in the arithmetic circuit 151. The register 154 is a storage device for temporarily holding data when the logical operation is performed in the arithmetic circuit 152.

In addition, the main memory 155 can store a program executed by the control device 156 as data or can store data from the arithmetic circuit 151 and the arithmetic circuit 152.

The control device 156 is a circuit which collectively controls operations of the arithmetic circuit 151, the arithmetic circuit 152, the register 153, the register 154, and the main memory 155 included in the signal processing circuit 150. Note that in FIG. 16, the control device 156 is provided as part of the signal processing circuit 150; however, the control device 156 may be provided outside the signal processing circuit 150.

With the use of the temporary storage circuit in Embodiment 1 or the storage device in Embodiment 4 for the main memory 155, data can be held even after supply of power supply voltage to the main memory 155 is stopped. Thus, power consumption of the signal processing circuit 150 can be suppressed. In addition, after the supply of power supply voltage is restarted, the storage element can return to the state before the supply of power supply voltage is stopped in a short time.

In addition, as well as stop of the supply of the power supply voltage to the main memory 155, the supply of the power supply voltage to the control circuit or the arithmetic circuit which exchanges data with the main memory 155 may be stopped.

The power supply control circuit 157 controls the level of power supply voltage which is supplied to the arithmetic circuit 151, the arithmetic circuit 152, the register 153, the register 154, the main memory 155, and the control device 156 included in the signal processing circuit 150. Further, in the case where the supply of the power supply voltage is stopped, a switching element for stopping the supply of the power supply voltage may be provided for the power supply control circuit 157, or for each of the arithmetic circuit 151, the arithmetic circuit 152, the main memory 155, and the control device 156. In the latter case, the power supply control circuit 157 is not necessarily provided in the signal processing circuit according to the present invention.

A storage device which functions as a cache memory may be provided between the main memory 155 and each of the arithmetic circuit 151, the arithmetic circuit 152, and the control device 156. By providing the cache memory, low-speed access to the main memory can be reduced and the speed of the signal processing such as arithmetic processing can be higher. By applying the temporary storage circuit described in Embodiment 1 or the storage device described in Embodiment 4 also to the storage device functioning as a cache memory, power consumption of the signal processing circuit 150 can be suppressed. In addition, after the supply of the power supply voltage is resumed, the storage element can return to the state same as that before the power supply voltage is stopped in a short time.

This embodiment can be implemented in appropriate combination with any of the above embodiments.

Embodiment 6

A manufacturing method of the storage element 100*b* illustrated in FIG. 1B will be described. The case where a transistor whose channel is formed in silicon is used as the transistor 102 is described as an example. In this embodiment, manufacturing methods of the transistor 102, the transistor 101 whose channel is formed in an oxide semiconductor layer, and the capacitor 103 will be described as examples for the explanation of the manufacturing method of the storage element 100*b*.

Note that the transistor 101 and the transistor 102 in the storage element 100*a* can be formed as in the transistor 101 and the transistor 102 in the storage element 100*b*. The transistor 104 and the capacitor 105 in the storage element 100*c* can be formed as in the transistor 101 and the capacitor 103 in the storage element 100*b*.

Further, the other transistors and capacitors included in the temporary storage circuit can be manufactured as in the transistor 101, the transistor 102, and the capacitor 103 in the storage element 100*b*. The transistors and capacitors included in the reading circuit can also be manufactured as in the transistor 101, the transistor 102, and the capacitor 103 in the storage element 100*b*. The transistors and capacitors included in the memory cell array can also be manufactured as in the transistor 101, the transistor 102, and the capacitor 103 in the storage element 100*b*.

Figure 6A:
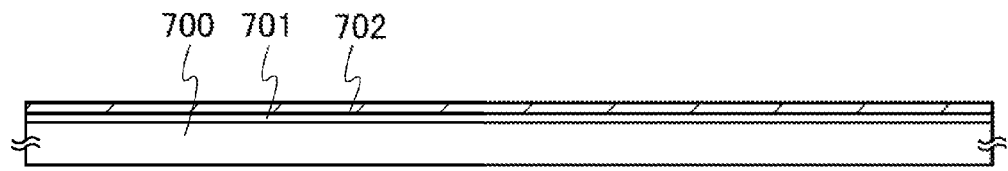
FIGS. 6A to 6D illustrate manufacturing steps of a storage element.

First, as illustrated in FIG. 6A, an insulating film 701 and a semiconductor film 702 that is separated from a single crystal semiconductor substrate are formed over a substrate 700.

Although there is no particular limitation on a material which can be used as the substrate 700, it is necessary that the material have at least heat resistance high enough to withstand heat treatment to be performed later. For example, a glass substrate formed by a fusion process or a float process, a quartz substrate, a semiconductor substrate, a ceramic substrate, or the like can be used as the substrate 700. In the case where the temperature of the heat treatment to be performed later is high, a glass substrate whose strain point is 730° C. or higher is preferably used as a glass substrate.

In this embodiment, a method for forming the transistor 102 will be described below taking, as an example, the case where the semiconductor film 702 is formed using single crystal silicon. Note that a specific example of a method for forming the single crystal semiconductor film 702 is briefly described. First, an ion beam including ions which are accelerated by an electric field enters a bond substrate which is the single crystal semiconductor substrate and a fragile layer which is fragile because of local disorder of the crystal structure is formed in a region at a certain depth from a surface of the bond substrate. The depth at which the fragile layer is formed can be adjusted by the acceleration energy of the ion beam and the angle at which the ion beam enters. Then, the bond substrate and the substrate 700 which is provided with the insulating film 701 are attached to each other so that the insulating film 701 is sandwiched therebetween. After the bond substrate and the substrate 700 overlap with each other, a pressure of approximately 1 N/cm$^2$ to 500 N/cm$^2$, preferably 11 N/cm$^2$ to 20 N/cm$^2$ is applied to part of the bond substrate and part of the substrate 700 so that the substrates are attached to each other. When the pressure is applied, bonding between the bond substrate and the insulating film 701 starts from the portion, which results in bonding of the entire surface where the bond substrate and the insulating film 701 are in close contact with each other. Subsequently, heat treatment is performed, whereby very small voids that exist in the fragile layer are combined, so that the very small voids increase in volume. Accordingly, a single crystal semiconductor film which is part of the bond substrate is separated from the bond substrate along the fragile layer. The heat treatment is performed at a temperature not exceeding the strain point of the substrate 700. Then, the single crystal semiconductor film is processed into a desired shape by etching or the like, so that the semiconductor film 702 can be formed.

In order to control the threshold voltage, an impurity element imparting p-type conductivity, such as boron, aluminum, or gallium, or an impurity element imparting n-type conductivity, such as phosphorus or arsenic, may be added to the semiconductor film 702. An impurity element for controlling the threshold voltage may be added to the semiconductor film which is not etched to have a predetermined shape or may be added to the semiconductor film 702 which is etched to have a predetermined shape. Alternatively, the impurity element for controlling the threshold voltage may be added to the bond substrate. Alternatively, the impurity element may be added to the bond substrate in order to roughly control the threshold voltage, and the impurity element may be further added to the semiconductor film which is not etched to have a predetermined shape or the semiconductor film 702 which is etched to have a predetermined shape in order to finely control the threshold voltage.

Note that although an example in which a single crystal semiconductor film is used is described in this embodiment, the present invention is not limited to this structure. For example, a polycrystalline, microcrystalline, or amorphous semiconductor film which is formed over the insulating film 701 by vapor deposition may be used. Alternatively, the semiconductor film may be crystallized by a known technique. As the known technique of crystallization, a laser crystallization method using a laser beam and a crystallization method using a catalytic element are given. Alternatively, a crystallization method using a catalytic element and a laser crystallization method may be combined. In the case of using a heat-resistant substrate such as a quartz substrate, it is possible to combine any of the following crystallization methods: a thermal crystallization method using an electrically heated oven, a lamp heating crystallization method using infrared light, a crystallization method using a catalytic element, and a high-temperature heating method at approximately 950° C.

Figure 6B:
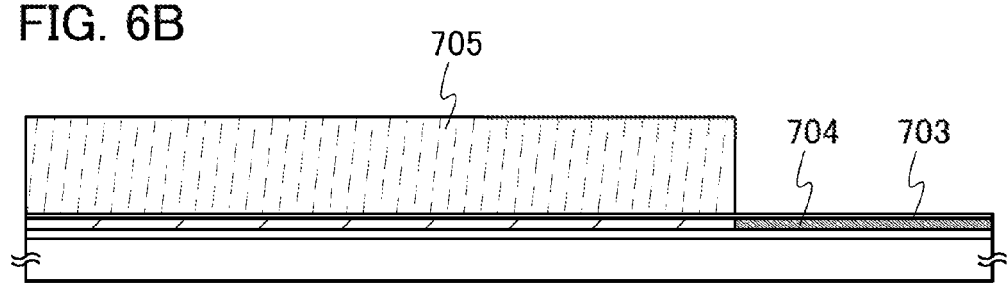

Next, as illustrated in FIG. 6B, a gate insulating film 703 is formed over the semiconductor film 702. Then, a mask 705 is formed over the gate insulating film 703 and an impurity element imparting conductivity is added to part of the semiconductor film 702, so that an impurity region 704 is formed.

The gate insulating film 703 can be formed by oxidation or nitriding of a surface of the semiconductor film 702 by high-density plasma treatment, heat treatment, or the like. The high-density plasma treatment is performed, for example, by using a mixed gas of an inert gas such as He, Ar, Kr, or Xe, and oxygen, nitrogen oxide, ammonia, nitrogen, hydrogen, or the like. In this case, by exciting plasma by introduction of microwaves, plasma with a low electron temperature and high density can be generated. By oxidation or nitriding of the surface of the semiconductor film with oxygen radicals (including OH radicals in some cases) or nitrogen radicals (including NH radicals in some cases) generated by such high-density plasma, an insulating film with a thickness of 1 nm to 20 nm, preferably 5 nm to 10 nm can be formed so as to be in contact with the semiconductor film. For example, nitrous oxide ($N_2O$) is diluted with Ar by 1 to 3 times (flow rate) and a microwave (2.45 GHz) electric power of 3 kW to 5 kW is applied with a pressure of 10 Pa to 30 Pa so that the oxidation or nitriding of the surface of the semiconductor film 702 is performed. By this treatment, an insulating film having a thickness of 1 nm to 10 nm (preferably 2 nm to 6 nm) is formed. Further, nitrous oxide ($N_2O$) and silane ($SiH_4$) are introduced and a microwave (2.45 GHz) electric power of 3 kW to 5 kW is applied with a pressure of 10 Pa to 30 Pa so that a silicon oxynitride film is formed by vapor deposition, thereby forming a gate insulating film. With a combination of a solid-phase reaction and a reaction by a vapor deposition method, the gate insulating film with low interface state density and excellent withstand voltage can be formed.

The oxidation or nitriding of the semiconductor film by the high-density plasma treatment proceeds by solid-phase reaction. Thus, interface state density between the gate insulating film 703 and the semiconductor film 702 can be extremely low. Further, by direct oxidation or nitriding of the semiconductor film 702 by high-density plasma treatment, variation in the thickness of the insulating film to be formed can be suppressed. Moreover, in the case where the semiconductor film has crystallinity, the surface of the semiconductor film is oxidized with solid reaction by the high-density plasma treatment to restrain fast oxidation only in a crystal grain boundary; therefore, the gate insulating film with uniformity and low interface state density can be formed. Variations in the characteristics of a transistor whose gate insulating film partly or entirely includes an insulating film formed by high-density plasma treatment can be suppressed.

The gate insulating film 703 may be formed using a single layer or a stack of layers of a film including silicon oxide, silicon nitride oxide, silicon oxynitride, silicon nitride, hafnium oxide, aluminum oxide, tantalum oxide, yttrium oxide, hafnium silicate ($HfSi_xO_y$, ($x>0$, $y>0$)), hafnium silicate ($HfSi_xO_y$, ($x>0$, $y>0$)) to which nitrogen is added, hafnium aluminate ($HfAl_xO_y$, ($x>0$, $y>0$)) to which nitrogen is added, or the like by plasma-enhanced CVD, sputtering, or the like.

Also, in this specification, an oxynitride compound denotes a material containing a higher quantity of oxygen than that of nitrogen, and a nitride oxide compound denotes a material containing a higher quantity of nitrogen than that of oxygen.

The thickness of the gate insulating film 703 can be, for example, greater than or equal to 1 nm and less than or equal to 100 nm, preferably greater than or equal to 10 nm and less than or equal to 50 nm. In this embodiment, a single-layer insulating film containing silicon oxide is formed as the gate insulating film 703 by plasma-enhanced CVD.

Figure 6C:
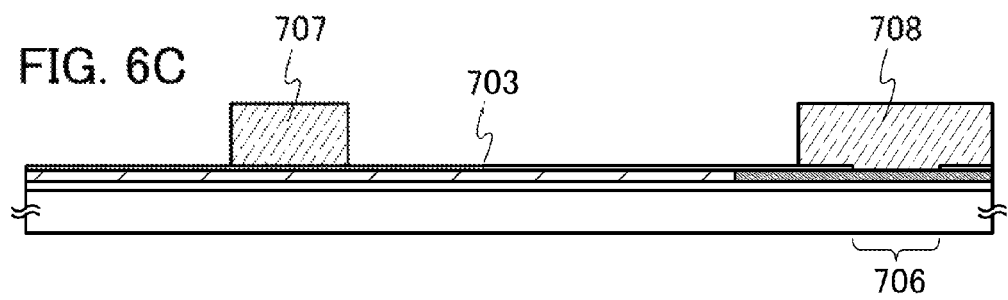

Then, after the mask 705 is removed, part of the gate insulating film 703 is removed as illustrated in FIG. 6C and an opening 706 is formed in a region overlapping with the impurity region 704 by etching or the like. After that, a gate electrode 707 and a conductive film 708 are formed.

A conductive film is formed so as to cover the opening 706 and then is processed into a predetermined shape, so that the gate electrode 707 and the conductive film 708 can be formed. The conductive film 708 is in contact with the impurity region 704 in the opening 706. The conductive film can be formed by CVD, sputtering, vapor deposition, spin coating, or the like. For the conductive film, tantalum (Ta), tungsten (W), titanium (Ti), molybdenum (Mo), aluminum (Al), copper (Cu), chromium (Cr), niobium (Nb), or the like can be used. Moreover, an alloy containing the above-described metal as the main component or a compound containing the above-described metal may be used. Alternatively, the conductive film may be formed using a semiconductor such as polycrystalline silicon doped with an impurity element such as phosphorus which imparts conductivity to the semiconductor film.

Note that although the gate electrode 707 and the conductive film 708 are formed using a single-layer conductive film in this embodiment, this embodiment is not limited to this structure. The gate electrode 707 and the conductive film 708 may be formed of a plurality of stacked conductive films.

As a combination of two conductive films, tantalum nitride or tantalum can be used for a first conductive film and tungsten can be used for a second conductive film. Besides, the following combinations are given: tungsten nitride and tungsten, molybdenum nitride and molybdenum, aluminum and tantalum, aluminum and titanium, and the like. Since tungsten and tantalum nitride have high heat resistance, a heat treatment aimed at thermal activation can be performed in subsequent steps after forming the two conductive films. Alternatively, as the combination of the two conductive films, for example, nickel silicide and silicon doped with an impurity element which imparts n-type conductivity, tungsten silicide and silicon doped with an impurity element which imparts n-type conductivity, or the like can be used.

In the case of using a three-layer structure which is stacked with more than three conductive films, a stacked structure of a molybdenum film, an aluminum film, and a molybdenum film is preferable.

A light-transmitting oxide conductive film of indium oxide, indium oxide-tin oxide, indium oxide-zinc oxide, zinc oxide, zinc aluminum oxide, zinc aluminum oxynitride, zinc gallium oxide, or the like can be used as the gate electrode 707 and the conductive film 708.

Alternatively, the gate electrode 707 and the conductive film 708 may be selectively formed by a droplet discharge method without the use of a mask. A droplet discharge method is a method for forming a predetermined pattern by discharge or ejection of a droplet containing a predetermined composition from an orifice, and includes an inkjet method in its category.

In addition, the gate electrode 707 and the conductive film 708 may be formed by forming a conductive film, and the conductive film is etched by inductively coupled plasma (ICP) etching under appropriately controlled conditions (e.g., the amount of electric power applied to a coiled electrode layer, the amount of electric power applied to an electrode layer on the substrate side, and the electrode temperature on the substrate side) to have a desired tapered shape. In addition, angles and the like of the tapered shapes may also be controlled by a shape of a mask. Note that as an etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

Figure 6D:
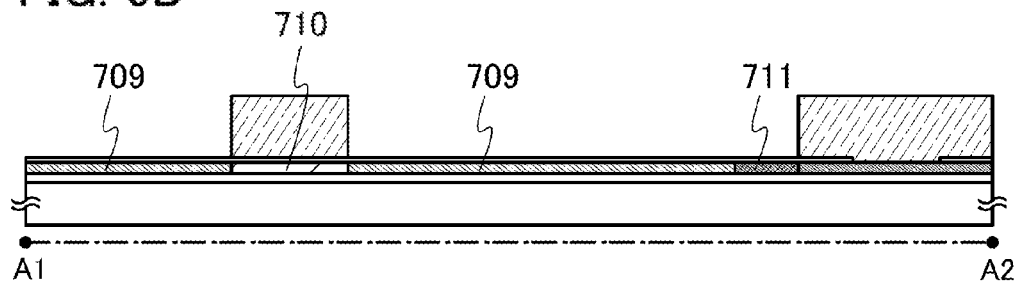

Next, as illustrated in FIG. 6D, when an impurity element which imparts one conductivity is added to the semiconductor film 702 with the gate electrode 707 and the conductive film 708 used as masks, a channel formation region 710 overlapping with the gate electrode 707, a pair of impurity regions 709 between which the channel formation region 710 is interposed, and an impurity region 711 obtained by further addition of an impurity element to part of the impurity region 704 are formed in the semiconductor film 702.

In this embodiment, the case where an impurity element which imparts p-type conductivity (e.g., boron) is added to the semiconductor film 702 is described.

Figure 7A:
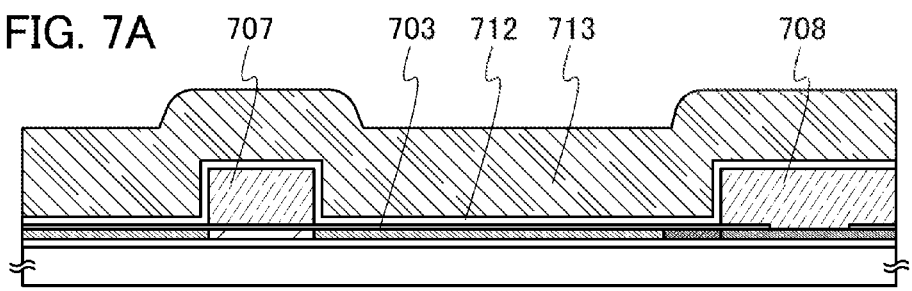
FIGS. 7A to 7C illustrate manufacturing steps oldie storage element.

Next, as illustrated in FIG. 7A, insulating films 712 and 713 are formed so as to cover the gate insulating film 703, the gate electrode 707, and the conductive film 708. Specifically, an inorganic insulating film of silicon oxide, silicon nitride, silicon nitride oxide, silicon oxynitride, aluminum nitride, aluminum nitride oxide, or the like can be used as the insulating films 712 and 713. In particular, the insulating films 712 and 713 are preferably formed using a low dielectric constant (low-k) material because capacitance due to overlapping of electrodes or wirings can be sufficiently reduced. Note that a porous insulating film including such a material may be employed as the insulating films 712 and 713. Since the porous insulating film has lower dielectric constant than a dense insulating layer, parasitic capacitance due to electrodes or wirings can be further reduced.

In this embodiment, an example in which silicon oxynitride is used for the insulating film 712 and silicon nitride oxide is used for the insulating film 713 is described. In addition, in this embodiment, although the insulating films 712 and 713 are formed over the gate electrode 707 and the conductive film 708, according to one embodiment of the present invention, only one insulating film may be formed over the gate electrode 707 and the conductive film 708, or three or more insulating films may be stacked.

Figure 7B:
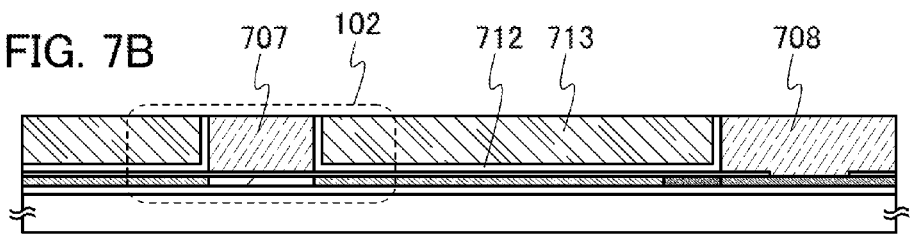

Next, as illustrated in FIG. 7B, the insulating films 712 and 713 are subjected to CMP (chemical mechanical polishing) treatment or etching, so that surfaces of the gate electrode 707 and the conductive film 708 are exposed. Note that in order to improve the characteristics of the transistor 101 which is formed later, surfaces of the insulating films 712 and 713 are preferably flattened as much as possible.

Through the above process, the transistor 102 can be formed.

Figure 7C:
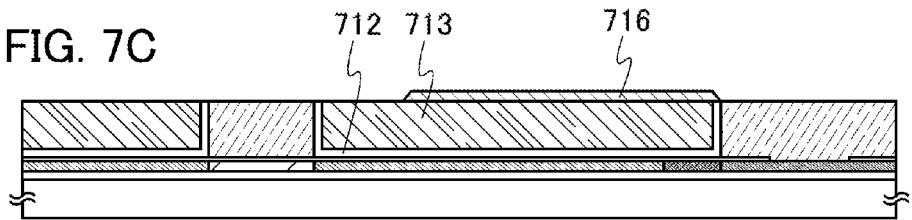

Next, a method for forming the transistor 101 is described. First, as illustrated in FIG. 7C, an oxide semiconductor layer 716 is formed over the insulating film 712 or the insulating film 713.

The oxide semiconductor layer 716 can be formed by processing an oxide semiconductor film formed over the gate insulating films 712 and 713 into a desired shape. The thickness of the oxide semiconductor film is greater than or equal to 2 nm and less than or equal to 200 nm, preferably greater than or equal to 3 nm and less than or equal to 50 nm, more preferably greater than or equal to 3 nm and less than or equal to 20 nm. The oxide semiconductor film is formed by a sputtering method using an oxide semiconductor target. Moreover, the oxide semiconductor film can be formed by a sputtering method under a rare gas (e.g., argon) atmosphere, an oxygen atmosphere, or a mixed atmosphere of a rare gas (e.g., argon) and oxygen.

Note that before the oxide semiconductor film is formed by a sputtering method, dust on surfaces of the insulating films 712 and 713 is preferably removed by reverse sputtering in which an argon gas is introduced and plasma is generated. The reverse sputtering refers to a method in which, without application of voltage to a target side, an RF power source is used for application of voltage to a substrate side in an argon atmosphere to generate plasma in the vicinity of the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Alternatively, an argon atmosphere to which chlorine, carbon tetrafluoride, or the like is added may be used.

The oxide semiconductor layer includes at least one element selected from In, Ga, Sn, and Zn. For example, a four-component metal oxide such as an In—Sn—Ga—Zn—O-based oxide semiconductor, a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor, a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor, a Single-component metal oxide such as an In—O-based oxide semiconductor, a Sn—O-based oxide semiconductor, or a Zn—O-based oxide semiconductor, or the like can be used. In addition, any of the above oxide semiconductors may contain an element other than In, Ga, Sn, and Zn, for example, $SiO_2$.

For example, an In—Ga—Zn—O-based oxide semiconductor means an oxide film containing indium (In), gallium (Ga), and zinc (Zn), and there is no limitation on the composition ratio thereof.

For the oxide semiconductor layer, a thin film expressed by a chemical formula of $InMO_3(ZnO)_m$ (m>0) can be used. Here, M represents one or more metal elements selected from Zn, Ga, Al, Mn, and Co. For example, M can be Ga, Ga and Al, Ga and Mn, Ga and Co, or the like.

When an In—Zn—O based material is used as an oxide semiconductor, a target to be used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), more preferably In:Zn=15:1 to 1.5:1 in an atomic ratio ($In_2O_3$:ZnO=15:2 to 3:4 to in a molar ratio). For example, in a target used for formation of an In—Zn—O-based oxide semiconductor which has an atomic ratio of In:Zn:O=X:Y:Z, the relation of Z>1.5×X+Y is satisfied.

In this embodiment, as the oxide semiconductor film, an In—Ga—Zn—O-based oxide semiconductor thin film with a thickness of 30 nm, which is obtained by a sputtering method using a target including indium (In), gallium (Ga), and zinc (Zn), is used. As the target, a target having a composition ratio of In:Ga:Zn=1:1:0.5, In:Ga:Zn=1:1:1, or In:Ga:Zn=1:1:2 can be used, for example. The filling rate of the target including In, Ga, and Zn is higher than or equal to 90% and lower than or equal to 100%, preferably higher than or equal to 95° A) and lower than 100%. With the use of the target with high filling rate, a dense oxide semiconductor film is formed.

In this embodiment, the oxide semiconductor film is deposited in such a manner that the substrate is held in a treatment chamber kept in a reduced pressure state, moisture remaining in the treatment chamber is removed, a sputtering gas from which hydrogen and moisture are removed is introduced, and the target is used. The substrate temperature in film formation may be higher than or equal to 100° C. and lower than or equal to 600° C., preferably higher than or equal to 200° C. and lower than or equal to 400° C. By forming the oxide semiconductor film in a state where the substrate is heated, the concentration of impurities included in the formed oxide semiconductor film can be reduced. In addition, damage by sputtering can be reduced. In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with the cryopump, for example, a hydrogen atom, a compound containing a hydrogen atom, such as water ($H_2O$), (more preferably, also a compound containing a carbon atom), and the like are removed, whereby the impurity concentration in the oxide semiconductor film formed in the treatment chamber can be reduced.

As one example of the deposition condition, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulsed direct-current (DC) power supply is preferable because dust generated in deposition can be reduced and the film thickness can be made uniform.

Moreover, when the leakage rate of the treatment chamber of the sputtering apparatus is set to lower than or equal to $1×10^{-10}$ $Pa·m^3$/second, entry of impurities such as an alkali metal or hydride into the oxide semiconductor film that is being formed by a sputtering method can be reduced. Further, with the use of an entrapment vacuum pump as an exhaustion system, counter flow of impurities, such as alkali metal, hydrogen atoms, hydrogen molecules, water, a hydroxyl group, or hydride, from the exhaustion system can be reduced.

When the purity of the target is set to 99.99% or higher, alkali metal, hydrogen atoms, hydrogen molecules, water, a hydroxyl group, hydride, or the like mixed to the oxide semiconductor film can be reduced. In addition, when the target is used, the concentration of alkali metal such as lithium, sodium, or potassium can be reduced in the oxide semiconductor film.

In order that the oxide semiconductor film contains as little hydrogen, a hydroxyl group, and moisture as possible, it is preferable that impurities adsorbed on the substrate 700, such as moisture and hydrogen, be eliminated and removed by preheating the substrate 700, over which films up to the insulating films 712 and 713 are formed, in a preheating chamber of a sputtering apparatus, as a pretreatment for film formation. The temperature for the preheating is higher than or equal to 100° C. and lower than or equal to 400° C., preferably higher than or equal to 150° C. and lower than or equal to 300° C. As an evacuation means, a cryopump is preferably provided in the preheating chamber. Note that this preheating treatment can be omitted. This preheating may be similarly performed on the substrate 700 over which conductive films 719 and 720 are formed before the formation of a gate insulating film 721.

Note that etching for forming the oxide semiconductor layer 716 may be dry etching, wet etching, or both dry etching and wet etching. As an etching gas used for dry etching, a gas containing chlorine (a chlorine-based gas such as chlorine ($O_2$), boron trichloride ($BCl_3$), silicon tetrachloride ($SiCl_4$), or carbon tetrachloride ($CCl_4$)) is preferably used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, a parallel plate RIE (reactive ion etching) method or an ICP (inductively coupled plasma) etching method can be used. In order to etch the film to have a desired shape, the etching conditions (e.g., the amount of electric power applied to a coiled electrode, the amount of electric power applied to an electrode on the substrate side, and the electrode temperature on the substrate side) are adjusted as appropriate.

As an etchant used for the wet etching, a mixed solution of phosphoric acid, acetic acid, and nitric acid, or organic acid such as citric acid or oxalic acid can be used. In this embodiment, ITO-07N (produced by KANTO CHEMICAL CO., INC.) is used.

A resist mask used for forming the oxide semiconductor layer 716 may be formed by an inkjet method. Formation of the resist mask by an inkjet method needs no photomask; thus, manufacturing cost can be reduced.

Note that it is preferable that reverse sputtering be performed before the formation of a conductive film in a subsequent step to remove a resist residue or the like left over surfaces of the oxide semiconductor layer 716 and the insulating films 712 and 713.

Note that the oxide semiconductor film deposited by sputtering or the like contains a large amount of moisture or hydrogen (including a hydroxyl group) as an impurity in some cases. Moisture or hydrogen easily forms donor levels and thus serves as an impurity in the oxide semiconductor. Therefore, in one embodiment of the present invention, in order to reduce impurities such as moisture and hydrogen in the oxide semiconductor film (dehydration or dehydrogenation), the oxide semiconductor layer 716 is subjected to heat treatment in a reduced-pressure atmosphere, an inert gas atmosphere of nitrogen, a rare gas, or the like, an oxygen gas atmosphere, or an ultra dry air atmosphere (the moisture amount is 20 ppm (−55° C. by conversion into a dew point) or less, preferably 1 ppm or less, further preferably 10 ppb or less, in the case where the measurement is performed by a dew point meter in a cavity ring down laser spectroscopy (CRDS) method).

By performing heat treatment on the oxide semiconductor layer 716, moisture or hydrogen in the oxide semiconductor layer 716 can be eliminated. Specifically, heat treatment may be performed at a temperature higher than or equal to 250° C. and lower than or equal to 750° C., preferably higher than or equal to 400° C. and lower than the strain point of a substrate. For example, the heat treatment may be performed at 500° C. for approximately 3 minutes to 6 minutes. When RTA is used for the heat treatment, dehydration or dehydrogenation can be performed in a short time; thus, treatment can be performed even at a temperature higher than the strain point of a glass substrate.

In this embodiment, an electrical furnace that is one of heat treatment apparatuses is used.

Note that the heat treatment apparatus is not limited to an electric furnace, and may have a device for heating an object by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, like nitrogen or a rare gas such as argon is used.

In the heat treatment, it is preferable that moisture, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably greater than or equal to 6 N (99.9999%), more preferably greater than or equal to 7 N (99.99999%) (i.e., the impurity concentration is preferably less than or equal to 1 ppm, more preferably less than or equal to 0.1 ppm).

Note that it has been pointed out that an oxide semiconductor is insensitive to impurities, there is no problem when a considerable amount of metal impurities is contained in the film, and therefore, soda-lime glass which contains a large amount of alkali metal such as sodium and is inexpensive can also be used (Kamiya, Nomura, and Hosono, "Engineering application of solid state physics: Carrier transport properties and electronic structures of amorphous oxide semiconductors: the present status", KOTAI BUTSURI (*SOLID STATE PHYSICS*), 2009, Vol. 44, pp. 621-633). But such consideration is not appropriate. Alkali metal is not an element included in an oxide semiconductor, and therefore, is an impurity. Also, alkaline earth metal is impurity in the case where alkaline earth metal is not included in an oxide semiconductor. Alkali metal, in particular, Na becomes Na$^+$ when an insulating film in contact with the oxide semiconductor layer is an oxide and Na diffuses into the insulating layer. Further, in the oxide semiconductor layer, Na cuts or enters a bond between metal and oxygen which are included in an oxide semiconductor. As a result, for example, deterioration of characteristics of the transistor, such as a normally-on state of the transistor due to shift of a threshold voltage in the negative direction, or reduction in mobility, occurs. In addition, variation in characteristics also occurs. Such deterioration of characteristics of the transistor and variation in characteristics due to the impurity remarkably appear when the hydrogen concentration in the oxide semiconductor layer is very low. Thus, when the concentration of hydrogen in the oxide semiconductor layer is $1\times10^{18}/cm^3$ or lower, preferably $1\times10^{17}/cm^3$ or lower, the concentration of the impurity is preferably lowered. Specifically, a measurement value of a Na concentration by secondary ion mass spectrometry is preferably less than or equal to $5\times10^{16}/cm^3$, more preferably less than or equal to $1\times10^{16}/cm^3$, still more preferably less than or equal to $1\times10^{15}/cm^3$. In a similar manner, a measurement value of a Li concentration is preferably less than or equal to $5\times10^{15}/cm^3$, more preferably less than or equal to $1\times10^{15}/cm^3$. In a similar manner, a measurement value of a K concentration is preferably less than or equal to $5\times10^{15}/cm^3$, more preferably less than or equal to $1\times10^{15}/cm^3$.

Note that the oxide semiconductor layer may be either amorphous or crystalline. In the latter case, the oxide semiconductor layer may be either single crystalline or polycrystalline, may have a structure in which part of the oxide semiconductor layer is crystalline, may have an amorphous structure including a crystalline portion, or may have a non-amorphous structure. As the oxide semiconductor layer, for example, an oxide including a crystal with c-axis alignment (also referred to as c-axis aligned crystal (CAAC)), which has a triangular or hexagonal atomic arrangement when seen from the direction of an a-b plane, a surface, or an interface can be used. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

Sputtering may be performed to form an oxide semiconductor film which includes an oxide including CAAC. In order to obtain CAAC by sputtering, it is important to form hexagonal crystals in an initial stage of deposition of an oxide semiconductor film and to cause crystal growth from the hexagonal crystals as cores. In order to achieve this, it is preferable that the distance between the target and the substrate be made to be longer (e.g., 150 mm to 200 mm) and a substrate heating temperature be 100° C. to 500° C., more preferably 200° C. to 400° C., still preferably 250° C. to 300° C. In addition to this, the deposited oxide semiconductor film is subjected to heat treatment at a temperature higher than the substrate heating temperature in the deposition. Therefore, micro-defects in the film and defects at the interface of a stacked layer can be compensated.

In a broad sense, an oxide including CAAC means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

Figure 8A:
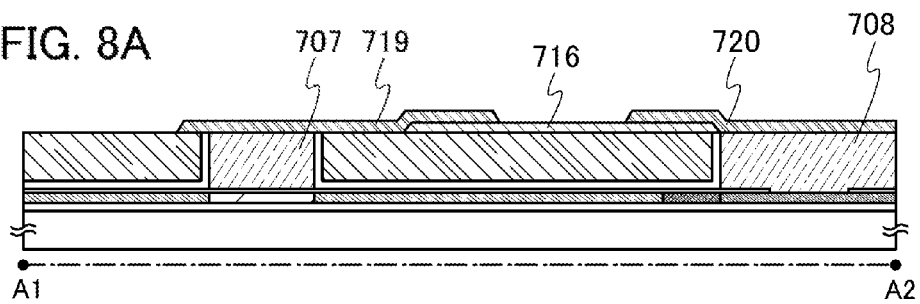
FIGS. 8A to 8C illustrate manufacturing steps of the storage element.

Then, as illustrated in FIG. 8A, the conductive film 719 which is in contact with the gate electrode 707 and the oxide semiconductor layer 716, and the conductive film 720 which is in contact with the conductive film 708 and the oxide semiconductor layer 716 are formed. The conductive films 719 and 720 function as source and drain electrodes.

Specifically, the conductive films 719 and 720 can be formed in such a manner that a conductive film is formed so as to cover the gate electrode 707 and the conductive film 708 by a sputtering method or a vacuum vapor deposition method and then is processed into a predetermined shape.

For the conductive film for forming the conductive films 719 and 720, any of the following can be used: an element selected from aluminum, chromium, copper, tantalum, titanium, molybdenum, and tungsten; an alloy containing any of these elements; an alloy film containing the above elements in combination; and the like. Alternatively, a structure may be employed in which a film of a refractory metal such as chromium, tantalum, titanium, molybdenum, or tungsten is stacked over or below a metal film of aluminum or copper. Aluminum or copper is preferably used in combination with a refractory metal material in order to avoid problems with heat resistance and corrosion. As the refractory metal material, molybdenum, titanium, chromium, tantalum, tungsten, neodymium, scandium, yttrium, or the like can be used.

Further, the conductive film which serves as the conductive films 719 and 720 may have a single-layer structure or a layered structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in that order, and the like can be given. A Cu—Mg—Al alloy, a Mo—Ti alloy, Ti, and Mo have high adhesiveness with an oxide film. Therefore, for the conductive films 719 and 720, a layered structure is employed in which a conductive film containing a Cu—Mg—Al alloy, a Mo—Ti alloy, Ti, or Mo is used for the lower layer and a conductive film containing Cu is used for the upper layer; thus, the adhesiveness between an insulating film which is an oxide film and the conductive films 719 and 720 can be increased.

For the conductive film which serves as the conductive films 719 and 720, a conductive metal oxide may be used. As the conductive metal oxide, indium oxide, tin oxide, zinc oxide, indium oxide-tin oxide, indium oxide-zinc oxide, or the conductive metal oxide material containing silicon or silicon oxide can be used.

In the case where heat treatment is performed after formation of the conductive film, the conductive film preferably has heat resistance enough to withstand the heat treatment.

Note that the material and etching conditions are adjusted as appropriate so that the oxide semiconductor layer 716 is not removed in etching of the conductive film as much as possible. Depending on the etching conditions, there are some cases in which an exposed portion of the oxide semiconductor layer 716 is partially etched and thus a groove (a depression portion) is formed.

In this embodiment, a titanium film is used for the conductive film. Therefore, wet etching can be selectively performed on the conductive film using a solution (an ammonia hydrogen peroxide mixture) containing ammonia and hydrogen peroxide water. As the ammonia hydrogen peroxide mixture, specifically, a solution in which hydrogen peroxide water of 31 wt %, ammonia water of 28 wt %, and water are mixed at a volume ratio of 5:2:2 is used. Alternatively, dry etching may be performed on the conductive film with the use of a gas containing chlorine ($Cl_2$), boron chloride ($BCl_3$), or the like.

In order to reduce the number of photomasks and steps in a photolithography step, etching may be performed with the use of a resist mask formed using a multi-tone mask which is a light-exposure mask through which light is transmitted so as to have a plurality of intensities. A resist mask formed using a multi-tone mask has a plurality of thicknesses and can be changed in shape by etching; thus, the resist mask can be used in a plurality of etching processes for processing films into different patterns. Therefore, a resist mask corresponding to at least two kinds or more of different patterns can be formed by one multi-tone mask. Thus, the number of light-exposure masks can be reduced and the number of corresponding photolithography steps can be also reduced, whereby simplification of a process can be realized.

Further, an oxide conductive film functioning as a source region and a drain region may be provided between the oxide semiconductor layer 716 and the conductive films 719 and 720 functioning as source and drain electrodes. The material of the oxide conductive film preferably contains zinc oxide as a component and preferably does not contain indium oxide. For such an oxide conductive film, zinc oxide, zinc aluminum oxide, zinc aluminum oxynitride, gallium zinc oxide, or the like can be used.

For example, in the case where the oxide conductive film is formed, an etching process for forming the oxide conductive film and an etching process for forming the conductive films 719 and 720 may be performed concurrently.

By providing the oxide conductive film functioning as a source region and a drain region, the resistance between the oxide semiconductor layer 716 and the conductive films 719 and 720 can be lowered, so that the transistor can operate at high speed. In addition, with provision of the oxide conductive film functioning as a source region and a drain region, the withstand voltage of the transistor can be increased.

Next, plasma treatment may be performed using a gas such as $N_2O$, $N_2$, or Ar. By this plasma treatment, water or the like adhering to an exposed surface of the oxide semiconductor layer is removed. Plasma treatment may be performed using a mixture gas of oxygen and argon as well.

Figure 8B:
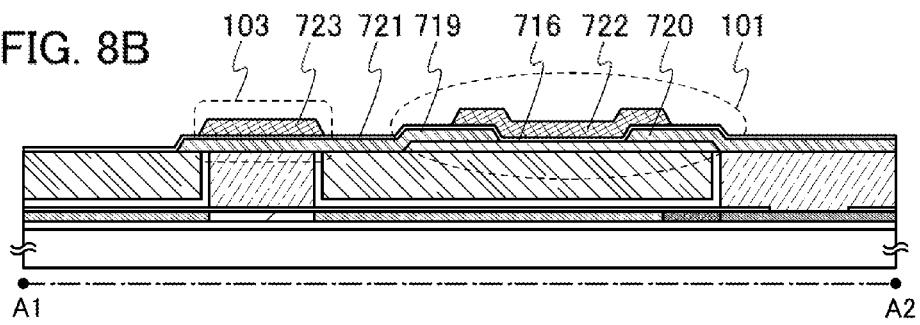

After the plasma treatment, as illustrated in FIG. 8B, the gate insulating film 721 is formed so as to cover the conductive films 719 and 720 and the oxide semiconductor layer 716. Then, a gate electrode 722 is formed over the gate insulating film 721 so as to overlap with the oxide semiconductor layer 716, and a conductive film 723 is formed over the gate insulating film 721 so as to overlap with the conductive film 719.

The gate insulating film 721 can be formed using a material and a layered structure which are similar to those of the gate insulating film 703. Note that the gate insulating film 721 preferably includes impurities such as moisture or hydrogen as little as possible, and the gate insulating film 721 may be formed using a single-layer insulating film or a plurality of insulating films stacked. When hydrogen is contained in the gate insulating film 721, hydrogen enters the oxide semiconductor layer 716 or oxygen in the oxide semiconductor layer 716 is extracted by hydrogen, whereby the oxide semiconductor layer 716 has lower resistance (n-type conductivity); thus, a parasitic channel might be formed. Thus, it is important that a deposition method in which hydrogen is not used be employed in order to form the gate insulating film 721 containing hydrogen as little as possible. A material having a high barrier property is preferably used for the gate insulating film 721. As the insulating film having a high barrier property, a silicon nitride film, a silicon nitride oxide film, an aluminum nitride film, an aluminum nitride oxide film, or the like can be used, for example. When a plurality of insulating films stacked are used, an insulating film having a lower proportion of nitrogen such as a silicon oxide film or a silicon oxynitride film is formed on the side closer to the oxide semiconductor layer 716 than the insulating film having a high barrier property. Then, the insulating film having a high barrier property is formed so as to overlap with the conductive films 719 and 720 and the oxide semiconductor layer 716 with the insulating film having a lower proportion of nitrogen sandwiched therebetween. When the insulating film having a high barrier property is used, impurities such as moisture and hydrogen can be prevented from entering the oxide semiconductor layer 716, the gate insulating film 721, or the interface between the oxide semiconductor layer 716 and another insulating film and the vicinity thereof. In addition, the insulating film having a lower proportion of nitrogen such as a silicon oxide film or a silicon oxynitride film formed in contact with the oxide semiconductor layer 716 can prevent the insulating film formed using a material having a high barrier property from being in direct contact with the oxide semiconductor layer 716.

In this embodiment, the gate insulating film 721 with a structure in which a 100-nm-thick silicon nitride film formed by sputtering is stacked over a 200-nm-thick silicon oxide film formed by sputtering is formed. The substrate temperature in film formation may be higher than or equal to room temperature and lower than or equal to 300° C. and in this embodiment, is 100° C.

After the gate insulating film 721 is formed, heat treatment may be performed. The heat treatment is performed in a nitrogen atmosphere, an atmosphere of ultra-dry air, or a rare gas (e.g., argon or helium) atmosphere preferably at a temperature higher than or equal to 200° C. and lower than or equal to 400° C., for example, higher than or equal to 250° C. and lower than or equal to 350° C. It is preferable that the water content in the gas be 20 ppm or less, preferably 1 ppm or less, further preferably 10 ppb or less. For example, heat treatment is performed at 250° C. for one hour in a nitrogen atmosphere in this embodiment. Alternatively, RTA treatment for a short time at a high temperature may be performed before the formation of the conductive films 719 and 720 in a manner similar to that of the heat treatment performed on the oxide semiconductor layer for reduction of moisture or hydrogen. Even when oxygen deficiency is generated in the oxide semiconductor layer 716 by the previous heat treatment performed on the oxide semiconductor layer 716 by performing heat treatment after providing the gate insulating film 721 containing oxygen, oxygen is supplied to the oxide semiconductor layer 716 from the gate insulating film 721. By supplying oxygen to the oxide semiconductor layer 716, oxygen deficiency that serves as a donor can be reduced in the oxide semiconductor layer 716 and the stoichiometric composition can be satisfied. It is preferable that the proportion of oxygen in the oxide semiconductor layer 716 be higher than that in the stoichiometric composition. As a result, the oxide semiconductor layer 716 can be made to be substantially i-type and variation in electrical characteristics of the transistor due to oxygen deficiency can be reduced; thus, electrical characteristics can be improved. The timing of this heat treatment is not particularly limited as long as it is after the formation of the gate insulating film 721. When this heat treatment doubles as another step such as heat treatment for formation of a resin film or heat treatment for reduction of the resistance of a transparent conductive film, the oxide semiconductor layer 716 can be made to be substantially i-type without the number of steps increased.

Moreover, the oxygen deficiency that serves as a donor in the oxide semiconductor layer 716 may be reduced by subjecting the oxide semiconductor layer 716 to heat treatment in an oxygen atmosphere so that oxygen is added to the oxide semiconductor. The heat treatment is performed at a temperature of, for example, higher than or equal to 100° C. and lower than 350° C., preferably higher than or equal to 150° C. and lower than 250° C. It is preferable that an oxygen gas used for the heat treatment under an oxygen atmosphere do not include water, hydrogen, or the like. Alternatively, the purity of the oxygen gas which is introduced into the heat treatment apparatus is preferably greater than or equal to 6N (99.9999%), further preferably greater than or equal to 7N (99.99999%) (that is, the impurity concentration in the oxygen gas is less than or equal to 1 ppm, preferably less than or equal to 0.1 ppm).

Alternatively, oxygen may be added to the oxide semiconductor layer 716 by an ion implantation method, an ion doping method, or the like to reduce oxygen deficiency serving as a donor. For example, oxygen which is made into a plasma state with a microwave at 2.45 GHz may be added to the oxide semiconductor layer 716.

The gate electrode 722 and the conductive film 723 can be formed in such a manner that a conductive film is formed over the gate insulating film 721 and then is processed by etching. The gate electrode 722 and the conductive film 723 can be formed using a material similar to that of the gate electrode 707 or the conductive films 719 and 720.

The thickness of each of the gate electrode 722 and the conductive film 723 is 10 nm to 400 nm, preferably 100 nm to 200 nm. In this embodiment, after a 150-nm-thick conductive film for the gate electrode is formed by sputtering using a tungsten target, the conductive film is etched to have a desired shape, so that the gate electrode 722 and the conductive film 723 are formed. Note that a resist mask may be formed by an inkjet method. Formation of the resist mask by an inkjet method needs no photomask; thus, manufacturing cost can be reduced.

Through the above steps, the transistor 101 is formed.

Note that a portion where the conductive film 719 and the conductive film 723 overlap with each other with the gate insulating film 721 provided therebetween corresponds to the capacitor 103.

Although the transistor 101 is described as a single-gate transistor, a multi-gate transistor including a plurality of channel formation regions when a plurality of gate electrodes which is electrically connected is included can be formed if needed.

Note that an insulating film in contact with the oxide semiconductor layer 716 (which corresponds to the gate insulating film 721 in this embodiment) may be formed using an insulating material containing a Group 13 element and oxygen. Many of oxide semiconductor materials contain a Group 13 element, and an insulating material containing a Group 13 element works well with oxide semiconductors. By using an insulating material containing a Group 13 element for an insulating film in contact with the oxide semiconductor layer, an interface with the oxide semiconductor layer can keep a favorable state.

An insulating material containing a Group 13 element refers to an insulating material containing one or more Group 13 elements. As the insulating material containing a Group 13 element, gallium oxide, aluminum oxide, aluminum gallium oxide, gallium aluminum oxide, or the like can be given as an example. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, when a material containing gallium oxide is used for an insulating film that is in contact with an oxide semiconductor layer containing gallium, characteristics at the interface between the oxide semiconductor layer and the insulating film can be kept favorable. For example, the oxide semiconductor layer and an insulating film containing gallium oxide are provided in contact with each other, so that pile up of hydrogen at the interface between the oxide semiconductor layer and the insulating film can be reduced. Note that a similar effect can be obtained in the case where an element in the same group as a constituent element of the oxide semiconductor is used in an insulating film. For example, it is effective to form an insulating film with the use of a material including aluminum oxide. Note that aluminum oxide has a property of not easily transmitting water. Thus, it is preferable to use a material containing aluminum oxide in terms of preventing entry of water into the oxide semiconductor layer.

The insulating material of the insulating film in contact with the oxide semiconductor layer 716 is preferably made to contain oxygen in a proportion higher than that in the stoichiometric composition by heat treatment in an oxygen atmosphere or by oxygen doping. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. The oxygen doping may be performed by ion implantation or ion doping.

For example, in the case where the insulating film in contact with the oxide semiconductor layer 716 is formed using gallium oxide, the composition of gallium oxide can be set to be $Ga_2O_x$ (x=3+α, 0<α<1) by heat treatment in an oxygen atmosphere or by oxygen doping.

In the case where the insulating film in contact with the oxide semiconductor layer 716 is formed using aluminum oxide, the composition of aluminum oxide can be set to be $Al_2O_x$=3+α, 0<α<1) by heat treatment in an oxygen atmosphere or by oxygen doping.

In the case where the insulating film in contact with the oxide semiconductor layer 716 is formed using gallium aluminum oxide (aluminum gallium oxide), the composition of gallium aluminum oxide (aluminum gallium oxide) can be set to be $Ga_xAl_{2-x}O_{3+α}$ (0<x<2, 0<α<1) by heat treatment in an oxygen atmosphere or by oxygen doping.

By oxygen doping, an insulating film which includes a region where the proportion of oxygen is higher than that in the stoichiometric composition can be formed. When the insulating film including such a region is in contact with the oxide semiconductor layer, excess oxygen in the insulating film is supplied to the oxide semiconductor layer, and oxygen defects in the oxide semiconductor layer or at the interface between the oxide semiconductor layer and the insulating film are reduced. Thus, the oxide semiconductor layer can be made to be an i-type or substantially i-type oxide semiconductor.

Note that the insulating film which includes a region where the proportion of oxygen is higher than that in the stoichiometric composition may be applied to either the insulating film located on the upper side of the oxide semiconductor layer 716 or the insulating film located on the lower side of the oxide semiconductor layer 716 of the insulating films in contact with the oxide semiconductor layer 716; however, it is preferable to apply such an insulating film to both of the insulating films in contact with the oxide semiconductor layer 716. The above-described effect can be enhanced with a structure where the oxide semiconductor layer 716 is sandwiched between the insulating films each including a region where the proportion of oxygen is higher than that in the stoichiometric composition, which are used as the insulating films in contact with the oxide semiconductor layer 716 and located on the upper side and the lower side of the oxide semiconductor layer 716.

The insulating films on the upper side and the lower side of the oxide semiconductor layer 716 may contain the same constituent elements or different constituent elements. For example, the insulating films on the upper side and the lower side may be both formed of gallium oxide whose composition is $Ga_2O_x$ (x=3+α, 0<α<1). Alternatively, one of the insulating films on the upper side and the lower side may be formed of $Ga_2O_x$ (x=3+α, 0<α<1) and the other may be formed of aluminum oxide whose composition is $Al_2O_x$ (x=3+α, 0<α<1).

The insulating film in contact with the oxide semiconductor layer 716 may be formed by stacking insulating films each including a region where the proportion of oxygen is higher than that in the stoichiometric composition. For example, the insulating film on the upper side of the oxide semiconductor layer 71.6 may be formed as follows: gallium oxide whose composition is $Ga_2O_x$ (x=3+α, 0<α<1) is formed and gallium aluminum oxide (aluminum gallium oxide) whose composition is $Ga_xAl_{2-x}O_{3+a}$ (0<x<2, 0<α<1) is formed thereover. Note that the insulating film on the lower side of the oxide semiconductor layer 716 may be formed by stacking insulating films each including a region where the proportion of oxygen is higher than that in the stoichiometric composition. Further, both of the insulating films on the upper side and the lower side of the oxide semiconductor layer 716 may be formed by stacking insulating films each including a region where the proportion of oxygen is higher than that in the stoichiometric composition.

Figure 8C:
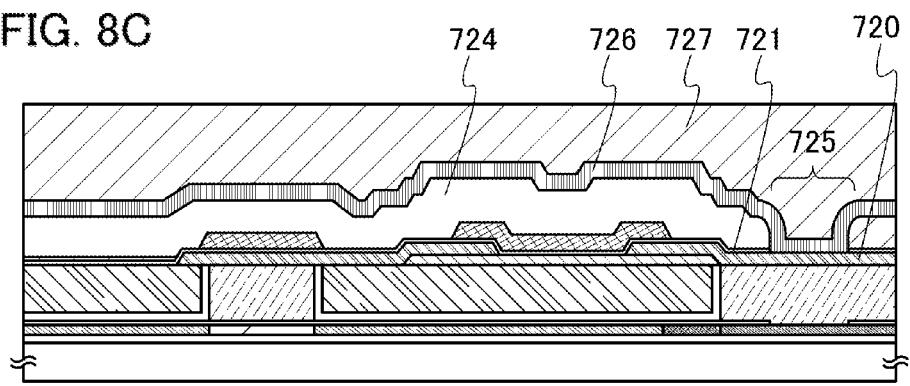

Next, as illustrated in FIG. 8C, an insulating film 724 is formed so as to cover the gate insulating film 721, the conductive film 723, and the gate electrode 722. The insulating film 724 can be formed by PVD, CVD, or the like. The insulating film 724 can be formed using a material including an inorganic insulating material such as silicon oxide, silicon oxynitride, silicon nitride, hafnium oxide, gallium oxide, or aluminum oxide. Note that for the insulating film 724, a material with a low dielectric constant or a structure with a low dielectric constant (e.g., a porous structure) is preferably used. When the dielectric constant of the insulating film 724 is lowered, parasitic capacitance generated between wirings or electrodes can be reduced, which results in higher speed operation. Note that although the insulating film 724 has a single-layer structure in this embodiment, one embodiment of the present invention is not limited to this. The insulating film 724 may have a layered structure of two or more layers.

Next, an opening 725 is formed in the gate insulating film 721 and the insulating film 724, so that part of the conductive film 720 is exposed. After that, a wiring 726 which is in contact with the conductive film 720 through the opening 725 is formed over the insulating film 724.

The wiring 726 is formed in such a manner that a conductive film is formed by a PVD method or a CVD method and then the conductive film is processed by etching. As the material of the conductive film, an element selected from aluminum, chromium, copper, tantalum, titanium, molybdenum, or tungsten; an alloy containing any of these elements as a component; or the like can be used. A material including one of manganese, magnesium, zirconium, beryllium, neodymium, and scandium or a combination of any of these elements may be used.

Specifically, for example, it is possible to employ a method in which a thin titanium film is formed in a region including the opening of the insulating film 724 by PVD and a thin titanium film (with a thickness of about 5 nm) is formed by PVD, and then, an aluminum film is formed so as to be embedded in the opening 725. Here, the titanium film formed by PVD has a function of reducing an oxide film (e.g., a native oxide film) formed on a surface over which the titanium film is formed, to decrease the contact resistance with the lower electrode or the like (here, the conductive film 720). In addition, hillock of aluminum film can be prevented. A copper film may be formed by a plating method after the formation of the barrier film of titanium, titanium nitride, or the like.

The opening 725 formed in the insulating film 724 is preferably formed in a region overlapping with the conductive film 708. With provision of the opening 725 in such a region, the increase in element area due to a contact region can be prevented.

Here, the case where a connection position of the impurity region 704 and the conductive film 720 and a connection position of the conductive film 720 and the wiring 726 overlap with each other without the use of the conductive film 708 is described. In that case, an opening (also referred to as an opening in a lower portion) is formed in the insulating films 712 and 713 which are formed over the impurity region 704, and the conductive film 720 is formed so as to cover the opening in the lower portion. After that, an opening (also referred to as an opening in an upper portion) is formed in the gate insulating film 721 and the insulating film 724 in a region overlapping with the opening in the lower portion, and the wiring 726 is formed. When the opening in the upper portion is formed in the region overlapping with the opening in the lower portion, the conductive film 720 formed in the opening in the lower portion might be disconnected by etching. In order to avoid the disconnection, the openings in the lower portion and in the upper portion are formed so as not to overlap with each other, so that a problem of the increase in element area occurs.

As described in this embodiment, with the use of the conductive film 708, the opening in the upper portion can be formed without disconnection of the conductive film 720. Thus, the openings in the lower portion and in the upper portion can be formed so as to overlap with each other, so that the increase in element area due to the openings can be suppressed. In other words, the degree of integration of the semiconductor device can be increased.

Next, an insulating film 727 is formed so as to cover the wiring 726. Through the series of steps, the storage element 100b can be manufactured.

Note that in the manufacturing method, the conductive films 719 and 720 functioning as source and drain electrodes are formed after the formation of the oxide semiconductor layer 716. Thus, as illustrated in FIG. 8B, in the transistor 101 obtained by the manufacturing method, the conductive films 719 and 720 are formed over the oxide semiconductor layer 716. However, in the transistor 101, the conductive films functioning as source, and drain electrodes may be formed below the oxide semiconductor layer 716, that is, between the oxide semiconductor layer 716 and the insulating films 712 and 713.

Figure 9:
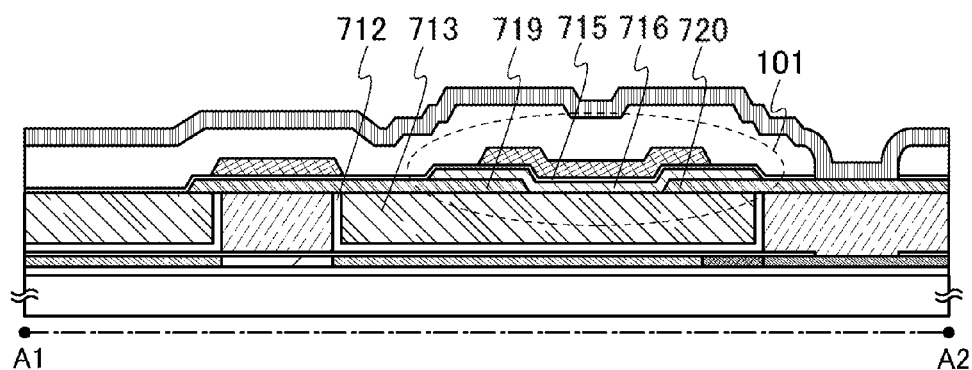
FIG. 9 is a cross-sectional view illustrating a structure of a storage element.

FIG. 9 is a cross-sectional view of the transistor 101 in the case where the conductive films 719 and 720 functioning as source and drain electrodes are provided between the oxide semiconductor layer 716 and the insulating films 712 and 713. The transistor 101 illustrated in FIG. 9 can be obtained in such a manner that the conductive films 719 and 720 are formed after the formation of the insulating film 713, and then, the oxide semiconductor layer 716 is formed.

This embodiment can be implemented in appropriate combination with any of the above embodiments.

Embodiment 7

In this embodiment, a transistor including an oxide semiconductor layer with a structure different from the structure in Embodiment 6 is described.

Figure 10A:
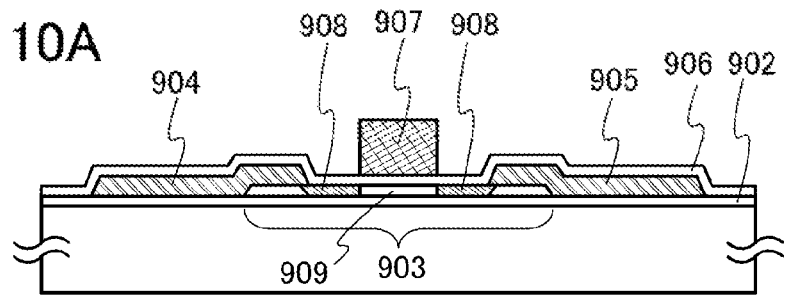
FIGS. 10A to 10D are cross-sectional views each illustrating a structure of a transistor whose channel is formed in an oxide semiconductor layer.

A transistor 901 illustrated in FIG. 10A includes an oxide semiconductor layer 903 which is formed over an insulating film 902 and functions as an active layer; a source electrode 904 and a drain electrode 905 formed over the oxide semiconductor layer 903; a gate insulating film 906 over the oxide semiconductor layer 903, and the source electrode 904 and the drain electrode 905; and a gate electrode 907 which is provided over the gate insulating film 906 so as to overlap with the oxide semiconductor layer 903.

The transistor 901 illustrated in FIG. 10A is of a top-gate type where the gate electrode 907 is formed over the oxide semiconductor layer 903, and is also of a top-contact type where the source electrode 904 and the drain electrode 905 are formed over the oxide semiconductor layer 903. In the transistor 901, the source electrode 904 and the drain electrode 905 do not overlap with the gate electrode 907. That is, the distance between the gate electrode 907 and each of the source electrode 904 and the drain electrode 905 is larger than the thickness of the gate insulating film 906. Therefore, in the transistor 901, the parasitic capacitance generated between the gate electrode 907 and each of the source electrode 904 and the drain electrode 905 can be small, so that the transistor 901 can operate at high speed.

The oxide semiconductor layer 903 includes a pair of high-concentration regions 908 which are obtained by addition of dopant imparting n-type conductivity to the oxide semiconductor layer 903 after formation of the gate electrode 907. Further, the oxide semiconductor layer 903 includes a channel formation region 909 which overlaps with the gate electrode 907 with the gate insulating film 906 interposed therebetween. In the oxide semiconductor layer 903, the channel formation region 909 is provided between the pair of high-concentration regions 908. The addition of dopant for forming the high-concentration regions 908 can be performed by an ion implantation method. A rare gas such as helium, argon, or xenon; an atom belonging to Group 5, such as nitrogen, phosphorus, arsenic, or antimony; or the like can be used as the dopant.

For example, in the case where nitrogen is used as the dopant, the concentration of nitrogen atoms in the high-concentration regions 908 is preferably higher than or equal to $5\times10^{19}/cm^3$ and lower than or equal to $1\times10^{22}/cm^3$.

The high-concentration regions 908 to which the dopant imparting n-type conductivity is added have higher conductivity than the other regions in the oxide semiconductor layer 903. Therefore, by providing the high-concentration regions 908 in the oxide semiconductor layer 903, the resistance between the source electrode 904 and the drain electrode 905 can be decreased.

In the case where an In—Ga—Zn—O-based oxide semiconductor is used for the oxide semiconductor layer 903, heat treatment is performed at a temperature higher than or equal to 300° C. and lower than or equal to 600° C. for one hour after nitrogen is added. Consequently, the oxide semiconductor in the high-concentration regions 908 has a wurtzite crystal structure. Since the oxide semiconductor in the high-concentration regions 908 has a wurtzite crystal structure, the conductivity of the high-concentration regions 908 can be further increased and the resistance between the source electrode 904 and the drain electrode 905 can be decreased. Note that in order to effectively decrease the resistance between the source electrode 904 and the drain electrode 905 by forming an oxide semiconductor having a wurtzite crystal structure, in the case of using nitrogen as the dopant, the concentration of nitrogen atoms in the high-concentration regions 908 is preferably higher than or equal to $1\times10^{20}/cm^3$ and lower than or equal to 7 atoms %. However, there is also a case where an oxide semiconductor having a wurtzite crystal structure can be obtained even when the concentration of nitrogen atoms is lower than the above range.

The oxide semiconductor layer 903 may include an oxide including CAAC. In the case where the oxide semiconductor layer 903 includes an oxide including CAAC, the conductivity of the oxide semiconductor layer 903 can be increased as compared to the case of an amorphous semiconductor; thus, the resistance between the source electrode 904 and the drain electrode 905 can be decreased.

By decreasing the resistance between the source electrode 904 and the drain electrode 905, high on-state current and high-speed operation can be ensured even when the transistor 901 is miniaturized. With the miniaturization of the transistor 901, the area occupied by the storage element including the transistor can be reduced and the storage capacity per unit area can be increased.

Figure 10B:
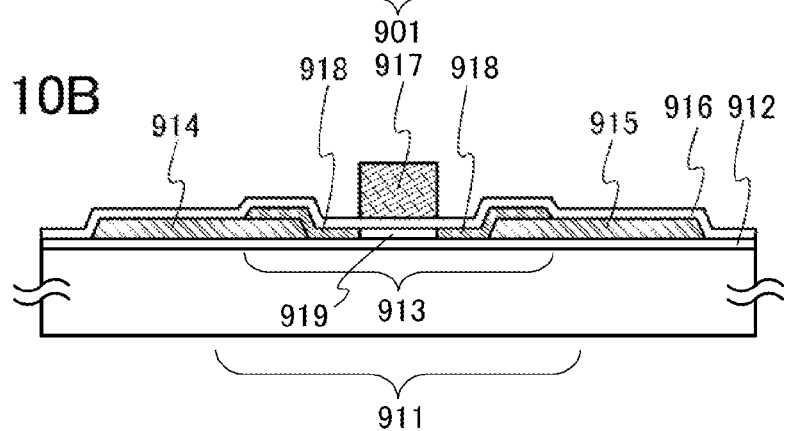

A transistor 911 illustrated in FIG. 10B includes a source electrode 914 and a drain electrode 915 formed over an insulating film 912; an oxide semiconductor layer 913 which is formed over the source electrode 914 and the drain electrode 915 and functions as an active layer; a gate insulating film 916 over the oxide semiconductor layer 913, and the source electrode 914 and the drain electrode 915; and a gate electrode 917 which is provided over the gate insulating film 916 so as to overlap with the oxide semiconductor layer 913.

The transistor 911 illustrated in FIG. 10B is of a top-gate type where the gate electrode 917 is formed over the oxide semiconductor layer 913, and is also of a bottom-contact type where the source electrode 914 and the drain electrode 915 are formed below the oxide semiconductor layer 913. In the transistor 911, the source electrode 914 and the drain electrode 915 do not overlap with the gate electrode 917 as in the transistor 901; thus, the parasitic capacitance generated between the gate electrode 917 and each of the source electrode 914 and the drain electrode 915 can be small, so that the transistor 911 can operate at high speed.

The oxide semiconductor layer 913 includes a pair of high-concentration regions 918 which are obtained by addition of dopant imparting n-type conductivity to the oxide semiconductor layer 913 after formation of the gate electrode 917. Further, the oxide semiconductor layer 913 includes a channel formation region 919 which overlaps with the gate electrode 917 with the gate insulating film 916 interposed therebetween. In the oxide semiconductor layer 913, the channel formation region 919 is provided between the pair of high-concentration regions 918.

Like the above-described high-concentration regions 908 included in the transistor 901, the high-concentration regions 918 can be formed by an ion implantation method. The kind of dopant in the case of the high-concentration regions 908 can be referred to for the kind of dopant for forming the high-concentration regions 918.

For example, in the case where nitrogen is used as the dopant, the concentration of nitrogen atoms in the high-concentration regions 918 is preferably higher than or equal to $5\times10^{19}/cm^3$ and lower than or equal to $1\times10^{22}/cm^3$.

The high-concentration regions 918 to which the dopant imparting n-type conductivity is added have higher conductivity than the other regions in the oxide semiconductor layer 913. Therefore, by providing the high-concentration regions 918 in the oxide semiconductor layer 913, the resistance between the source electrode 914 and the drain electrode 915 can be decreased.

In the case where an In—Ga—Zn—O-based oxide semiconductor is used for the oxide semiconductor layer 913, heat treatment is performed at a temperature higher than or equal to 300° C. and lower than or equal to 600° C. after nitrogen is added. Consequently, the oxide semiconductor in the high-concentration regions 918 has a wurtzite crystal structure. Since the oxide semiconductor in the high-concentration regions 918 has a wurtzite crystal structure, the conductivity of the high-concentration regions 918 can be further increased and the resistance between the source electrode 914 and the drain electrode 915 can be decreased. Note that in order to effectively decrease the resistance between the source electrode 914 and the drain electrode 915 by forming an oxide semiconductor having a wurtzite crystal structure, in the case of using nitrogen as the dopant, the concentration of nitrogen atoms in the high-concentration regions 918 is preferably higher than or equal to $1\times10^{20}/cm^3$ and lower than or equal to 7 atoms %. However, there is also a case where an oxide semiconductor having a wurtzite crystal structure can be obtained even when the concentration of nitrogen atoms is lower than the above range.

The oxide semiconductor layer 913 may include an oxide including CAAC. In the case where the oxide semiconductor layer 913 includes an oxide including CAAC, the conductivity of the oxide semiconductor layer 913 can be increased as compared to the case of an amorphous semiconductor; thus, the resistance between the source electrode 914 and the drain electrode 915 can be decreased.

By decreasing the resistance between the source electrode 914 and the drain electrode 915, high on-state current and high-speed operation can be ensured even when the transistor 911 is miniaturized. With the miniaturization of the transistor 911, the area occupied by the storage element including the transistor can be reduced and the storage capacity per unit area can be increased.

Figure 10C:
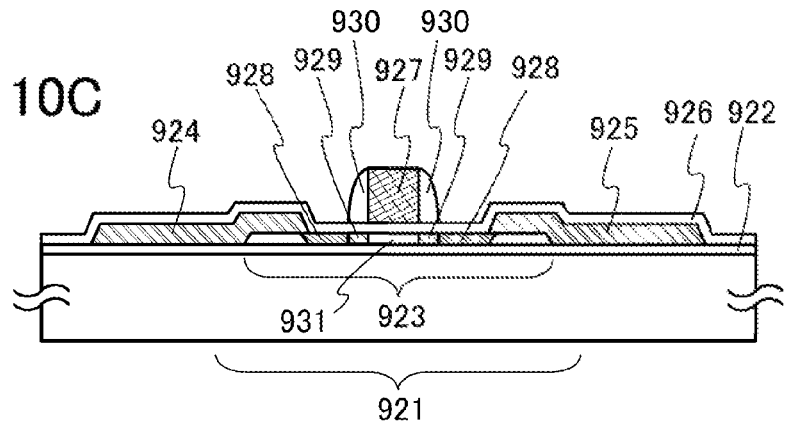

A transistor 921 illustrated in FIG. 10C includes an oxide semiconductor layer 923 which is formed over an insulating film 922 and functions as an active layer; a source electrode 924 and a drain electrode 925 formed over the oxide semiconductor layer 923; a gate insulating film 926 over the oxide semiconductor layer 923, and the source electrode 924 and the drain electrode 925; and a gate electrode 927 which is provided over the gate insulating film 926 so as to overlap with the oxide semiconductor layer 923. The transistor 921 further includes sidewalls 930 that are provided at ends of the gate electrode 927 and are formed using an insulating film.

The transistor 921 illustrated in FIG. 10C is of a top-gate type where the gate electrode 927 is formed over the oxide semiconductor layer 923, and is also of a top-contact type where the source electrode 924 and the drain electrode 925 are formed over the oxide semiconductor layer 923. In the transistor 921, the source electrode 924 and the drain electrode 925 do not overlap with the gate electrode 927 as in the transistor 901; thus, the parasitic capacitance generated between the gate electrode 927 and each of the source electrode 924 and the drain electrode 925 can be small, so that the transistor 921 can operate at high speed.

The oxide semiconductor layer 923 includes a pair of high-concentration regions 928 and a pair of low-concentration regions 929 which are obtained by addition of dopant imparting n-type conductivity to the oxide semiconductor layer 923 after formation of the gate electrode 927. Further, the oxide semiconductor layer 923 includes a channel formation region 931 which overlaps with the gate electrode 927 with the gate insulating film 926 interposed therebetween. In the oxide semiconductor layer 923, the channel formation region 931 is provided between the pair of low-concentration regions 929 which are provided between the pair of high-concentration regions 928. Further, the pair of low-concentration regions 929 is provided in a region of the oxide semiconductor layer 923 that overlaps with the sidewalls 930 with the gate insulating film 926 provided therebetween.

Like the above-described high-concentration regions 908 included in the transistor 901, the high-concentration regions 928 and the low-concentration regions 929 can be formed by an ion implantation method. The kind of dopant in the case of the high-concentration regions 908 can be referred to for the kind of dopant for forming the high-concentration regions 928.

For example, in the case where nitrogen is used as the dopant, the concentration of nitrogen atoms in the high-concentration regions 928 is preferably higher than or equal to $5 \times 10^{19}$/cm$^3$ and lower than or equal to $1 \times 10^{22}$/cm$^3$. Further, for example, in the case where nitrogen is used as the dopant, the concentration of nitrogen atoms in the low-concentration regions 929 is preferably higher than or equal to $5 \times 10^{18}$/cm$^3$ and lower than $5 \times 10^{19}$/cm$^3$.

The high-concentration regions 928 to which the dopant imparting n-type conductivity is added have higher conductivity than the other regions in the oxide semiconductor layer 923. Therefore, by providing the high-concentration regions 928 in the oxide semiconductor layer 923, the resistance between the source electrode 924 and the drain electrode 925 can be decreased. The low-concentration regions 929 are provided between the channel formation region 931 and the high-concentration regions 928, whereby a negative shift of the threshold voltage due to a short-channel effect can be reduced.

In the case where an In—Ga—Zn—O-based oxide semiconductor is used for the oxide semiconductor layer 923, heat treatment is performed at a temperature higher than or equal to 300° C. and lower than or equal to 600° C. after nitrogen is added. Consequently, the oxide semiconductor in the high-concentration regions 928 has a wurtzite crystal structure. Further, depending on the nitrogen concentration, the low-concentration regions 929 also have a wurtzite crystal structure due to the heat treatment. Since the oxide semiconductor in the high-concentration regions 928 has a wurtzite crystal structure, the conductivity of the high-concentration regions 928 can be further increased and the resistance between the source electrode 924 and the drain electrode 925 can be decreased. Note that in order to effectively decrease the resistance between the source electrode 924 and the drain electrode 925 by forming an oxide semiconductor having a wurtzite crystal structure, in the case of using nitrogen as the dopant, the concentration of nitrogen atoms in the high-concentration regions 928 is preferably higher than or equal to $1 \times 10^{20}$/cm$^3$ and lower than or equal to 7 atoms %. However, there is also a case where an oxide semiconductor having a wurtzite crystal structure can be obtained even when the concentration of nitrogen atoms is lower than the above range.

The oxide semiconductor layer 923 may include an oxide including CAAC. In the case where the oxide semiconductor layer 923 includes an oxide including CAAC, the conductivity of the oxide semiconductor layer 923 can be increased as compared to the case of an amorphous semiconductor; thus, the resistance between the source electrode 924 and the drain electrode 925 can be decreased.

By decreasing the resistance between the source electrode 924 and the drain electrode 925, high on-state current and high-speed operation can be ensured even when the transistor 921 is miniaturized. With the miniaturization of the transistor 921, the area occupied by a memory cell including the transistor can be reduced and the storage capacity per unit area of a cell array can be increased.

Figure 10D:
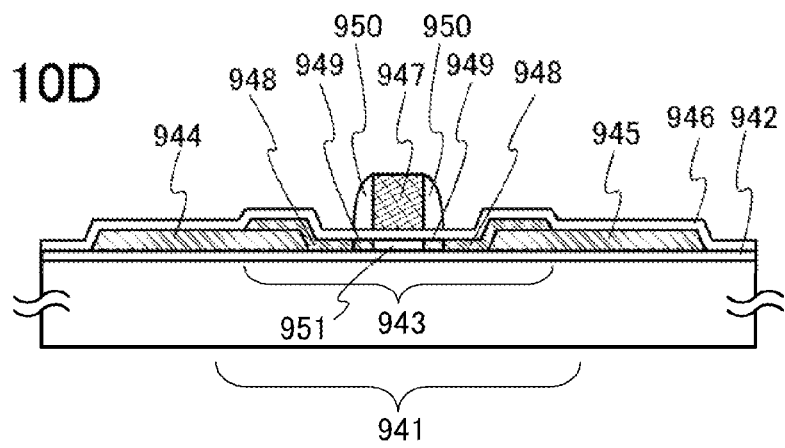

A transistor 941 illustrated in FIG. 10D includes a source electrode 944 and a drain electrode 945 formed over an insulating film 942; an oxide semiconductor layer 943 which is formed over the source electrode 944 and the drain electrode 945 and functions as an active layer; a gate insulating film 946 over the oxide semiconductor layer 943, and the source electrode 944 and the drain electrode 945; and a gate electrode 947 which is provided over the gate insulating film 946 so as to overlap with the oxide semiconductor layer 943. The transistor 941 further includes sidewalls 950 that are provided at ends of the gate electrode 947 and are formed using an insulating film.

The transistor 941 illustrated in FIG. 10D is of a top-gate type where the gate electrode 947 is formed over the oxide semiconductor layer 943, and is also of a bottom-contact type where the source electrode 944 and the drain electrode 945 are formed below the oxide semiconductor layer 943. In the transistor 941, the source electrode 944 and the drain electrode 945 do not overlap with the gate electrode 947 as in the transistor 901. Therefore, the parasitic capacitance generated between the gate electrode 947 and each of the source electrode 944 and the drain electrode 945 can be small, so that the transistor 941 can operate at high speed.

The oxide semiconductor layer 943 includes a pair of high-concentration regions 948 and a pair of low-concentration regions 949 which are obtained by addition of dopant imparting n-type conductivity to the oxide semiconductor layer 943 after formation of the gate electrode 947. Further, the oxide semiconductor layer 943 includes a channel formation region 951 which overlaps with the gate electrode 947 with the gate insulating film 946 interposed therebetween. In the oxide semiconductor layer 943, the channel formation region 951 is provided between the pair of low-concentration regions 949 which are provided between the pair of high-concentration regions 948. Further, the pair of low-concentration regions 949 is provided in a region of the oxide semiconductor layer 943 that overlaps with the sidewalls 950 with the gate insulating film 946 provided therebetween.

Like the above-described high-concentration regions 908 included in the transistor 901, the high-concentration regions 948 and the low-concentration regions 949 can be formed by an ion implantation method. The kind of dopant in the case of the high-concentration regions 908 can be referred to for the kind of dopant for forming the high-concentration regions 948.

For example, in the case where nitrogen is used as the dopant, the concentration of nitrogen atoms in the high-concentration regions 948 is preferably higher than or equal to $5 \times 10^{19}/cm^3$ and lower than or equal to $1 \times 10^{22}/cm^3$. Further, for example, in the case where nitrogen is used as the dopant, the concentration of nitrogen atoms in the low-concentration regions 949 is preferably higher than or equal to $5 \times 10^{18}/cm^3$ and lower than $5 \times 10^{19}/cm^3$.

The high-concentration regions 948 to which the dopant imparting n-type conductivity is added have higher conductivity than the other regions in the oxide semiconductor layer 943. Therefore, by providing the high-concentration regions 948 in the oxide semiconductor layer 943, the resistance between the source electrode 944 and the drain electrode 945 can be decreased. The low-concentration regions 949 are provided between the channel formation region 951 and the high-concentration regions 948, whereby a negative shift of the threshold voltage due to a short-channel effect can be reduced.

In the case where an In—Ga—Zn—O-based oxide semiconductor is used for the oxide semiconductor layer 943, heat treatment is performed at a temperature higher than or equal to 300° C. and lower than or equal to 600° C. after nitrogen is added. Consequently, the oxide semiconductor in the high-concentration regions 948 has a wurtzite crystal structure. Further, depending on the nitrogen concentration, the low-concentration regions 949 also have a wurtzite crystal structure due to the heat treatment. Since the oxide semiconductor in the high-concentration regions 948 has a wurtzite crystal structure, the conductivity of the high-concentration regions 948 can be further increased and the resistance between the source electrode 944 and the drain electrode 945 can be decreased. Note that in order to effectively decrease the resistance between the source electrode 944 and the drain electrode 945 by forming an oxide semiconductor having a wurtzite crystal structure, in the case of using nitrogen as the dopant, the concentration of nitrogen atoms in the high-concentration regions 948 is preferably higher than or equal to $1 \times 10^{20}/cm^3$ and lower than or equal to 7 atoms %. However, there is also a case where an oxide semiconductor having a wurtzite crystal structure can be obtained even when the concentration of nitrogen atoms is lower than the above range.

The oxide semiconductor layer 943 may include an oxide including CAAC. In the case where the oxide semiconductor layer 943 includes an oxide including CAAC, the conductivity of the oxide semiconductor layer 943 can be increased as compared to the case of an amorphous semiconductor; thus, the resistance between the source electrode 944 and the drain electrode 945 can be decreased.

By decreasing the resistance between the source electrode 944 and the drain electrode 945, high on-state current and high-speed operation can be ensured even when the transistor 941 is miniaturized. With the miniaturization of the transistor 941, the area occupied by the storage element including the transistor can be reduced and the storage capacity per unit area can be increased.

Note that as one of methods for forming a high-concentration region functioning as a source region or a drain region in a transistor including an oxide semiconductor through a self-aligning process, a method has been disclosed by which a surface of an oxide semiconductor layer is exposed, argon plasma treatment is performed, and the resistance of a region in the oxide semiconductor layer that is exposed to plasma is lowered (S. Jeon et al., "180 nm Gate Length Amorphous InGaZnO Thin Film Transistor for High Density Image Sensor Application", IEDM Tech. Dig., p. 504, 2010).

However, in the above manufacturing method, after a gate insulating film is formed, the gate insulating film needs to be partially removed so that a portion which is to be the source region and the drain region is exposed. Therefore, at the time of removing the gate insulating film, the oxide semiconductor layer which is below the gate insulating film is partially over-etched; thus, the thickness of the portion which is to be the source region and the drain region becomes small. Consequently, the resistance of the source region and the drain region is increased and defects of transistor characteristics due to the over-etching easily occur.

To miniaturize a transistor, it is necessary to employ a dry etching method with high process precision. However, the above over etching is more likely to occur when a dry etching method which does not sufficiently ensure selectivity between the oxide semiconductor layer and the gate insulating film is used.

For example, over-etching does not cause any problem when the oxide semiconductor layer has enough thickness; however, in the case where the channel length is shorter than or equal to 200 nm, the portion to be a channel formation region in the oxide semiconductor layer needs to have a thickness of 20 nm or less, preferably 10 nm or less in order to avoid a short channel effect. When an oxide semiconductor layer has such a small thickness, over-etching of the oxide semiconductor layer is unfavorable because the resistance of a source region and a drain region is increased and defects of transistor characteristics are caused as described above.

However, as in one embodiment of the present invention, addition of dopant to an oxide semiconductor layer is performed in the state where a gate insulating film is left so as not to expose the oxide semiconductor; thus, the overetching of the oxide semiconductor layer can be prevented and excessive damage to the oxide semiconductor layer can be reduced. In addition, the interface between the oxide semiconductor layer and the gate insulating film is kept clean. Thus, the characteristics and reliability of the transistor can be improved.

This embodiment can be implemented in appropriate combination with any of the above embodiments.

Embodiment 8

In this embodiment, one embodiment of a structure of a storage device will be described.

Figure 11:
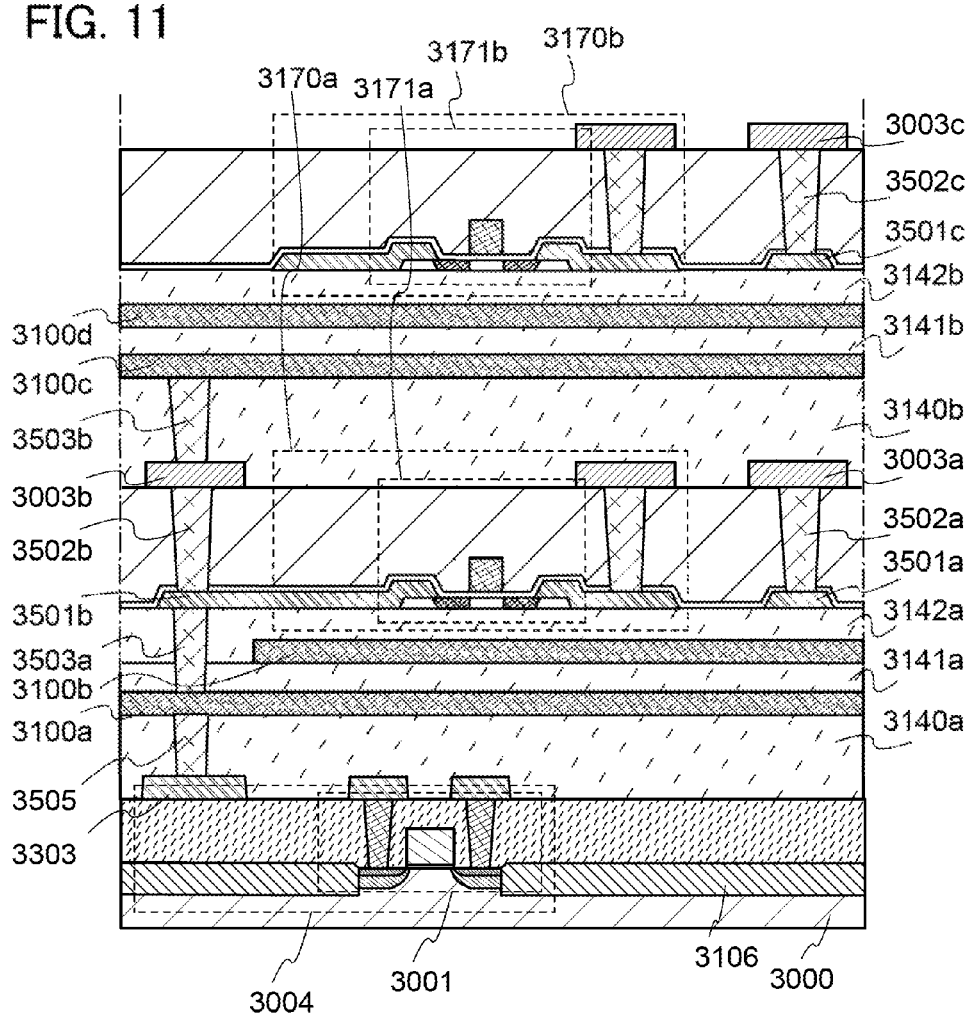
FIG. 11 is a cross-sectional view illustrating a structure of a storage device.
Figure 12:
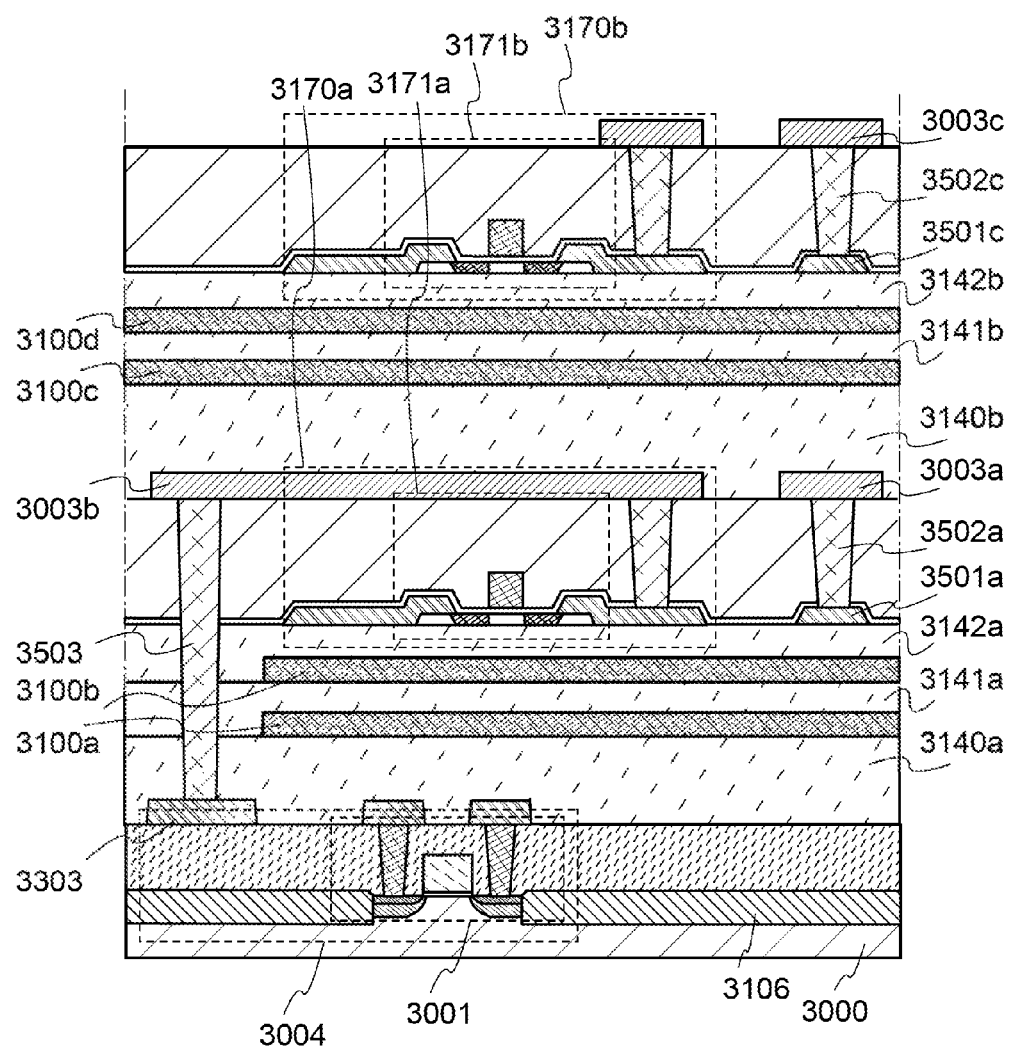
FIG. 12 is a cross-sectional view illustrating a structure of a storage device.

FIG. 11 and FIG. 12 are cross-sectional views of a storage device. In each of the storage devices illustrated in FIG. 11 and FIG. 12, a plurality of storage elements in a plurality of layers are formed in the upper portion, and a logic circuit 3004 is formed in the lower portion. As examples of the plurality of storage elements, a storage element 3170a and a storage element 3170b are illustrated. The storage element 3170a and the storage element 3170b can each have a structure that is similar to the structure of any of the storage element 100a, the storage element 100b, the storage element 100c, and the like described in the above embodiments, for example.

Note that a transistor 3171a in the storage element 3170a is illustrated as a representative. A transistor 3171b in the storage element 3170b is illustrated as a representative. In the transistor 3171a and the transistor 3171b, a channel formation region is formed in an oxide semiconductor layer. The structure of a transistor in which a channel formation region is formed in an oxide semiconductor layer is similar to that described in the above embodiment; thus, the description thereof is omitted here.

An electrode 3501a which is formed in the same layer as a source electrode and a drain electrode of the transistor 3171a is electrically connected to an electrode 3003a through an electrode 3502a. An electrode 3501c which is formed in the same layer as a source electrode and a drain electrode of the transistor 3171b is electrically connected to an electrode 3003c through an electrode 3502c.

The logic circuit 3004 includes a transistor 3001 in which a semiconductor material other than an oxide semiconductor is used as a channel formation region. The transistor 3001 can be obtained in such a manner that an element isolation insulating film 3106 is provided over a substrate 3000 including a semiconductor material (e.g., silicon) and a region which is to be a channel formation region is formed in a region surrounded by the element isolation insulating film 3106. Note that the transistor 3001 may be a transistor in which a channel formation region is formed in a semiconductor film such as a silicon film formed on an insulating surface or a silicon film in an SOI substrate. A known structure can be employed for the structure of the transistor 3001; thus, the description thereof is omitted here.

A wiring 3100a and a wiring 3100b are formed between a layer in which the transistor 3171a is formed and a layer in which the transistor 3001 is formed. An insulating film 3140a is provided between the wiring 3100a and the layer in which the transistor 3001 is formed, an insulating film 3141a is provided between the wiring 3100a and the wiring 3100b, and an insulating film 3142a is provided between the wiring 3100b and the layer in which the transistor 3171a is formed.

Similarly, a wiring 3100c and a wiring 3100d are formed between the layer in which the transistor 3171b is formed and the layer in which the transistor 3171a is formed. An insulating film 3140b is provided between the wiring 3100c and the layer in which the transistor 3171a is formed, an insulating film 3141b is provided between the wiring 3100c and the wiring 3100d, and an insulating film 3142b is provided between the wiring 3100d and the layer in which the transistor 3171b is formed.

The insulating film 3140a, the insulating film 3141a, the insulating film 3142a, the insulating film 3140b, the insulating film 3141b, and the insulating film 3142b function as interlayer insulating films, and their surfaces are planarized.

Through the wiring 3100a, the wiring 3100b, the wiring 3100c, and the wiring 3100d, electrical connection between the storage elements, electrical connection between the logic circuit 3004 and the storage element, and the like can be established.

An electrode 3303 included in the logic circuit 3004 can be electrically connected to a circuit provided in the upper portion.

For example, as illustrated in FIG. 11, the electrode 3303 can be electrically connected to the wiring 3100a through an electrode 3505. The wiring 3100a can be electrically connected to an electrode 3501b through an electrode 3503a. In this manner, the wiring 3100a and the electrode 3303 can be electrically connected to the source or the drain of the transistor 3171a. The electrode 3501b can be electrically connected to an electrode 3003b through an electrode 3502b. The electrode 3003b can be electrically connected to the wiring 3100c through an electrode 3503b.

FIG. 11 illustrates an example in which the electrode 3303 and the transistor 3171a are electrically connected to each other through the wiring 3100a; however, one embodiment of the present invention is not limited to this. The electrode 3303 and the transistor 3171a may be electrically connected to each other through the wiring 3100b, or may be electrically connected to each other through both the wiring 3100a and the wiring 3100b. Further, as illustrated in FIG. 12, the electrode 3303 and the transistor 3171a may be electrically connected to each other through neither the wiring 3100a nor the wiring 3100b. In FIG. 12, the electrode 3303 is electrically connected to the electrode 3003b through an electrode 3503. The electrode 3003b is electrically connected to the source or the drain of the transistor 3171a. In this manner, electrical connection between the electrode 3303 and the transistor 3171a can be established.

Note that FIG. 11 and FIG. 12 illustrate an example in which the two storage elements (the storage element 3170a and the storage element 3170b) are stacked; however, the number of stacked storage elements is not limited to two.

FIG. 11 and FIG. 12 illustrate an example where two wiring layers, i.e., a wiring layer in which the wiring 3100a is formed and a wiring layer in which the wiring 3100b is formed are provided between the layer in which the transistor 3171a is formed and the layer in which the transistor 3001 is formed; however, the number of wiring layers provided therebetween is not limited to two. One wiring layer may be provided or three or more wiring layers may be provided between the layer in which the transistor 3171a is formed and the layer in which the transistor 3001 is formed.

FIG. 11 and FIG. 12 illustrate an example where two wiring layers, i.e., a wiring layer in which the wiring 3100c is formed and a wiring layer in which the wiring 3100d is formed are provided between the layer in which the transistor 3171b is formed and the layer in which the transistor 3171a is formed; however, the number of wiring layers provided therebetween is not limited to two. One wiring layer may be provided or three or more wiring layers may be provided between the layer in which the transistor 3171b is formed and the layer in which the transistor 3171a is formed.

This embodiment can be implemented in appropriate combination with any of the above embodiments.

Example 1

With the use of a signal processing circuit according to one embodiment of the present invention, an electronic device with low power consumption can be provided. In particular, in the case of a portable electronic device which has difficulty in continuously receiving power, when a signal processing circuit with low power consumption according to one embodiment of the present invention is added as a component of the device, an advantage in increasing the continuous operation time can be obtained. Further, by the use of a transistor with small off-state current, redundant circuit design which is needed to cover a failure caused by large off-state current is unnecessary; therefore, the integration degree of the signal processing circuit can be increased, and a signal processing circuit having higher functionality can be formed.

The signal processing circuit according to one embodiment of the present invention can be used for display devices, personal computers, or image reproducing devices provided with recording media (typically, devices which reproduce the content of recording media such as digital versatile discs (DVDs) and have displays for displaying the reproduced images). Other than the above, as an electronic device which can employ the signal processing circuit according to one embodiment of the present invention, mobile phones, portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given.

The case where a signal processing circuit according to one embodiment of the present invention is applied to electronic devices such as a mobile phone, a smartphone, and an e-book reader will be described.

Figure 13:
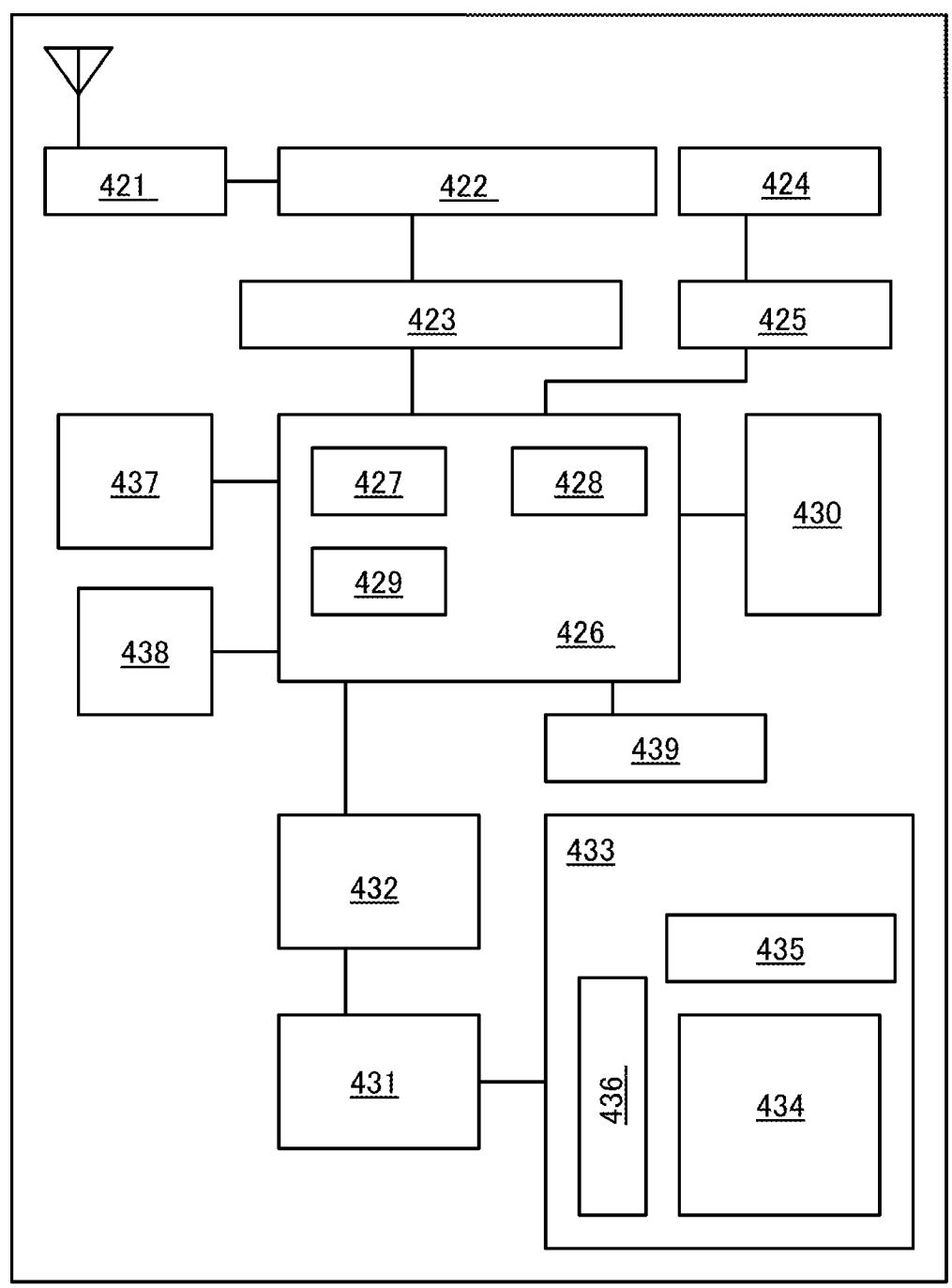
FIG. 13 is a block diagram of a portable electronic device.

FIG. 13 is a block diagram of a portable electronic device. The portable electronic device illustrated in FIG. 13 includes an RF circuit 421, an analog baseband circuit 422, a digital baseband circuit 423, a battery 424, a power supply circuit 425, an application processor 426, a flash memory 430, a display controller 431, a memory circuit 432, a display 433, a touch sensor 439, an audio circuit 437, a keyboard 438, and the like. The display 433 includes a display portion 434, a source driver 435, and a gate driver 436. The application processor 426 includes a CPU 427, a DSP 428, and an interface 429. The signal processing circuit described in the above embodiment is employed for the CPU 427, whereby power consumption can be reduced. An SRAM or a DRAM is used in the memory circuit 432 in general; however, the storage device described in the above embodiment is used in the memory circuit 432, whereby power consumption can be reduced.

Figure 14:
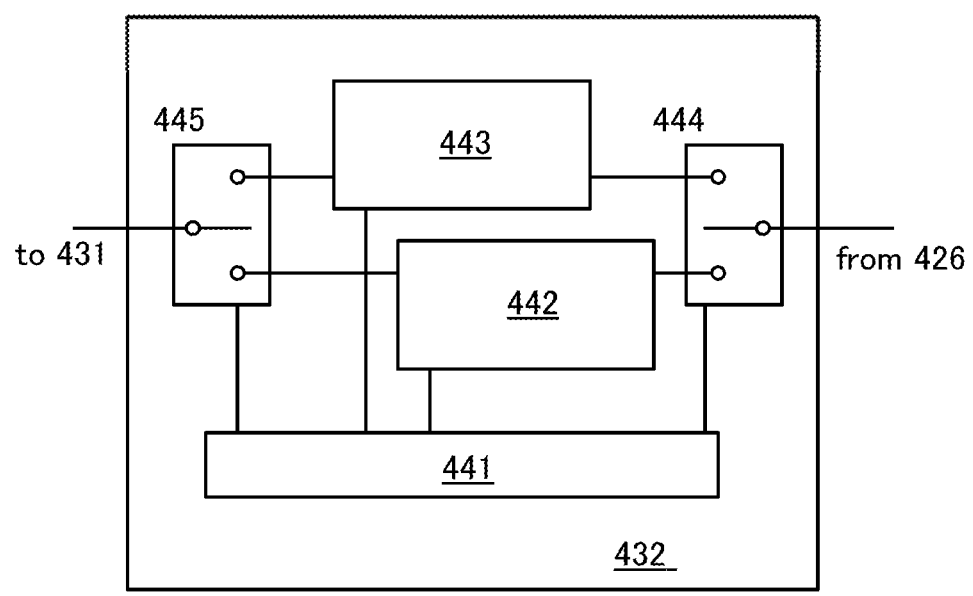
FIG. 14 is a block diagram of a memory circuit.

FIG. 14 is a block diagram illustrating a structure of the memory circuit 432. The memory circuit 432 includes a storage device 442, a storage device 443, a switch 444, a switch 445, and a memory controller 441.

First, image data is received by the portable electronic device or is formed by the application processor 426. This image data is stored in the storage device 442 through the switch 444. Then, image data output through the switch 444 is sent to the display 433 through the display controller 431. The display 433 displays an image using the image data.

If a displayed image is not changed as in the case of a still image, image data read from the storage device 442 continues to be sent to the display controller 431 through the switch 445 at a frequency of approximately 30 Hz to 60 Hz in general. When operation for rewriting an image displayed on a screen is performed by a user, new image data is formed by the application processor 426 and is stored in the storage device 443 through the switch 444. Even when new image data is stored in the storage device 443, image data is periodically read from the storage device 442 through the switch 445.

After storage of new image data in the storage device 443 is terminated, the new image data stored in the storage device 443 is read in the next frame period, and the image data is transmitted to the display 433 through the switch 445 and the display controller 431. The display 433 displays an image using the sent new image data.

Reading of this image data continues until the following new data is stored in the storage device 442. In this manner, the storage device 442 and the storage device 443 alternately perform writing and reading of image data, and the display 433 displays an image.

The storage device 442 and the storage device 443 are not necessarily different storage devices; a memory region included in one storage device may be divided to be used by the storage device 442 and the storage device 443. The storage device described in the above embodiment is employed for these storage devices, whereby power consumption can be reduced.

Figure 15:
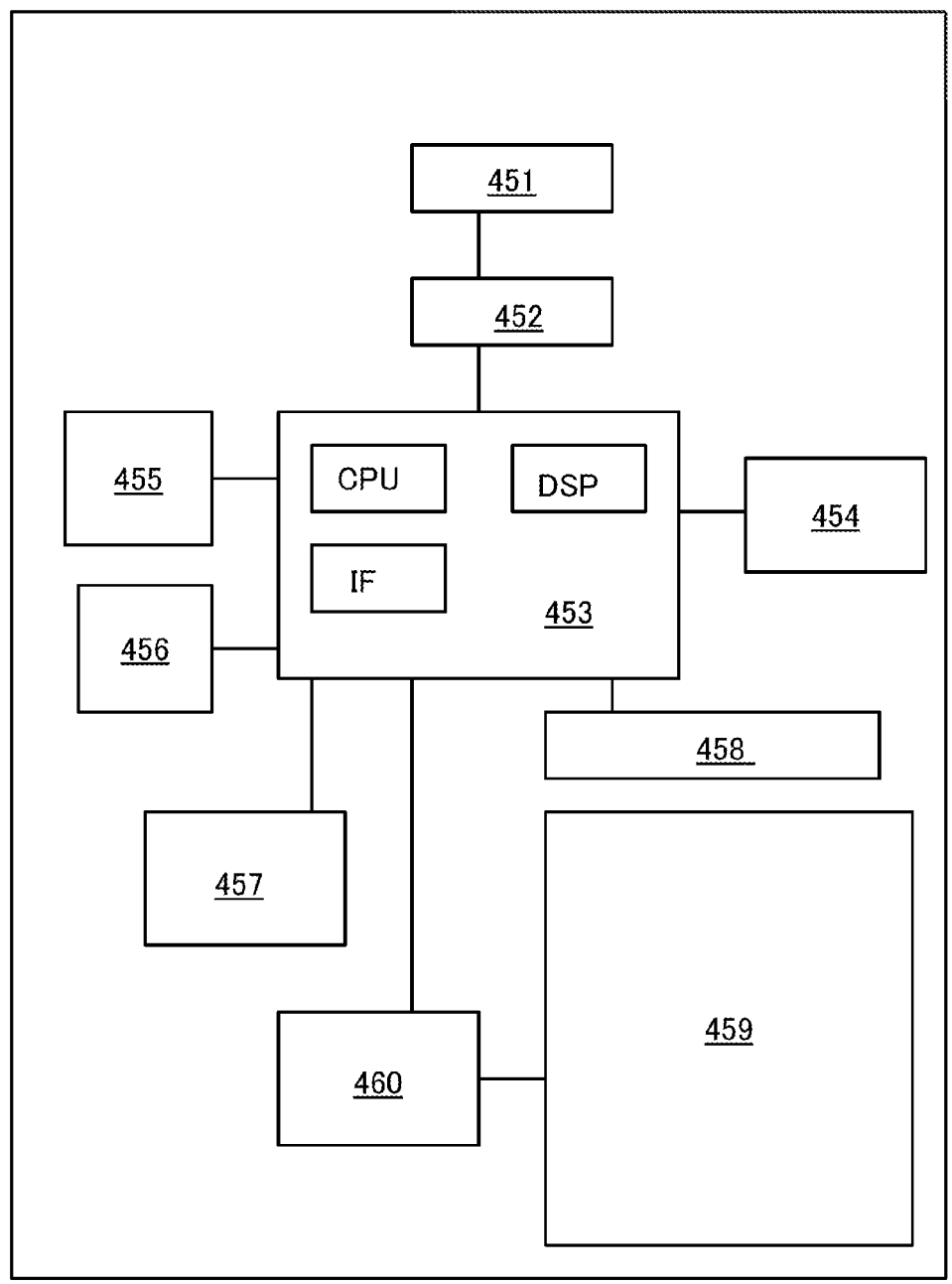
FIG. 15 is a block diagram of an e-book reader.

FIG. 15 is a block diagram of an e-book reader. The e-book reader includes a battery 451, a power supply circuit 452, a microprocessor 453, a flash memory 454, an audio circuit 455, a keyboard 456, a memory circuit 457, a touch panel 458, a display 459, and a display controller 460. The signal processing circuit described in the above embodiment is employed for the microprocessor 453, whereby power consumption can be reduced. Further, the storage device described in the above embodiment is employed for the memory circuit 457, whereby power consumption can be reduced.

For example, in the case where a user uses a highlighting function of changing a display color, drawing an underline, using a bold font, changing the type of letter, or the like in a specific portion in e-book data so that the specific portion is in clear contrast to the other portions, data of the portion specified by the user in the e-book data needs to be stored. The memory circuit 457 has a function of storing such data temporarily. Note that in the case where such data is held for a long time, it may be copied to the flash memory 454.

This example can be implemented in appropriate combination with any of the above embodiments.

This application is based on Japanese Patent Application serial no. 2011-014026 filed with Japan Patent Office on Jan. 26, 2011, the entire contents of which are hereby incorporated by reference.

What is claimed is:

1. A semiconductor device comprising:
    a first storage circuit comprising a storage element comprising a first transistor; and
    a second storage circuit,
    wherein the first transistor comprises a channel formation region comprising an oxide semiconductor,
    wherein the first storage circuit is configured to store first data and output the first data,
    wherein the second storage circuit is configured to store the first data after the first storage circuit outputs the first data,
    wherein the first storage circuit is configured to hold the first data after supply of power supply voltage to the first storage circuit is stopped, and
    wherein the first storage circuit is configured to hold the first data after the supply of power supply voltage to the first storage circuit is restarted.

2. The semiconductor device according to claim 1,
    wherein the storage element comprises a second transistor, and
    wherein a first terminal of the first transistor is electrically connected to a gate of the second transistor.

3. The semiconductor device according to claim 1,
    wherein the storage element comprises a second transistor and a capacitor,
    wherein a first terminal of the first transistor is electrically connected to a gate of the second transistor and a first terminal of the capacitor.

4. The semiconductor device according to claim 1,
wherein the second storage circuit comprises a first block comprising a word line and a plurality of memory cells electrically connected to the word line, and
wherein the first storage circuit is configured to store data corresponding to the plurality of memory cells.

5. The semiconductor device according to claim 1,
wherein the storage element comprises a second transistor,
wherein a first terminal of the first transistor is electrically connected to a gate of the second transistor,
wherein the storage element is configured to store data when a first voltage is supplied to a gate of the first transistor and a second voltage is supplied to a second terminal of the first transistor,
wherein the storage element is configured to hold the data while a third voltage is supplied to the gate of the first transistor, and
wherein the storage element is configured to output the data while a fourth voltage is supplied to a first terminal of the second transistor.

6. The semiconductor device according to claim 1,
wherein the storage element comprises a second transistor and a capacitor,
wherein a first terminal of the first transistor is electrically connected to a gate of the second transistor and a first terminal of the capacitor,
wherein the storage element is configured to store data when a first voltage is supplied to a gate of the first transistor and a second voltage is supplied to a second terminal of the first transistor,
wherein the storage element is configured to hold the data while a third voltage is supplied to the gate of the first transistor, and
wherein the storage element is configured to output the data while a fourth voltage is supplied to a first terminal of the second transistor and a fifth voltage is supplied to a second terminal of the capacitor.

7. The semiconductor device according to claim 1,
wherein the storage element comprises a capacitor,
wherein a first terminal of the first transistor is electrically connected to a first terminal of the capacitor,
wherein the storage element is configured to store data when a first voltage is supplied to a gate of the first transistor and a second voltage is supplied to a second terminal of the first transistor,
wherein the storage element is configured to hold the data while a third voltage is supplied to the gate of the first transistor, and
wherein the storage element is configured to output the data while a fourth voltage is supplied to the gate of the first transistor.

8. A semiconductor device comprising:
a first storage circuit comprising a storage element comprising a first transistor; and
a second storage circuit,
wherein the first transistor comprises a channel formation region comprising an oxide semiconductor,
wherein the first storage circuit is configured to store first data and output the first data,
wherein the second storage circuit is configured to store the first data after the first storage circuit outputs the first data and output second data,
wherein the first storage circuit is configured to store the second data after the second storage circuit outputs the second data and configured to output the second data,
wherein the first storage circuit is configured to hold the first data after supply of power supply voltage to the first storage circuit is stopped, and
wherein the first storage circuit is configured to hold the first data after the supply of power supply voltage to the first storage circuit is restarted.

9. The semiconductor device according to claim 8,
wherein the storage element comprises a second transistor, and
wherein a first terminal of the first transistor is electrically connected to a gate of the second transistor.

10. The semiconductor device according to claim 8,
wherein the storage element comprises a second transistor and a capacitor,
wherein a first terminal of the first transistor is electrically connected to a gate of the second transistor and a first terminal of the capacitor.

11. The semiconductor device according to claim 8,
wherein the second storage circuit comprises a first block comprising a word line and a plurality of memory cells electrically connected to the word line, and
wherein the first storage circuit is configured to store data corresponding to the plurality of memory cells.

12. The semiconductor device according to claim 8,
wherein the storage element comprises a second transistor,
wherein a first terminal of the first transistor is electrically connected to a gate of the second transistor,
wherein the storage element is configured to store data when a first voltage is supplied to a gate of the first transistor and a second voltage is supplied to a second terminal of the first transistor,
wherein the storage element is configured to hold the data while a third voltage is supplied to the gate of the first transistor, and
wherein the storage element is configured to output the data while a fourth voltage is supplied to a first terminal of the second transistor.

13. The semiconductor device according to claim 8,
wherein the storage element comprises a second transistor and a capacitor,
wherein a first terminal of the first transistor is electrically connected to a gate of the second transistor and a first terminal of the capacitor,
wherein the storage element is configured to store data when a first voltage is supplied to a gate of the first transistor and a second voltage is supplied to a second terminal of the first transistor,
wherein the storage element is configured to hold the data while a third voltage is supplied to the gate of the first transistor, and
wherein the storage element is configured to output the data while a fourth voltage is supplied to a first terminal of the second transistor and a fifth voltage is supplied to a second terminal of the capacitor.

14. The semiconductor device according to claim 8,
wherein the storage element comprises a capacitor,
wherein a first terminal of the first transistor is electrically connected to a first terminal of the capacitor,
wherein the storage element is configured to store data when a first voltage is supplied to a gate of the first transistor and a second voltage is supplied to a second terminal of the first transistor,
wherein the storage element is configured to hold the data while a third voltage is supplied to the gate of the first transistor, and wherein the storage element is configured to output the data while a fourth voltage is supplied to the gate of the first transistor.

15. A semiconductor device comprising:
a first storage circuit comprising a storage element comprising a first transistor; and
a second storage circuit,
wherein the first transistor comprises a channel formation region comprising an oxide semiconductor,
wherein the first storage circuit is configured to store first data and output the first data,
wherein the second storage circuit is configured to store the first data after the first storage circuit outputs the first data and output second data,
wherein the first storage circuit is configured to store the second data after the second storage circuit outputs the second data and configured to output the second data,
wherein the second storage circuit is configured to store the second data after the first storage circuit outputs the second data,
wherein the first storage circuit is configured to hold the first data after supply of power supply voltage to the first storage circuit is stopped, and
wherein the first storage circuit is configured to hold the first data after the supply of power supply voltage to the first storage circuit is restarted.

16. The semiconductor device according to claim 15,
wherein the storage element comprises a second transistor, and
wherein a first terminal of the first transistor is electrically connected to a gate of the second transistor.

17. The semiconductor device according to claim 15,
wherein the storage element comprises a second transistor and a capacitor,
wherein a first terminal of the first transistor is electrically connected to a gate of the second transistor and a first terminal of the capacitor.

18. The semiconductor device according to claim 15,
wherein the second storage circuit comprises a first block comprising a word line and a plurality of memory cells electrically connected to the word line, and
wherein the first storage circuit is configured to store data corresponding to the plurality of memory cells.

19. The semiconductor device according to claim 15,
wherein the storage element comprises a second transistor,
wherein a first terminal of the first transistor is electrically connected to a gate of the second transistor,
wherein the storage element is configured to store data when a first voltage is supplied to a gate of the first transistor and a second voltage is supplied to a second terminal of the first transistor,
wherein the storage element is configured to hold the data while a third voltage is supplied to the gate of the first transistor, and
wherein the storage element is configured to output the data while a fourth voltage is supplied to a first terminal of the second transistor.

20. The semiconductor device according to claim 15,
wherein the storage element comprises a second transistor and a capacitor,
wherein a first terminal of the first transistor is electrically connected to a gate of the second transistor and a first terminal of the capacitor,
wherein the storage element is configured to store data when a first voltage is supplied to a gate of the first transistor and a second voltage is supplied to a second terminal of the first transistor,
wherein the storage element is configured to hold the data while a third voltage is supplied to the gate of the first transistor, and
wherein the storage element is configured to output the data while a fourth voltage is supplied to a first terminal of the second transistor and a fifth voltage is supplied to a second terminal of the capacitor.

21. The semiconductor device according to claim 15,
wherein the storage element comprises a capacitor,
wherein a first terminal of the first transistor is electrically connected to a first terminal of the capacitor,
wherein the storage element is configured to store data when a first voltage is supplied to a gate of the first transistor and a second voltage is supplied to a second terminal of the first transistor,
wherein the storage element is configured to hold the data while a third voltage is supplied to the gate of the first transistor, and
wherein the storage element is configured to output the data while a fourth voltage is supplied to the gate of the first transistor.

* * * * *

UNITED STATES PATENT AND TRADEMARK OFFICE
CERTIFICATE OF CORRECTION

PATENT NO. : 8,730,730 B2  
APPLICATION NO. : 13/356726  
DATED : May 20, 2014  
INVENTOR(S) : Jun Koyama and Shunpei Yamazaki It is certified that error appears in the above-identified patent and that said Letters Patent is hereby corrected as shown below:

In the Specification

Column 7, line 15, replace "oldie" with --of the--;

Column 8, line 50, before "storage" replace "then" with --the $n$--;

Column 9, line 63, after "includes" replace "11" with --$n$--;

Column 11, line 9, replace "us" with --as--;

Column 11, line 66, replace "oil" with --off--;

Column 12, line 28, replace "1008" with --100B--;

Column 16, line 20, replace "1008" with --100B--;

Column 16, line 36, replace "110E" with --110B--;

Column 16, line 42, replace "28" with --2B--;

Column 17, line 40, before "and" replace "in" with --$m$--;

Column 17, line 48, replace "100b(l,l) to 100b(m,l)" with --100b(1,1) to 100b(m,1)--;

Column 17, line 49, replace "BLl" with --BL1--;

Column 17, line 54, replace "100b(l,l) to 100b(m,l)" with --100b(1,1) to 100b(m,1)--;

Column 17, line 55, replace "DLl" with --DL1--;

Signed and Sealed this  
Twenty-fifth Day of November, 2014

Michelle K. Lee  
*Deputy Director of the United States Patent and Trademark Office*

Column 17, line 59, replace "100b(l,l) to 100b(m,l)" with --100b(1,1) to 100b(m,1)--;

Column 17, line 60, replace "SLl" with --SL1--;

Column 17, line 67, replace "100b(l,l) to 100b(l,n)" with --100b(1,1) to 100b(1,n)--;

Column 18, line 1, replace "WLl" with --WL1--;

Column 18, line 6, replace "100b(l,l) to 100b(l,n)" with --100b(1,1) to 100b(1,n)--;

Column 18, line 7, replace "CLl" with --CL1--;

Column 18, line 57, replace "100c(l,l) to 100c(m,l)" with --100c(1,1) to 100c(m,1)--;

Column 18, line 58, replace "BLl" with --BL1--;

Column 18, line 63, replace "100c(l,l) to 100c(l,n)" with --100c(1,1) to 100c(1,n)--;

Column 18, line 64, replace "WLl" with --WL1--;

Column 19, lines 63-64, replace "100b(l,l) to 100b(m,l)" with --100b(1,1) to 100b(m,1)-- and replace "BLl" with --BL1--;

Column 20, line 2, replace "100b(l,l) to 100b(m,l)" with --100b(1,1) to 100b(m,1)--;

Column 20, line 3, replace "DLl" with --DL1--;

Column 20, lines 6-7, replace "100b(l,l) to 100b(m,l)" with --100b(1,1) to 100b(m,1)-- and replace "SLl with --SL1--;

Column 20, line 11, replace "100b(l,l) to 100b(l,n)" with --100b(1,1) to 100b(1,n)--;

Column 20, line 12, replace "WLl" with --WL1--;

Column 20, line 17, replace "100b(l,l) to 100b(l,n)" with --100b(1,1) to 100b(1,n)--;

Column 20, line 18, replace "CLl" with --CL1--;

Column 20, line 32, replace "100b(l,j)" with --100b(1,j)--;

Column 20, line 38, replace "200j" with --200_j--;

Column 22, line 18, replace "gales" with --gates--;

Column 23, line 40, after "cell" delete "25r";

CERTIFICATE OF CORRECTION (continued)
U.S. Pat. No. 8,730,730 B2

Column 30, line 65, replace "Single" with --single--;

Column 31, line 31, replace "95° A" with --95 %--;

Column 32, line 35, replace "$O_2$" with --$Cl_2$--;

Column 40, line 53, replace "71.6" with --716--.